US012805179B2

(12) United States Patent
Andernach et al.

(10) Patent No.: US 12,805,179 B2
(45) Date of Patent: Nov. 17, 2026

(54) CHEMICAL COMPOUND, USE OF AT LEAST ONE SUCH CHEMICAL COMPOUND IN AN OPTOELECTRONIC COMPONENT, AND OPTOELECTRONIC COMPONENT CONTAINING AT LEAST ONE SUCH CHEMICAL COMPOUND

(71) Applicants: Heliatek GmbH, Dresden (DE); Technische Universitaet Dresden, Dresden (DE)

(72) Inventors: Rolf Andernach, Ulm (DE); Ludovic Coutable, Ulm (DE); Roland Fitzner, Ulm (DE); Krzysztof Gutkowski, Ulm (DE); Dirk Hildebrandt, Ulm (DE); Kirkus Mindaugas, Ulm (DE); Andre Weiss, Dresden (DE); Marcus Papmeyer, Nossen (DE); Sascha Dorok, Dresden (DE)

(73) Assignees: TECHNISCHE UNIVERSITAET DRESDEN, Dresden (DE); HELIATEK GMBH, Dresden (DE)

( * ) Notice: Subject to any disclaimer, the term of this patent is extended or adjusted under 35 U.S.C. 154(b) by 897 days.

(21) Appl. No.: 18/043,048

(22) PCT Filed: Aug. 31, 2021

(86) PCT No.: PCT/DE2021/100721

§ 371 (c)(1),
(2) Date: Jul. 4, 2023

(87) PCT Pub. No.: WO2022/042804

PCT Pub. Date: Mar. 3, 2022

(65) Prior Publication Data

US 2023/0339982 A1 Oct. 26, 2023

(30) Foreign Application Priority Data

Aug. 31, 2020 (DE) ..................... 10 2020 122 729.9

(51) Int. Cl.

| | |
|---|---|
| ***H10K 85/30*** | (2023.01) |
| ***C07F 5/02*** | (2006.01) |
| ***H10K 30/30*** | (2023.01) |
| ***H10K 85/60*** | (2023.01) |

(52) U.S. Cl.

CPC ........... *H10K 85/322* (2023.02); *C07F 5/022* (2013.01); *H10K 85/658* (2023.02); *H10K 30/30* (2023.02)

(58) Field of Classification Search

CPC .................................. C07F 5/02; C07F 5/022

See application file for complete search history.

(56) References Cited

U.S. PATENT DOCUMENTS

| | | | |
|---|---|---|---|
| 7,675,057 B2 | 3/2010 | Drechsel et al. | |
| 2009/0176313 A1 | 7/2009 | Suzuki et al. | |
| 2010/0231125 A1* | 9/2010 | Li ......................... | C09K 11/06 252/301.16 |
| 2012/0126213 A1 | 5/2012 | Gresser et al. | |
| 2013/0160829 A1 | 6/2013 | Uhrich et al. | |
| 2020/0071343 A1 | 3/2020 | Mirloup et al. | |

FOREIGN PATENT DOCUMENTS

| | | |
|---|---|---|
| EP | 3617214 A1 | 3/2020 |
| WO | WO 2004/083958 A2 | 9/2004 |
| WO | WO 2007/126052 A1 | 11/2007 |
| WO | WO 2010104875 A1 | 9/2010 |
| WO | WO 2010/133208 A1 | 11/2010 |
| WO | WO 2011/161108 A1 | 12/2011 |
| WO | WO 2015/036529 A1 | 3/2015 |

OTHER PUBLICATIONS

Yang, Y. et al. "Thienopyrrole-expanded BODIPY as a potential NIR photosensitizer for photodynamic therapy" Chem. Commun., 2013, 49, 3940 (Year: 2013).*

Hiroyuki Shimogawa, et al., "Impacts of Dibenzo- and Dithieno-fused Structures at the b, g Bonds in the BODIPY Skeleton", Chemistry Letters, Jun. 1, 2013, vol. 42, Nr: 9, pp. 986-988, Chemical Society of Japan, https://doi.org/10.1246/cl.130360.

Jiong Chen, et al., "4,4-Difluoro-4-bora-3a,4a-diaza-s-indacene (BODIPY) Dyes Modified for Extended Conjugation and Restricted Bond Rotations", The Journal of Organic Chemistry, Apr. 18, 2000, vol. 65, 10, pp. 2900-2906, American Chemical Society, https://pubs.acs.org/doi/10.1021/jo991927o.

Umezawa, et al., "Bright, Color-Tunable Fluorescent Dyes in the Visible-Near-Infrared Region", Journal of the American Chemical Society, Jan. 15, 2008, 130, 5, 1550-1551, American Chemical Society, https://pubs.acs.org/doi/10.102/ja077756j.

Li, Tian-Yi, et al., "Boron dipyrromethene (BODIPY) with mesoperfluorinated alkyl substituents as near infrared donors in organic solar cells", Journal of Materials Chemistry A, Sep. 3, 2018, vol. 6, 2018, No. 38, Royal Society of Chemistry, https://pubs.rsc.org/en/content/articlelanding/2018/ta/c8ta06261g.

Martin Pfeiffer, "Controlled doping of organic vacuum deposited dye layers: basics and applications", PhD thesis Technische Universität Dresden, Dec. 16, 1999.

* cited by examiner

*Primary Examiner* — Medhanit W Bahta

(74) *Attorney, Agent, or Firm* — LEYDIG, VOIT & MAYER, LTD.

(57) ABSTRACT

The invention relates to a compound of the general formula I, to an optoelectronic component containing said type of compound, and to the use of such a compound in an optoelectronic component.

20 Claims, 19 Drawing Sheets

ITO / C60 (15nm) / Compound (3): C60 (30nm, 2:3, 90°C) / BPAPF (10nm) / BPAPF:NDP9 (45nm, 10wt%) / NDP9 (1nm) / Au (50nm)

ITO / C60 (15nm) / Compound (3):C60 (30nm, 2:3, 90°C) / BPAPF (10nm) / BPAPF:NDP9 (45nm, 10wt%) / NDP9 (1nm) / Au (50nm)

ITO / C60 (15nm) / Compound (5): C60 (30nm, 2:3, 90°C) / BPAPF (10nm) / BPAPF:NDP9 (45nm, 9.7wt%) / NDP9 (1nm) / Au (50nm)

ITO / C60 (15nm) / Compound (5): C60 (30nm, 2:3, 90°C) / BPAPF (10nm) / BPAPF:NDP9 (45nm, 9.7wt%) / NDP9 (1nm) / Au (50nm)

ITO / C60 (15nm) /Compound (8):C60 (30nm, 2:3, 90°C) / BPAPF (10nm) / BPAPF:NDP9 (45nm, 10%wt%) / NDP9 (1nm) / Au (50nm)

ITO / C60 (15nm) / Compound (8): C60 (30nm, 2:3, 90°C) / BPAPF (10nm) / BPAPF:NDP9 (45nm, 10%wt%) / NDP9 (1nm) / Au (50nm)

ITO / C60 (15nm) / Compound (10): C60 (30nm, 2:3, 90°C) / BPAPF (10nm) / BPAPF:NDP9 (45nm, 9.9wt%) / NDP9 (1nm) / Au (50nm)

ITO / C60 (15nm) / Compound (10): C60 (30nm, 2:3, 90°C) / BPAPF (10nm) / BPAPF:NDP9 (45nm, 9.9wt%) / NDP9 (1nm) / Au (50nm)

ITO / C60 (15nm) / Compound (14): C60 (30nm, 2:3, 90°C) / BPAPF (10nm) / BPAPF:NDP9 (45nm, 10.4wt%) / NDP9 (1nm) / Au (50nm)

ITO / C60 (15nm) / Compound (14): C60 (30nm, 2:3, 90°C) / BPAPF (10nm) / BPAPF:NDP9 (45nm, 10.4wt%) / NDP9 (1nm) / Au (50nm)

ITO / C60 (15nm) / Compound (15): C60 (30nm, 2:3, 90°C) / BPAPF (10nm) / BPAPF:NDP9 (45nm, 9.6wt%) / NDP9 (1nm) / Au (64nm)

ITO / C60 (15nm) / Compound (15): C60 (30nm, 2:3, 90°C) / BPAPF (10nm) / BPAPF:NDP9 (45nm, 9.6wt%) / NDP9 (1nm) / Au (64nm)

ITO / C60 (15nm) / Compound (29): C60 (30nm, 2:3, 90°C) / BPAPF (10nm) / BPAPF:NDP9 (45nm, 10wt%) / NDP9 (1nm) / Au (50nm)

ITO / C60 (15nm) / Compound (29): C60 (30nm, 2:3, 90°C) / BPAPF (10nm) / BPAPF:NDP9 (45nm, 10wt%) / NDP9 (1nm) / Au (50nm)

ITO / C60 (15nm) /Compound (32):C60 (30nm, 2:3, 90°C) / BPAPF (10nm) / BPAPF:NDP9 (45nm; 10wt%) / NDP9 (1nm) / Au (50nm)

ITO / C60 (15nm) / Compound (32): C60 (30nm, 2:3, 90°C) / BPAPF (10nm) / BPAPF:NDP9 (45nm; 10wt%) / NDP9 (1nm) / Au (50nm)

CHEMICAL COMPOUND, USE OF AT LEAST ONE SUCH CHEMICAL COMPOUND IN AN OPTOELECTRONIC COMPONENT, AND OPTOELECTRONIC COMPONENT CONTAINING AT LEAST ONE SUCH CHEMICAL COMPOUND

The present invention relates to a chemical compound of the general formula I, to the use of at least one such compound in an optoelectronic component, and to an optoelectronic component having at least one such compound.

In organic electronics, interconnections composed of electrically conductive polymers or small organic molecules are used. Organic semiconductors are able to fulfil a variety of functions in an electronic component, such as, for example, charge transport, radiation absorption or radiation emission, and one or more functions may be fulfilled at the same time. Optoelectronic components may be, for example, displays, data memories or transistors, or else organic optoelectronic components, examples being photovoltaic elements, especially solar cells, and photodetectors, which have a photoactive layer in which charge carriers, more particularly bound electron-hole pairs (excitons), are generated on incidence of electromagnetic radiation. The excitons pass by diffusion to an interface of this kind, where electrons and holes are separated from one another. The material which takes up the electrons is referred to as the acceptor, and the material which takes up the holes is referred to as the donor.

Organic optoelectronic components enable the conversion of electromagnetic radiation, exploiting the photoelectric effect, into electrical current. Such conversion of electromagnetic radiation requires absorber materials which exhibit good absorption properties.

Organic optoelectronic components are known from the prior art. WO2004083958A2 discloses a photoactive component, especially a solar cell, consisting of organic layers of one or more pi, ni and/or pin diodes stacked on one another.

One structure known from the prior art for an organic solar cell consists of a pin or nip diode (Martin Pfeiffer, "Controlled doping of organic vacuum deposited dye layers: basics and applications", PhD thesis, TU Dresden, 1999, and WO2011/161108A1). In this case a pin solar cell consists of a substrate having, arranged thereon, a usually transparent electrode, p layer(s), i layer(s), n layer(s), and a counter-electrode. In this context, n and p respectively denote n and p doping, leading to an increase in the density of free electrons or holes, respectively, in the thermal equilibrium state. Such layers are to be understood primarily as transport layers. The i layer designation denotes an undoped layer (intrinsic layer) having an absorber material or a mixture of two or more absorber materials. One or more i layers may consist of a mixture of two or more materials (bulk heterojunctions). An absorber material, thus an absorber, refers in particular to a compound which absorbs light in a particular wavelength range. An absorber layer is understood accordingly to be in particular a layer in an optoelectronic component that comprises at least one absorber material.

The prior art has disclosed numerous polymeric and nonpolymeric absorber materials for organic photovoltaic elements in the red and near-infrared (NIR) range between around 600 and around 1400 nm. In the area of nonpolymeric absorber materials, materials from the class of the BODIPYs in particular have proven suitable for the near-infrared spectral range—in particular, the use of meso-CF3 substituted derivatives has become established—so enabling the achievement of suitable energy layers and hence high photovoltages in conjunction with longwave absorption ranges.

WO 2015 036 529 A1 discloses the use of a pyrrolopyrrole-based compound in an organic electronic device.

WO 2010 133 208 A1 discloses an organic semiconductor which comprises multiple layers, with at least one of the layers comprising a material with Azabodipy scaffold.

Umezawa et al. (J. Am. Chem. Soc. 2008, 130, 5, 1550-1551) discloses BODIPY structures as fluorescent dyes, which are unsubstituted in the meso position, or carry a fluorinated alkyl chain.

Li et al. (Boron dipyrromethene (BODIPY) with meso-perfluorinated alkyl substituents as near infrared donors in organic solar cells, J. Mater. Chem. A, 2018, 6, 18583-18591) discloses BODIPY structures which carry perfluorinated alkyl chains in the meso position and can be used as NIR donor materials in organic solar cells.

The absorbers known from the prior art in the red and near-infrared region are unsatisfactory. While the known absorber materials are suitable for photoactive layers in organic photovoltaic elements, i.e., organic solar cells, there is nevertheless a need to improve the absorption properties of the absorber materials, especially in order to make organic photovoltaic elements competitive in relation to conventional, silicon-based solar cells. One of the factors determining the efficiency of an organic photovoltaic element is the absorption behavior of the organic materials, i.e., of the absorber materials, in the photoactive layer. Furthermore, a fundamental problem in vacuum processing is the limited evaporability of organic materials, since the thermal stability is insufficient for vacuum evaporation, and so the selection of the absorbers is severely limited. As a result of low melting and decomposition points, the evaporability and hence the achievable deposition rate are limited, and so many materials that are suitable in principle as absorbers cannot be employed on the industrial scale.

The invention is therefore based on the object of providing chemical compounds, the use of at least one such chemical compound in an optoelectronic component, and an optoelectronic component having at least one such compound, where the stated disadvantages do not occur, and where the chemical compounds in particular have improved absorption properties and at the same time exhibit improved evaporability, thus having high melting and decomposition points, more particularly low evaporation temperatures without undergoing decomposition.

The object is achieved by the subjects of the independent claims. Advantageous configurations are evident from the dependent claims.

The object is achieved more particularly by a chemical compound of the general formula I,

I

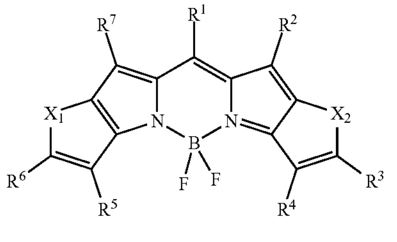

where X1 and X2 independently of one another are O, S or N—R8, with R8 selected from the group consisting of H, alkyl, aryl, and heteroaryl, preferably with R8 selected from the group consisting of H, alkyl, and aryl, R1 is a substituted homocyclic 6-membered ring, where at least one H atom is substituted by an electron-withdrawing substituent selected from the group consisting of F, Cl, CN, CF3, and COR8, with R8 being C1-C4 alkyl, or is a substituted or unsubstituted heterocyclic 5-membered ring or 6-membered ring, where the heterocyclic 5-membered ring or 6-membered ring has at least one sp2-hybridized N atom with a free electron pair and/or has at least one heteroatom selected from O, S, or N, wherein at least one H atom is substituted by an electron-withdrawing substituent selected from the group consisting of F, Cl, CN, CF3, and COR9, with R9 being C1-C4 alkyl, R2 and R7 independently of one another are selected from the group consisting of H, halogen, CN, alkyl, fluorinated or partly-fluorinated alkyl, unsaturated alkyl, and aryl, R4 and R5 independently of one another are selected from the group consisting of H, halogen, CN, alkyl, fluorinated or partly-fluorinated alkyl, unsaturated alkyl, and alkoxy, and R3 and R6 independently of one another are a substituted or unsubstituted homocyclic 6-membered ring or a substituted or unsubstituted heterocyclic 5-membered ring or 6-membered ring.

In accordance with the invention, compounds of the general formula I are BODIPY dyes, which preferably in the meso position of the BODIPY scaffold have a 5- or 6-membered heteroaryl ring, or a 6-membered aryl ring having at least one substituent selected from the group of Cl, CN, and F. The pyrrole rings of the BODIPY scaffold are preferably fused with a further cyclic system.

Substitution is understood in particular as the replacement of H by a substituent. A substituent refers in particular to all atoms and groups of atoms, other than hydrogen, preferably a halogen, an alkyl group, where the alkyl group may be linear or branched, an alkenyl group, an alkynyl group, an amino group, an alkoxy group, a thioalkoxy group, an aryl group, or a heteroaryl group. A halogen refers in particular to F, Cl or Br, preferably F.

A heteroatom, especially a heteroatom in the general formula I, refers in particular to an atom selected from the group consisting of O, S, Se, Si, B, N or P, preferably selected from the group consisting of O, S, Se or N.

The chemical compounds of the general formula I of the invention have advantages in comparison to the prior art. Advantageously it is possible to provide improved absorbers for optoelectronic components. Provided advantageously are absorber materials for the red and near-infrared spectral range, having a high intensity of absorption and particularly good evaporability. Compounds of the general formula I advantageously absorb red and near-infrared light in a wavelength range from 600 to 1000 nm. Advantageously the fill factors FF are particularly high. Advantageously the compounds of the invention are more suitable for the vacuum processing to form photovoltaic elements. Advantageously the evaporability is increased, in particular the evaporability without decomposition, with the compounds being thermally stable at a temperature of 300° C. or more. As a result, the compounds can be processed under vacuum without decomposing. Surprisingly it has been found that when an at least partly fluorinated aryl substituent is used in place of an at least partly fluorinated alkyl chain, the melting and decomposition points attainable are substantially higher, while the evaporation temperature rises only by a relatively small amount. Advantageously the coloristic variability of organic photovoltaic elements can be increased. Advantageously the absorption of light in the visible range below 650 nm is relatively low, making the compounds of the invention exceptionally suitable for producing semitransparent or transparent organic solar cells or photodetectors.

According to one development of the invention, X1 and X2 are S or X1 and X2 are O, and/or where at least one H atom in the homocyclic 6-membered ring and/or in the heterocyclic 5-membered ring or 6-membered ring R1 is substituted by F or CF3, preferably by F. The advantageous effects of the present invention are realized thereby in a particular way.

In one preferred embodiment of the invention, R3 and/or R6 is a homocyclic 6-membered ring, where at least one H atom is substituted by an alkyl group, an alkoxy group and/or an F atom.

According to one development of the invention, R3 and R4 and/or R5 and R6 in each case together form a heterocyclic 5-membered ring or 6-membered ring having at least one heteroatom selected from O, S or N, preferably O or S, where preferably the heterocyclic 5-membered ring or 6-membered ring is unsubstituted, or form a homocyclic 6-membered ring. The advantageous effects of the present invention are realized thereby in a particular way.

In one preferred embodiment of the invention, R3 and R4 and/or R5 and R6 in each case together do not form a heterocyclic 5-membered ring or 6-membered ring.

In one preferred embodiment of the invention, X1 and R6, preferably R8 and R6, and/or X2 and R3, preferably R8 and R3, together form a heterocyclic five-membered ring or six-membered ring having at least one heteroatom selected from the group consisting of S, O and N, or a homocyclic six-membered ring, preferably a heterocyclic 5-membered ring.

In one preferred embodiment of the invention, X1 and R7, preferably R8 and R7, and/or X2 and R2, preferably R8 and R2, together form a heterocyclic five-membered ring or six-membered ring having at least one heteroatom selected from the group consisting of O, S and N, or a homocyclic six-membered ring, preferably a heterocyclic 5-membered ring.

According to one development of the invention, R1 is a homocyclic 6-membered ring with the condition that R1 is $C_6H_nF_{5-n}$, where n=0, 1, 2, 3, 4. The advantageous effects of the present invention are realized thereby in a particular way.

According to one development of the invention, R1 is selected from the group consisting of:

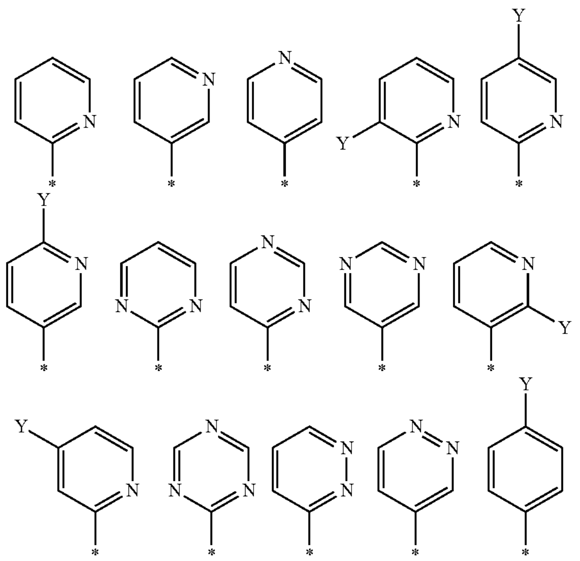

-continued

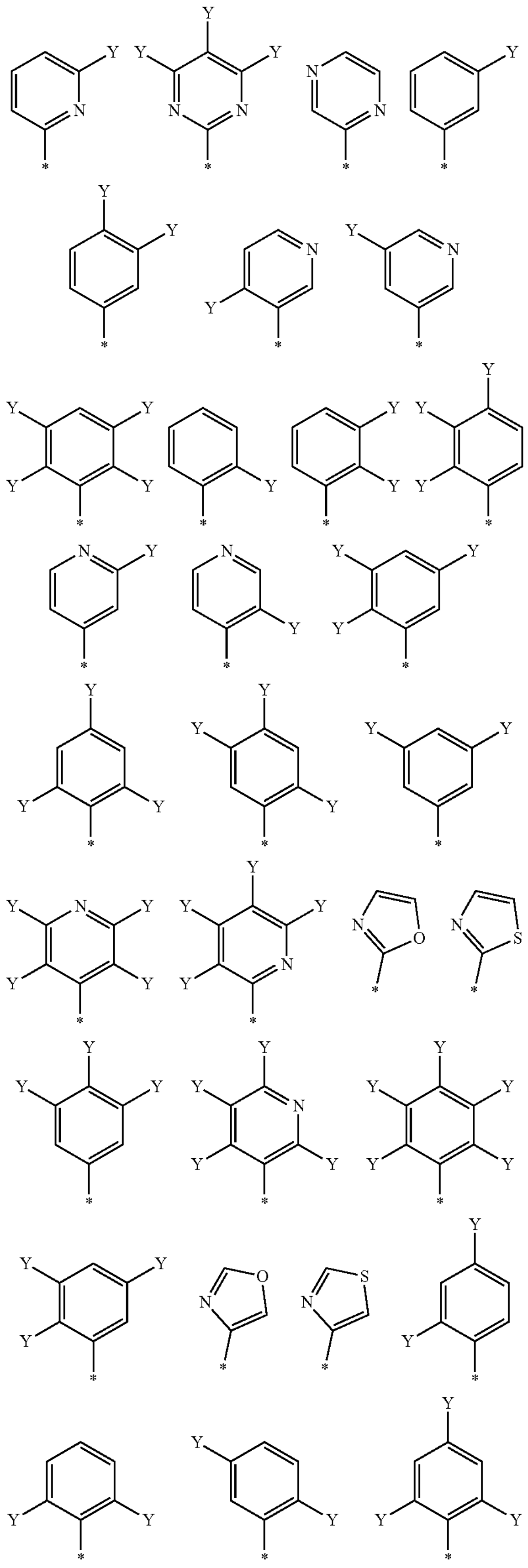

-continued

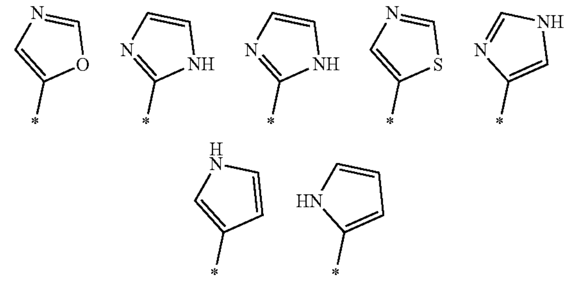

where * denotes the attachment to the compound of the general formula I, where Y independently at each occurrence is selected from the group consisting of Cl, CN, F, and CF3, preferably Y is F, and where H atoms are substituted or unsubstituted, preferably unsubstituted. The advantageous effects of the present invention are realized thereby in a particular way.

According to one development of the invention, R3 and R6 independently of one another are selected from the group consisting of

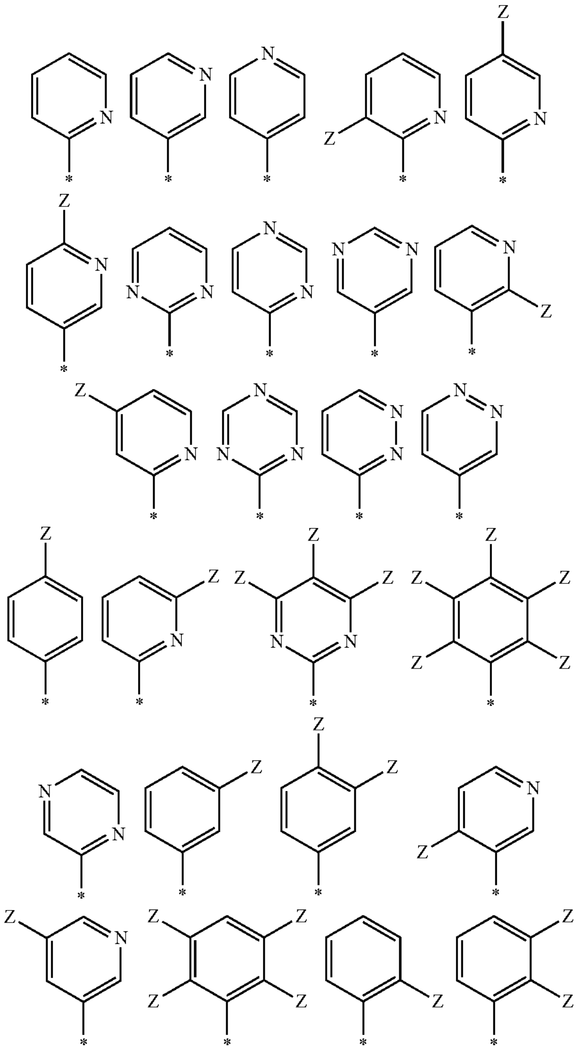

-continued

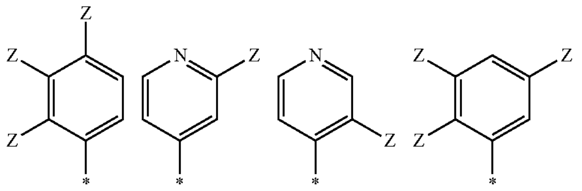
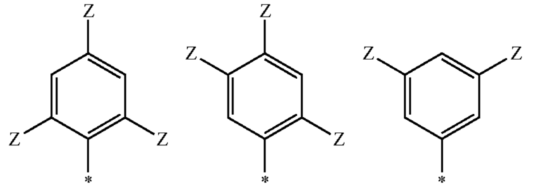
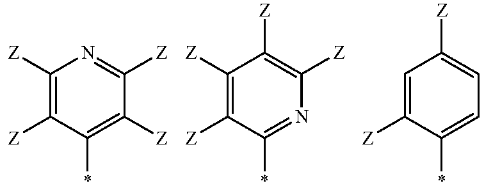
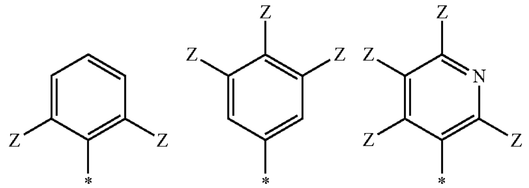
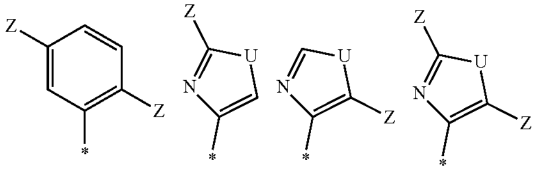
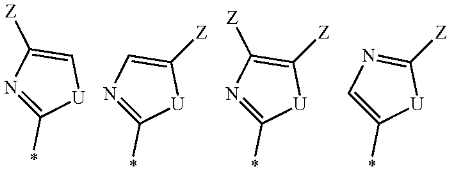
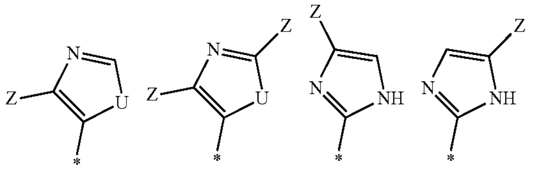
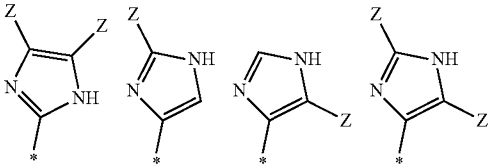
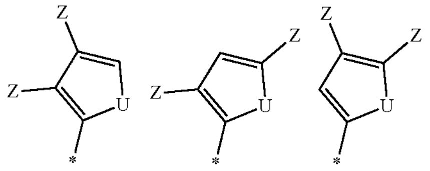

-continued

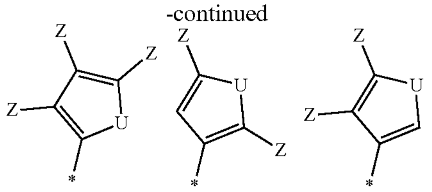
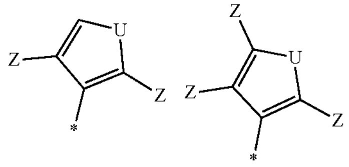

where * denotes the attachment to the compound of the general formula I, where U is selected from the group consisting of O, S, and NR19, where R19 is selected from the group consisting of H, halogen, alkyl, fluorinated alkyl, partly-fluorinated alkyl, alkoxy, alkenyl, aryl, and heteroaryl, preferably U is O or S, and where Z independently at each occurrence is selected from the group consisting of H, halogen, preferably F, CF3, CN, alkyl, fluorinated alkyl, partly-fluorinated alkyl, alkenyl, alkoxy, N-alkyl, N-alkyl2, aryl, and heteroaryl, where preferably R3 and R6 are identical. The advantageous effects of the present invention are realized thereby in a particular way.

In one preferred embodiment of the invention, Z independently at each occurrence is selected from the group consisting of halogen, preferably F, CF3, and CN, especially preferably Z is F. In one alternatively preferred embodiment of the invention, Z is methyl, methoxy, ethyl or ethoxy.

In one preferred embodiment of the invention, R3 and R6 independently of one another are selected from

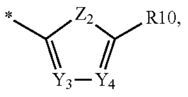

where * denotes the attachment to the compound of the general formula I, Z2 is selected from the group consisting of O, S, and N—R11, where R11 is selected from the group consisting of H, alkoxy, alkyl, fluorinated alkyl, partly-fluorinated alkyl, and aryl, Y3 is N or C—R12, where R12 is selected from the group consisting of H, halogen, alkoxy, branched or linear, cyclic or open-chain alkyl, alkenyl, and aryl, where preferably at least one H is substituted, preferably is substituted by CN or F, Y4 is N or C—R13, where R13 is selected from the group consisting of H, halogen, alkoxy, branched or linear, cyclic or open-chain alkyl, alkenyl, and aryl, where preferably at least one H is substituted, preferably is substituted by CN or F, and where preferably R12 and R13 are joined homocyclically or heterocyclically to one another in the form of a ring structure, and R10 is selected from the group consisting of H, halogen, alkoxy, alkyl, fluorinated alkyl, partly-fluorinated alkyl, branched or linear, cyclic or open-chain alkyl, amino, aryl, heteroaryl, alkenyl, and an electron-withdrawing alkyl group having at least one C═C double bond, where preferably at least one H is substituted by CN or F.

In one preferred embodiment of the invention, the H atoms in Y3 and/or Y4 are substituted at least partly by alkyl, alkoxy or F.

In one preferred embodiment, the positions Y3 and Y4 are in each case CH.

In one preferred embodiment of the invention, the group R3 is identical to the group R6.

In one preferred embodiment of the invention, X1 is identical to X2, R2 is identical to R7, R4 is identical to R5, and R3 is identical to R6.

In one preferred embodiment of the invention, X1 and X2 are O or S, R2 and R7 are H, R4 and R5 are H, and R3 is identical to R6.

According to one development of the invention, R3 and/or R6 are additionally fused and/or R1 is a monocyclic 5-membered ring or 6-membered ring.

In one preferred embodiment of the invention, R3 and/or R6 is fused to at least one further 5-membered ring or 6-membered ring, preferably to two further 5-membered rings and/or 6-membered rings, where the at least one 5-membered ring and/or the at least one 6-membered ring is a substituted or unsubstituted aryl or heteroaryl ring.

In one alternatively preferred embodiment of the invention, R3 and/or R6 are not additionally fused.

According to one development of the invention, R2 and R7 independently of one another are selected from the group consisting of H, halogen, CN, and C1-C4 alkyl, preferably R2 and R7 are H, and/or R4 and R5 independently of one another are selected from the group consisting of H, halogen, CN, and C1-C4 alkyl, preferably R4 and R5 are H.

According to one development of the invention, R1 is a heterocyclic 5-membered ring or 6-membered ring having at least one sp2-hybridized N atom with a free electron pair in the ring system, preferably R1 is selected from the group consisting of substituted or unsubstituted imidazole, pyrazole, triazole, tetrazole, pyridine, pyrimidine, pyrazine, pyridazine, triazine, oxazole, isoxazole, thiazole, and isothiazole.

In one particularly preferred embodiment of the invention, R1 is not a substituted and/or not an unsubstituted thiophene, preferably not an unsubstituted thiophene.

In one particularly preferred embodiment of the invention, R1 is not a substituted and/or not an unsubstituted furan, preferably not an unsubstituted furan.

In one particularly preferred embodiment of the invention, R1 is not a substituted and/or not an unsubstituted pyrrole, preferably not an unsubstituted pyrrole.

In one preferred embodiment of the invention, the heterocyclic 5-membered ring or 6-membered ring, or the homocyclic 6-membered ring, is not additionally fused.

According to one development of the invention, the compound is selected from the group consisting of:

(1)

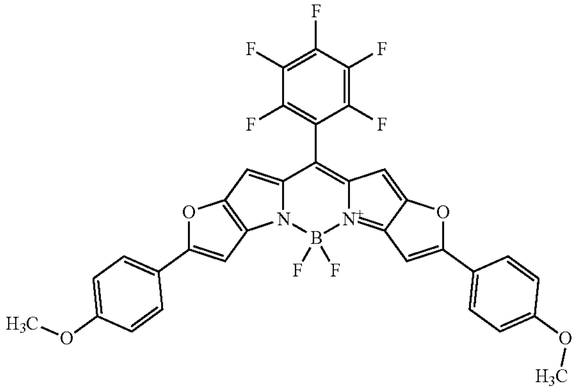

(2)

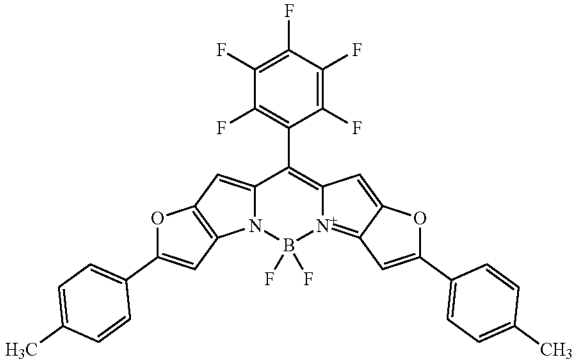

(3)

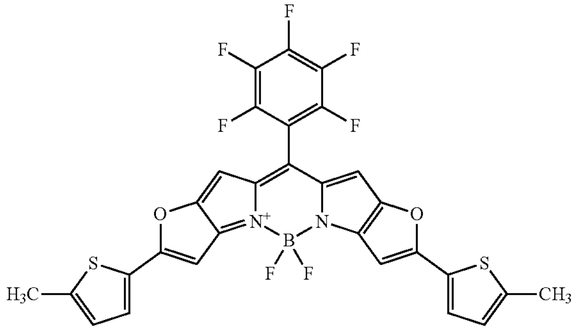

(4)

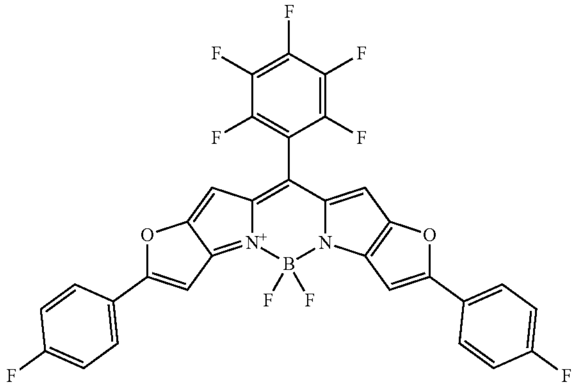

-continued
(5)
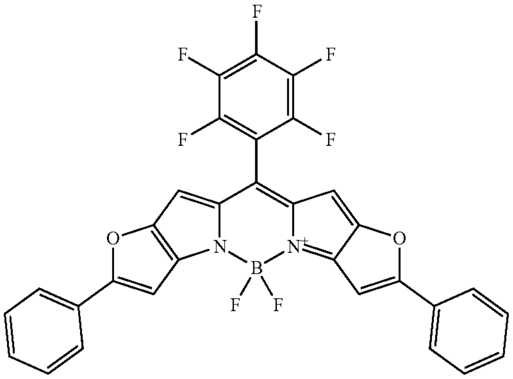
(6)
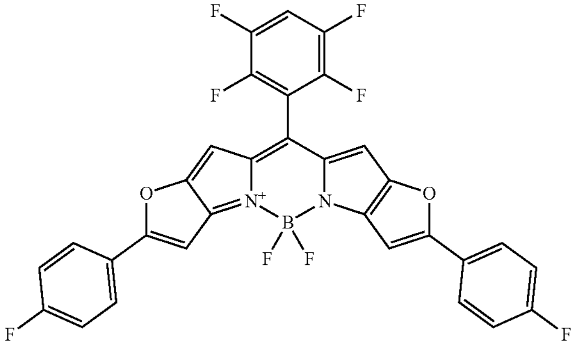
(7)
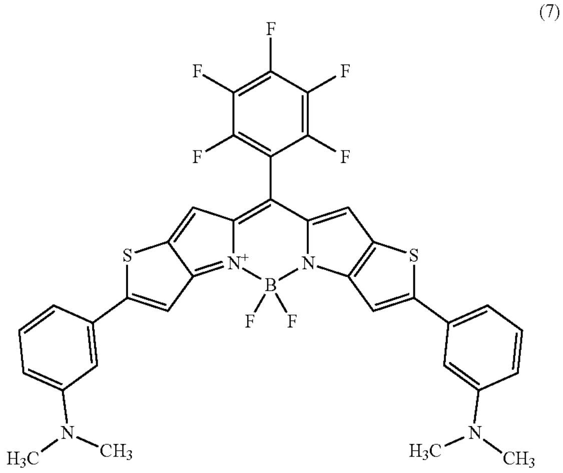
(8)
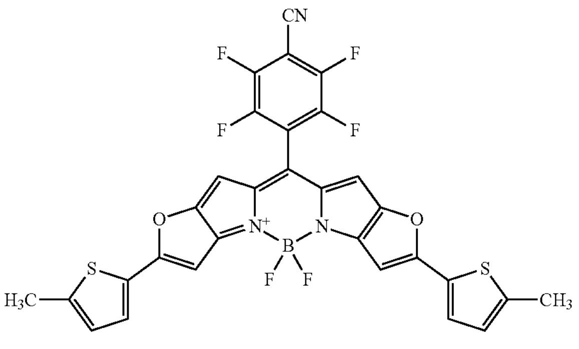
-continued
(9)
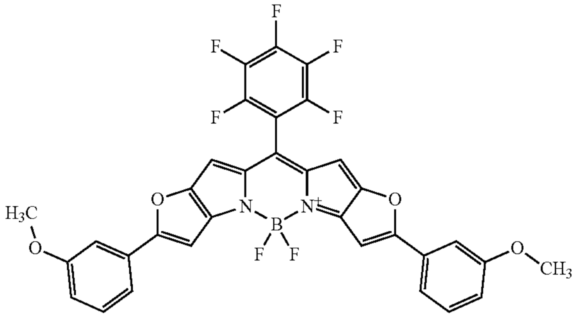
(10)
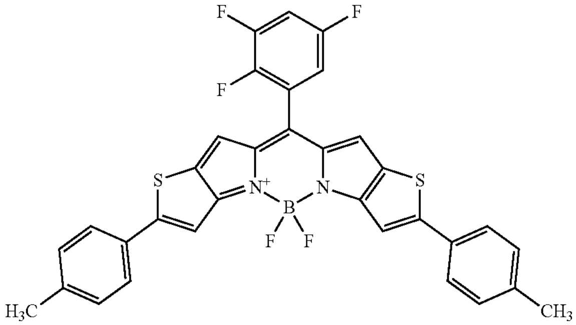
(11)
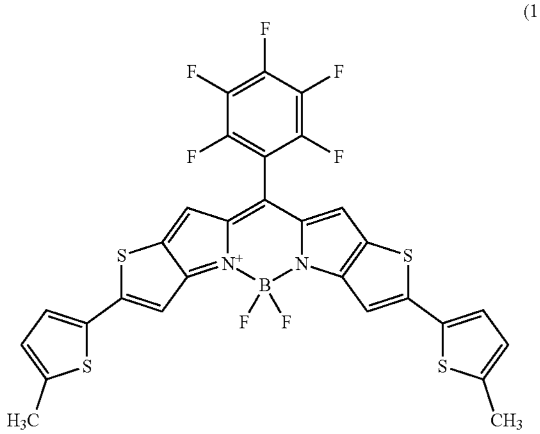
(12)
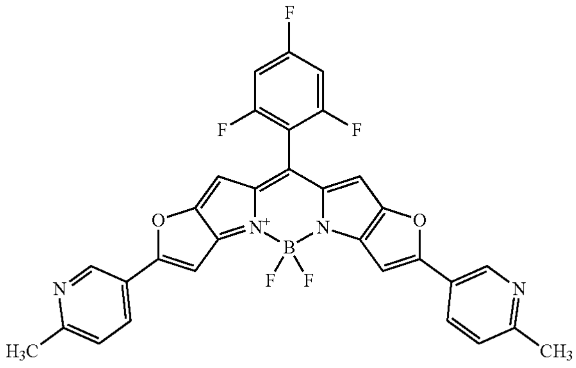

-continued
(13)
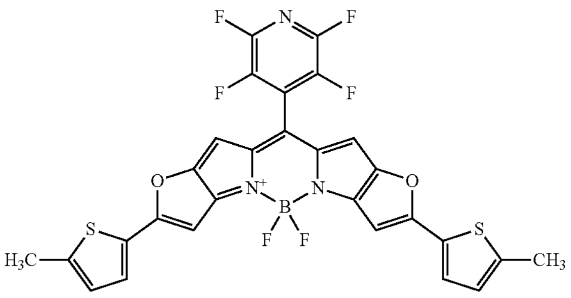
(14)
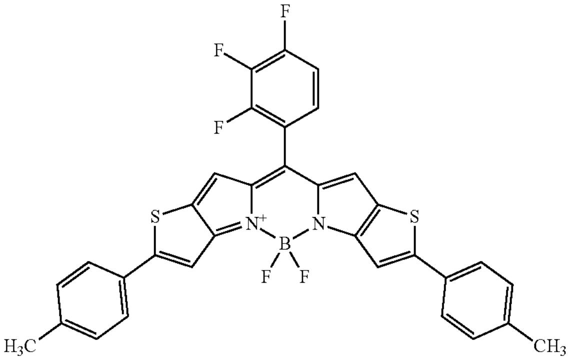
(15)
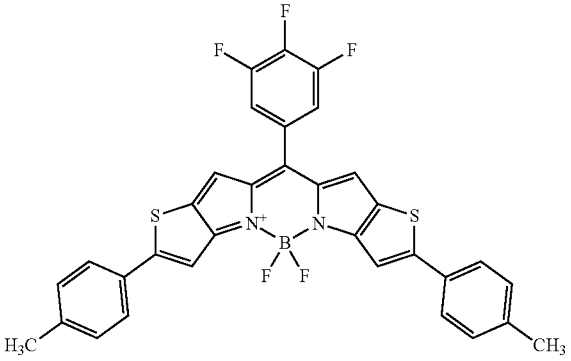
(16)
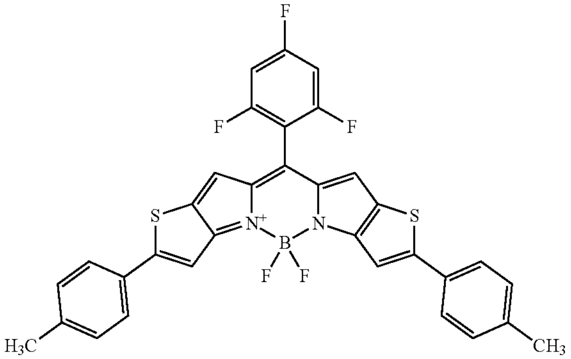
-continued
(17)
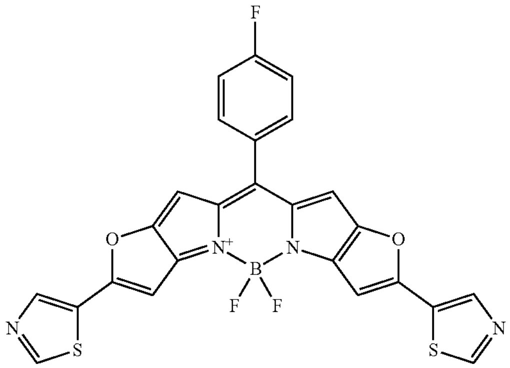
(18)
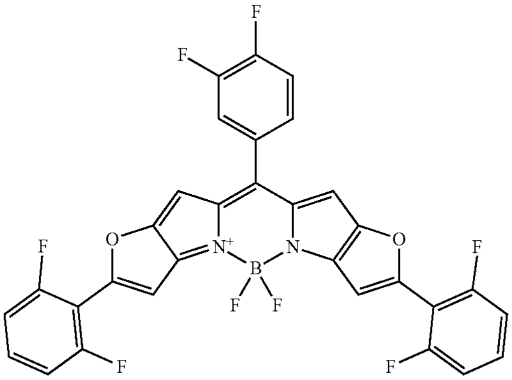
(19)
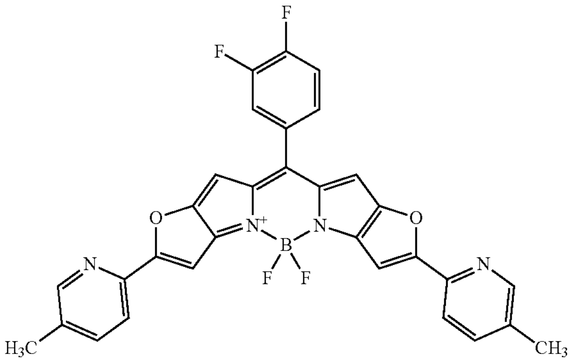
(20)
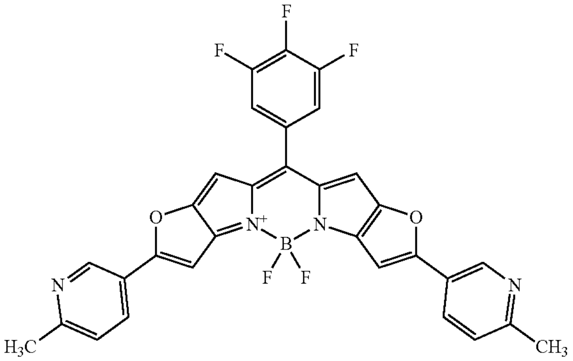

(21)
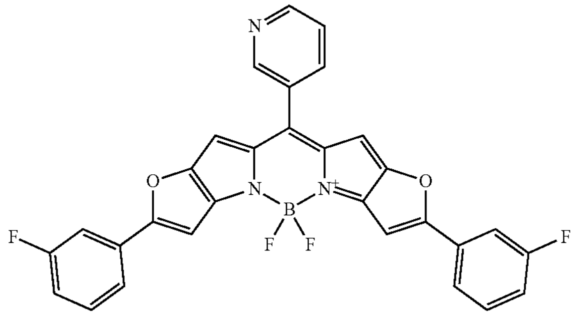
(22)
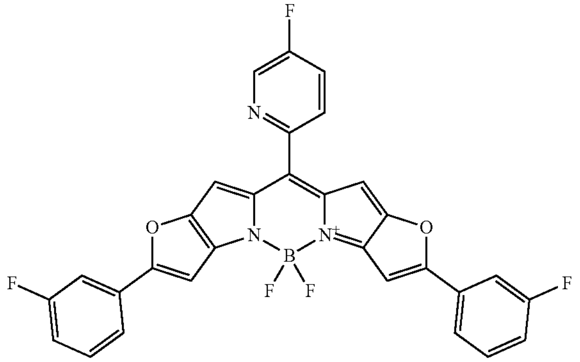
(23)
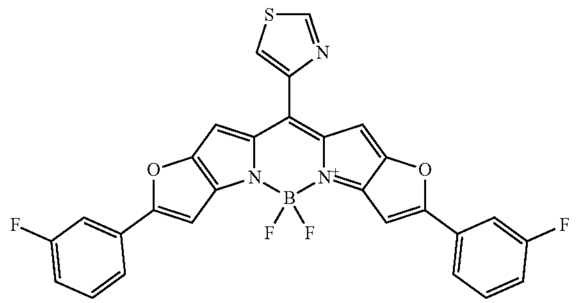
(24)
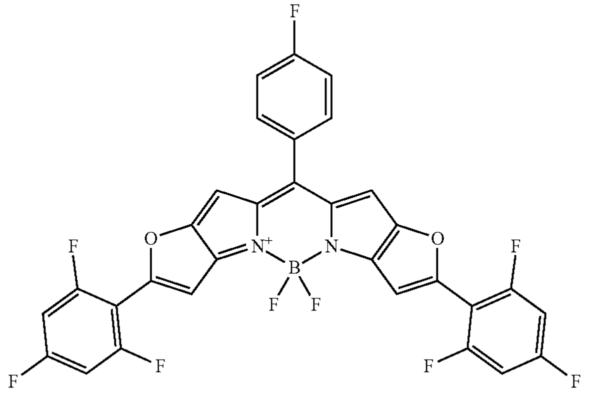
(25)
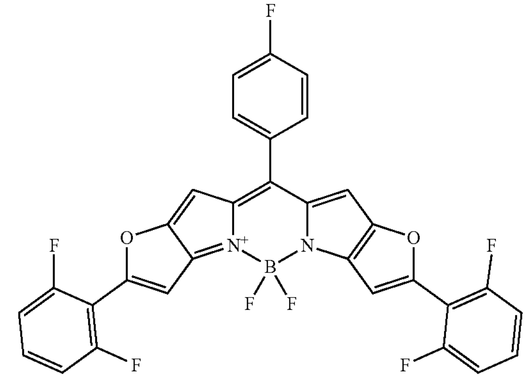
(26)
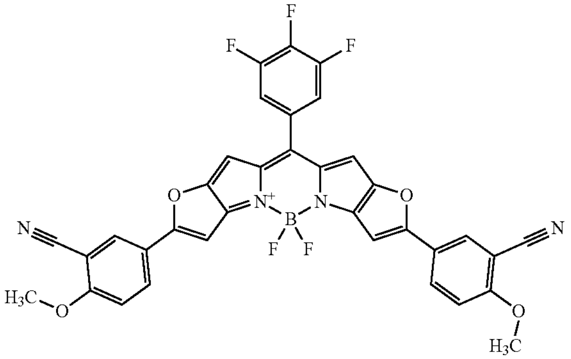
(27)
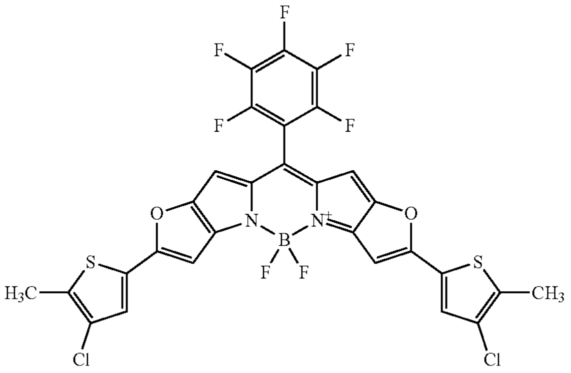
(28)
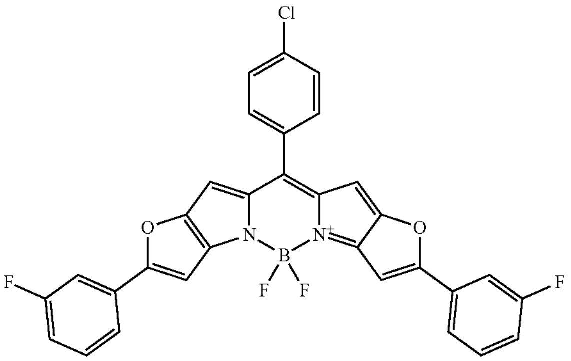

-continued
(29)
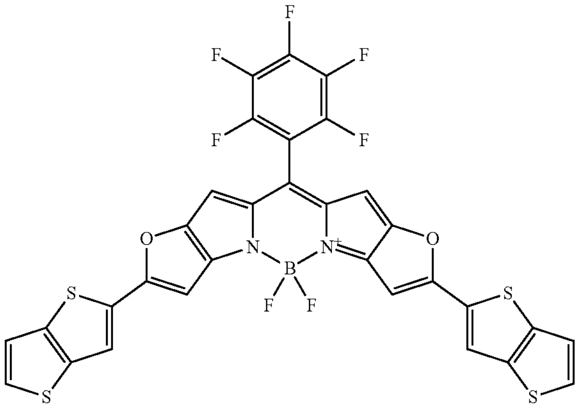
(30)
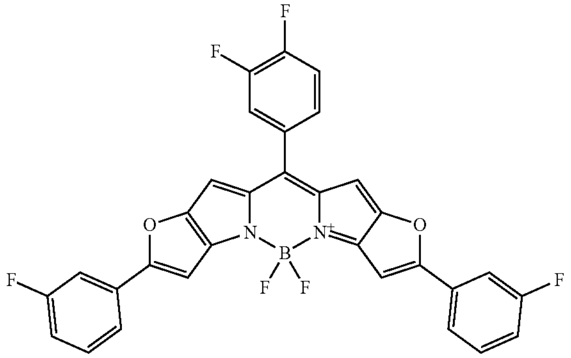
(31)
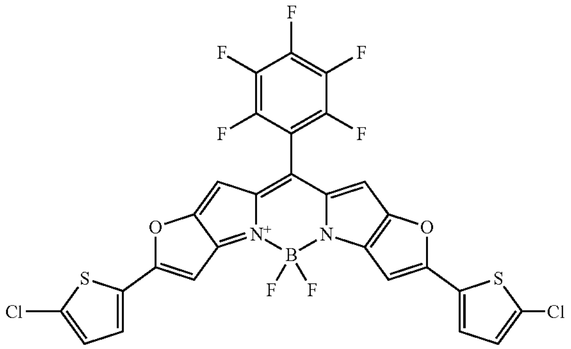
(32)
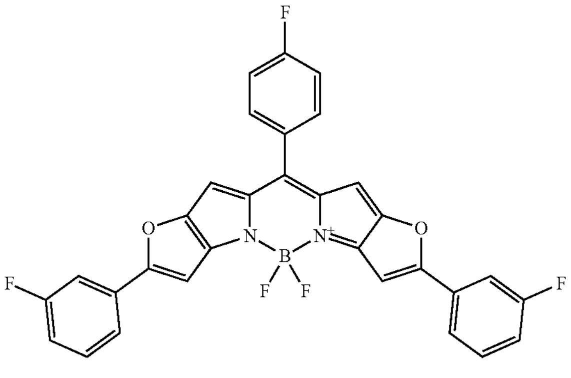
-continued
(33)
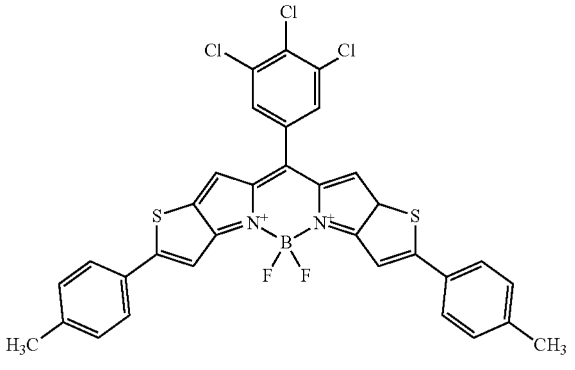
(35)
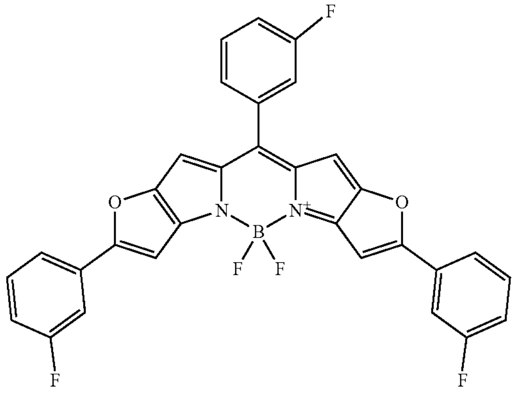
(36)
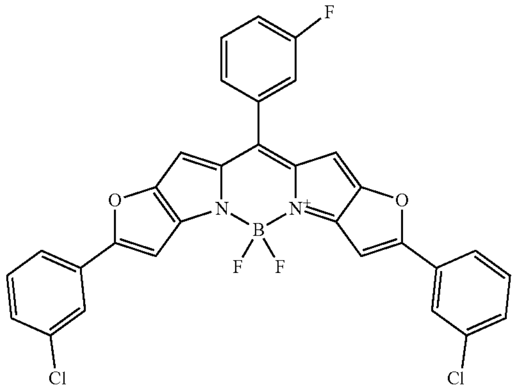
(37)
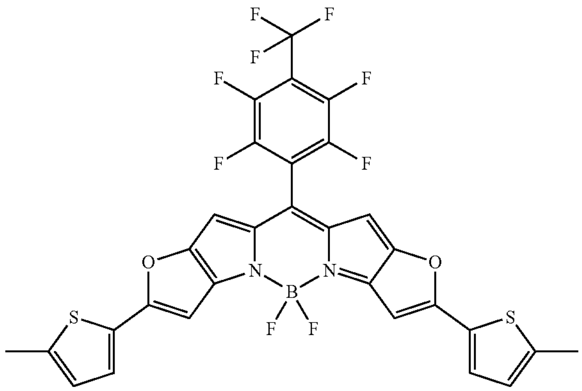

-continued
(38)
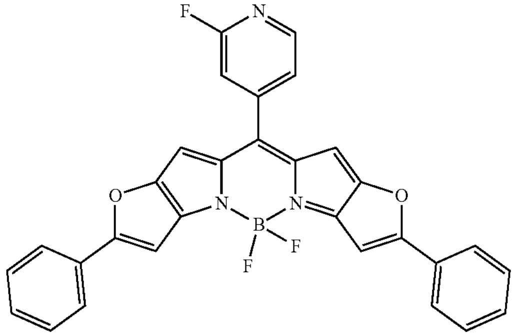
(39)
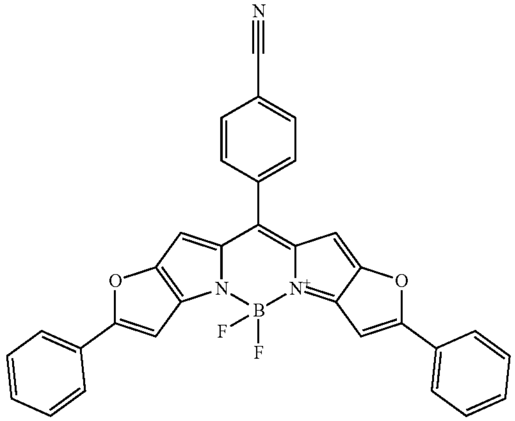
(40)
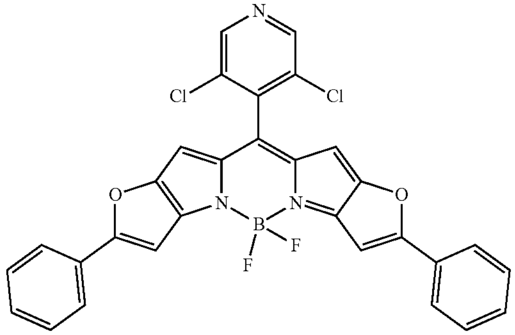
(41)
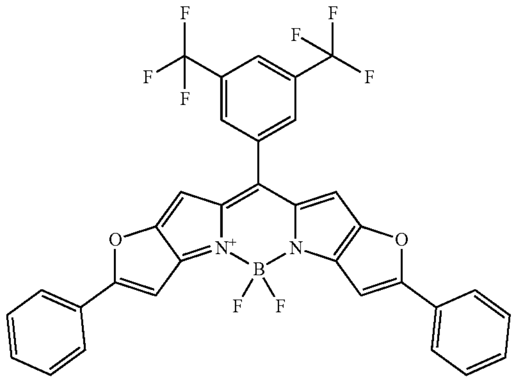
-continued
(42)
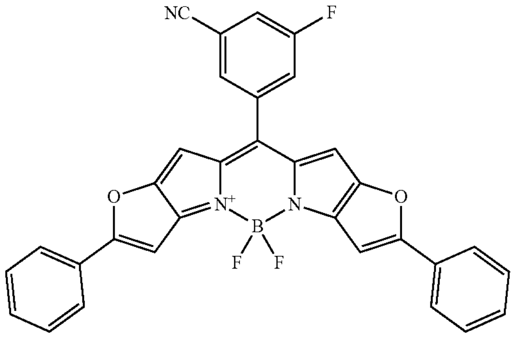
(43)
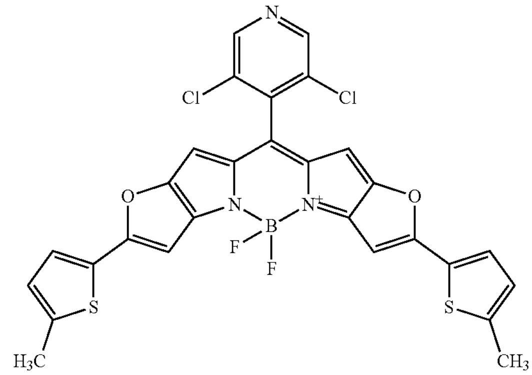
(44)
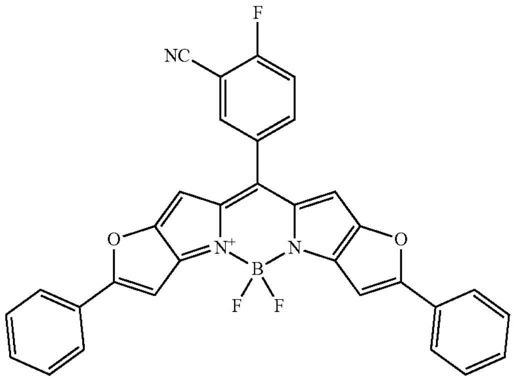
(45)
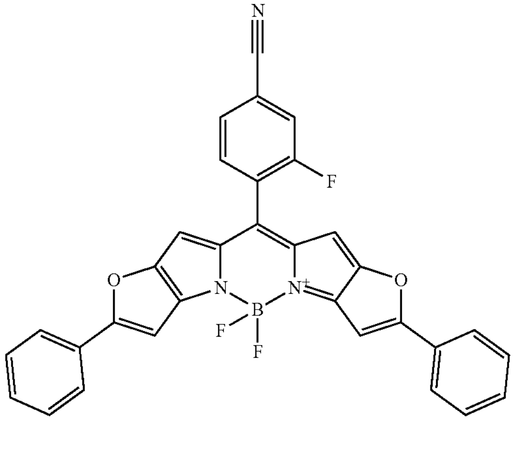

-continued
(46)
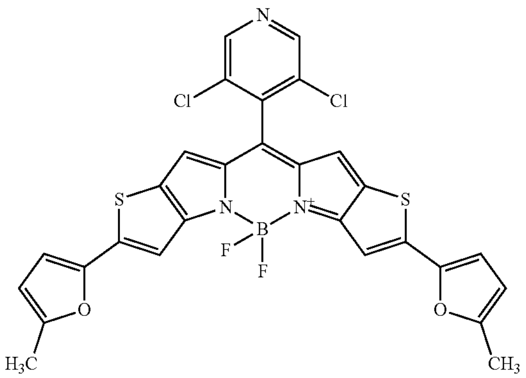
(47)
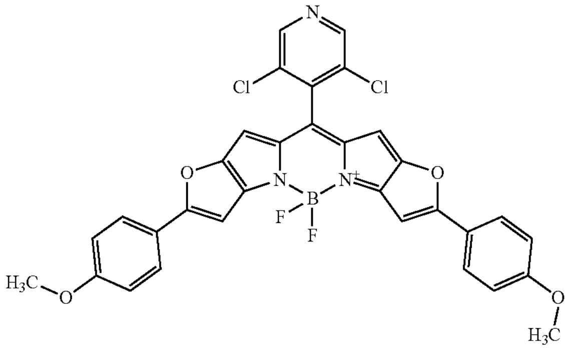
(48)
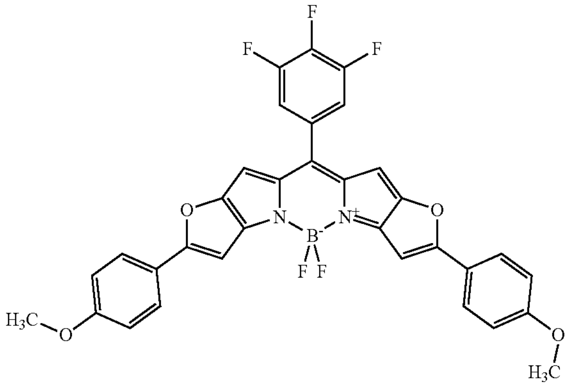
-continued
(49)
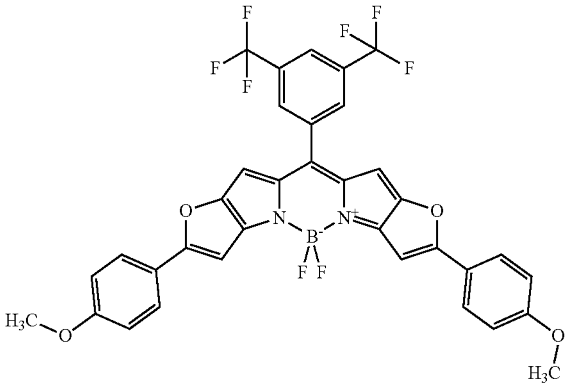
(50)
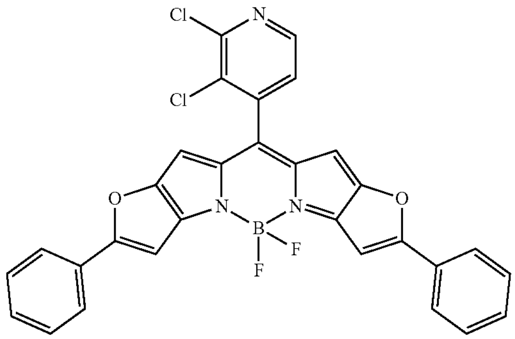
(51)
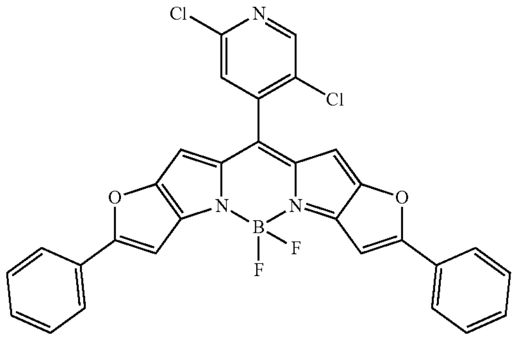
(52)
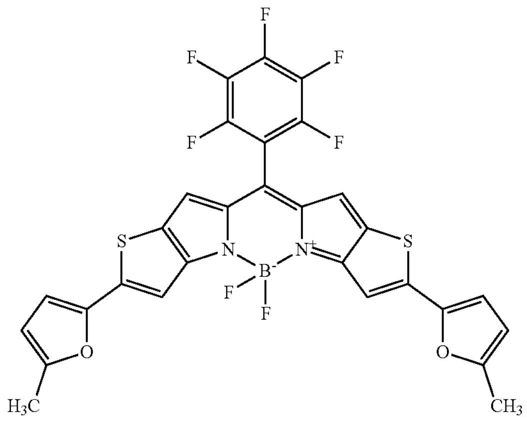

-continued
(53)
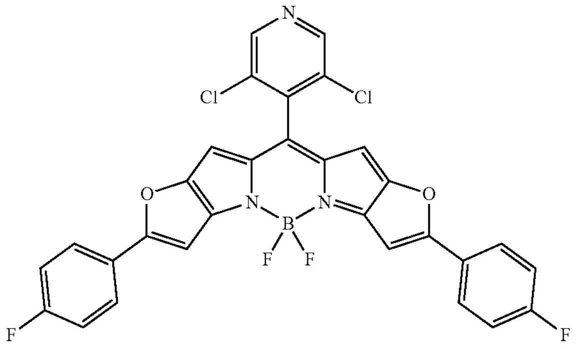
(54)
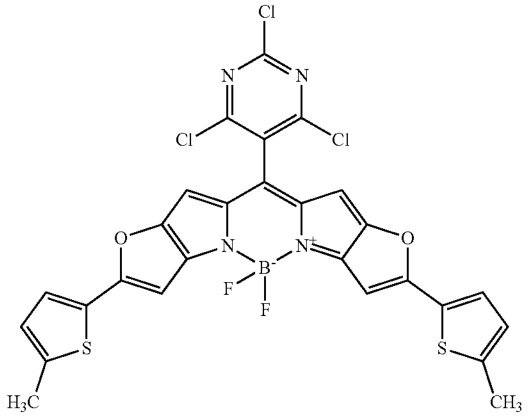
(55)
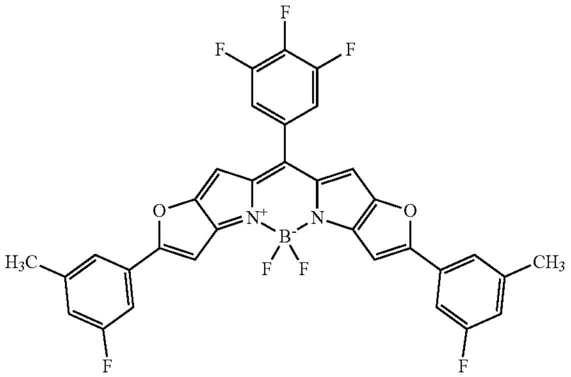
(56)
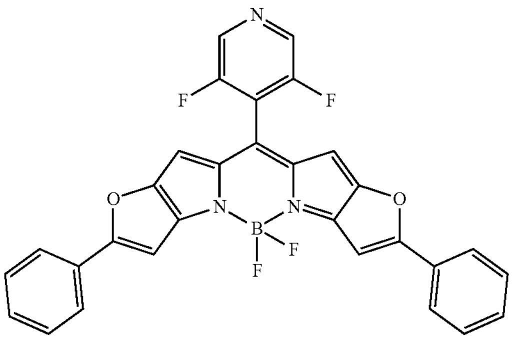
-continued
(57)
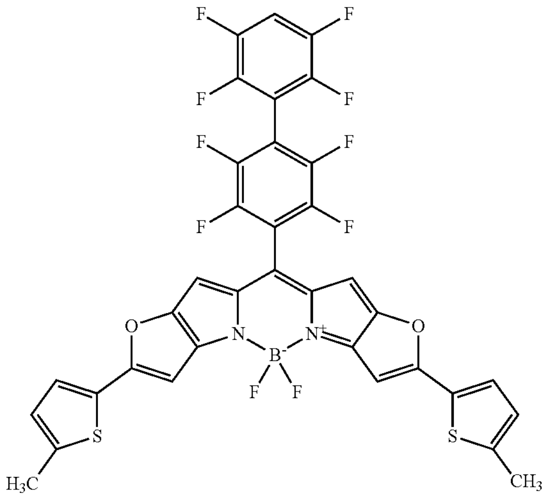
(58)
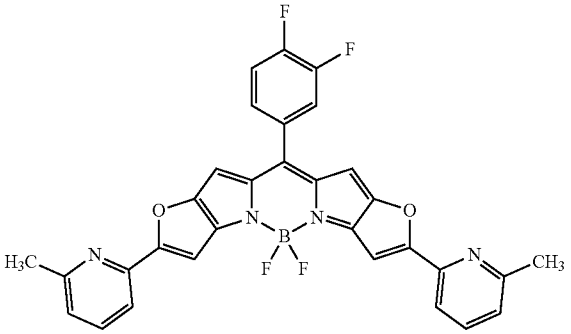
(59)
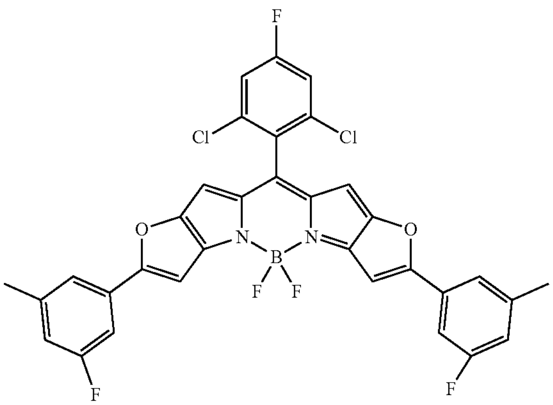

-continued (60)

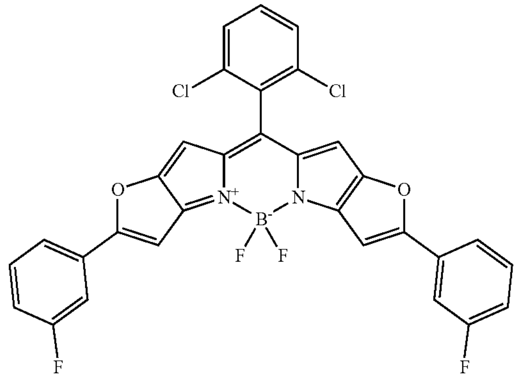

(61)

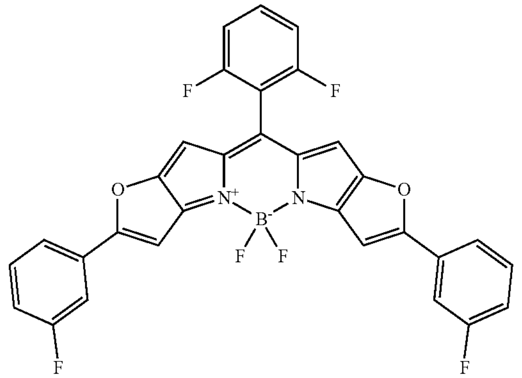

(62)

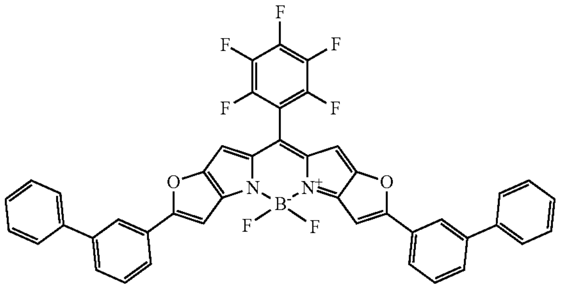

(63)

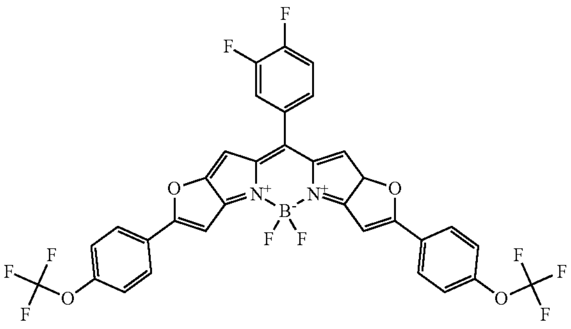

-continued (64)

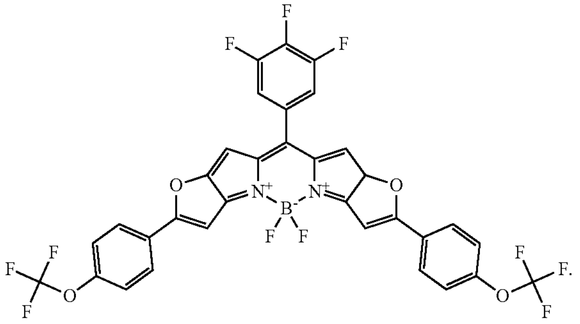

According to one development of the invention, all of the H atoms in R1 are substituted by a halogen, CF3 or CN, preferably all of the H atoms are substituted by F.

The compounds of the invention relate in particular to what are called small molecules. Small molecules are understood to mean, in particular, nonpolymeric organic molecules having monodisperse molar masses of between 100 and 2000 g/mol which at atmospheric pressure (air pressure of our surrounding atmosphere) and at room temperature are present in solid phase. In particular the small molecules are photoactive, with photoactive being understood to mean that when light is introduced, the molecules change their charge state and/or their polarization state. The photoactive molecules display in particular an absorption of electromagnetic radiation in a particular wavelength range, where absorbed electromagnetic radiation, i.e., photons, are converted into excitons.

According to one development of the invention, the compound has a molar weight of 300-1500 g/mol.

In one preferred embodiment of the invention, the compounds of the invention have no ring structure between R3 and R4 and/or between R5 and R6.

In one preferred embodiment of the invention, the compound is mirror-symmetrical in formation relative to the axis through R1 and B.

The object of the present invention is also achieved by the provision of a use of at least one compound of the invention in an optoelectronic component, more particularly according to one of the exemplary embodiments described above. In this case, for the use of the at least one compound in the optoelectronic component, the advantages already elucidated in connection with the compound of the invention, in particular, are produced.

According to one development of the invention, the compound of the invention is used in an organic optoelectronic component, preferably an organic solar cell, an OLED, an OFET, or an organic photodetector.

In one preferred embodiment of the invention, the at least one compound of the invention is used as absorber material in a photoactive layer of the optoelectronic component. In one preferred embodiment of the invention, the compound of the invention is employed as a donor in a donor-acceptor heterojunction.

The object of the present invention is also achieved by the provision of an optoelectronic component having a layer system, more particularly according to one of the exemplary embodiments described above, where at least one layer of the layer system comprises a compound of the invention. In this case at least one layer of the layer system comprises at least one compound of the invention. In this case, for the optoelectronic component, the advantages already elucidated in connection with the compound of the invention and with the use of the at least one compound of the invention in an optoelectronic component, in particular, are produced. The optoelectronic component comprises a first electrode, a second electrode, and a layer system, where the layer system is arranged between the first electrode and the second electrode.

According to one development of the invention, the optoelectronic component is an organic optoelectronic component, preferably an organic solar cell, an OFET, an OLED or an organic photodetector.

According to one development of the invention, the optoelectronic component comprises a layer system having at least one photoactive layer, preferably a light-absorbing photoactive layer, where the at least one photoactive layer comprises the at least one compound of the invention.

In one preferred embodiment of the invention, the at least one photoactive layer is an absorber layer, and preferably the at least one compound is an absorber material.

In one preferred embodiment of the invention, the photoactive layer is arranged between the first electrode and the second electrode.

In one preferred embodiment of the invention, the layer system has at least two photoactive layers, preferably at least three photoactive layers, or preferably at least four photoactive layers.

An organic optoelectronic component is understood in particular to mean a photovoltaic element having at least one organic photoactive layer, where the organic photoactive layer comprises at least one compound of the invention. An organic photovoltaic element enables electromagnetic radiation, particularly in the wavelength range of visible light, to be converted into electrical current, exploiting the photoelectric effect. In this sense the term "photoactive" is understood to mean conversion of light energy into electrical energy. In contrast to inorganic solar cells, with organic photovoltaic elements the light does not directly generate free charge carriers; instead, excitons are formed initially, these being electrically neutral excitation states (bound electron-hole pairs). Only in a second step are these excitons in a photoactive donor-acceptor junction free charge carriers separated, which then contribute to the electrical current flow.

In one preferred embodiment of the invention, the photoactive layer is embodied as a mixed layer composed of at least one compound of the invention and at least one further compound, or as a mixed layer of at least one compound of the invention and at least two further compounds, where the compounds are preferably absorber materials.

In one preferred embodiment of the invention, the layer system of the optoelectronic component has at least one transport layer, with the at least one transport layer being doped, partly doped or undoped. A transport layer is understood in particular to mean a layer of a layer system that transports charge carriers of one kind and preferably absorbs electromagnetic radiation largely only in a range of <450 nm.

In one preferred embodiment of the invention, the optoelectronic component has a substrate, with the first electrode or the second electrode being arranged on the substrate, preferably one of the electrodes of the optoelectronic component may be applied directly on the substrate, with the layer system being arranged between the first electrode and the second electrode.

In one preferred embodiment of the invention, the compound and/or a layer with the at least one compound is deposited by means of vacuum processing, vapor deposition or solvent processing, especially preferably by means of vacuum processing.

The invention is elucidated in more detail below with reference to the drawings, in which.

EXEMPLARY EMBODIMENTS

Figure 1:
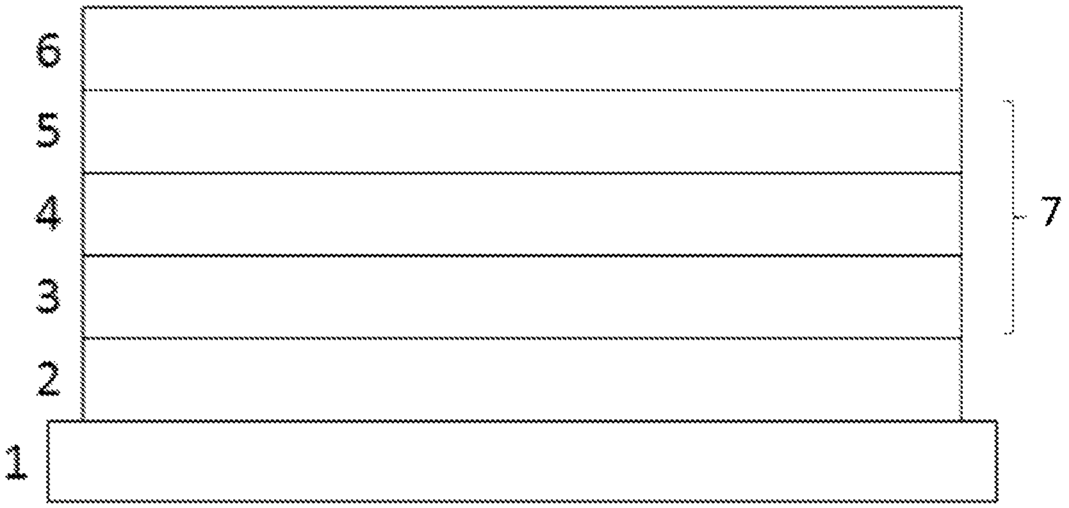
FIG. 1 shows a schematic representation of an exemplary embodiment of an optoelectronic component in cross section.

FIG. 1 shows a schematic representation of an exemplary embodiment of an optoelectronic component in cross section. This optoelectronic component comprises at least one chemical compound of the general formula I.

The optoelectronic component of the invention has a layer system 7, with at least one layer of the layer system 7 comprising a compound of the invention.

In one configuration of the invention, the optoelectronic component is an organic optoelectronic component, preferably an organic solar cell, an OFET, an OLED or an organic photodetector. In this exemplary embodiment the optoelectronic component is an organic solar cell.

The optoelectronic component comprises a first electrode 2, a second electrode 6 and a layer system 7, with the layer system 7 arranged between the first electrode 2 and the second electrode 6. At least one layer of the layer system 7 here comprises at least one compound of the invention.

In a further configuration of the invention, the optoelectronic component has a layer system 7 with at least one photoactive layer 4, preferably a light-absorbing photoactive layer 4, with the at least one photoactive layer 4 comprising the at least one compound of the invention.

In a further configuration of the invention, the layer system 7 has at least two photoactive layers 4, preferably at least three photoactive layers 4, or, preferably, at least four photoactive layers 4.

In one exemplary embodiment, the organic solar cell has a substrate 1, for example composed of glass, located on which there is an electrode 2, which for example comprises ITO. Arranged thereon is the layer system 7, with an electron-transporting layer 3 (ETL) and also a photoactive layer 4 with at least one compound of the invention, a p-conducting donor material, and an n-conducting acceptor material, e.g. C60 fullerene, either as a flat heterojunction or as a bulk heterojunction. Arranged above this is a p-doped hole transport layer 5 (HTL), and an electrode 6 of gold or aluminum, embodied as a bulk heterojunction.

In a further configuration of the invention, the photoactive layer 4 is embodied as a mixed layer composed of the at least one compound of the invention and of at least one further compound, or as a mixed layer of the at least one compound of the invention and at least two further compounds, with the compounds being absorber materials.

In a further configuration of the invention, the optoelectronic component is embodied as a tandem cell, triple cell or multiple cell. In these cases there are two or more photoactive layers 4 stacked one atop another, with the photoactive layers 4 being composed of identical or of different materials or material mixtures.

The individual component of the invention may be produced by vacuum evaporation, with or without carrier gas, or by processing of a solution or suspension, as in the case of coating or printing, for example. Individual layers may also be applied by sputtering. This is a possibility in particular for the base contact. Production of the layers by vacuum evaporation is advantageous, and in this case the carrier substrate may be heated.

In a further configuration of the invention, the optoelectronic component is a flexible optoelectronic component. A flexible optoelectronic component in the sense of the present invention refers to a component which is partially deformable upon an external exposure to force. As a result, such flexible components are suitable for arrangement on curved surfaces.

The general preparation of the compounds of the invention is known to the skilled person from the prior art. In this connection, reference is made more particularly to international applications WO2007126052A1 and EP3617214A1.

The chemical compound of the general formula I has the following structure:

I

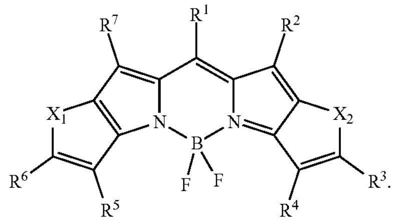

X1 and X2 are independently of one another O, S or N—R8, with R8 selected from the group consisting of H, alkyl, aryl, and heteroaryl, R1 is a substituted homocyclic 6-membered ring, where at least one H atom is substituted by an electron-withdrawing substituent selected from the group consisting of F, Cl, CN, CF3, and COR8, with R8 being C1-C4 alkyl, or is a substituted or unsubstituted heterocyclic 5-membered ring or 6-membered ring, where the heterocyclic 5-membered ring or 6-membered ring has at least one sp2-hybridized N atom with a free electron pair and/or has at least one heteroatom selected from O, S, or N, wherein at least one H atom is substituted by an electron-withdrawing substituent selected from the group consisting of F, Cl, CN, CF3, and COR9, with R9 being C1-C4 alkyl. R2 and R7 are selected independently of one another from the group consisting of H, halogen, CN, alkyl, fluorinated or partly-fluorinated alkyl, and unsaturated alkyl. R4 and R5 are selected independently of one another from the group consisting of H, halogen, CN, alkyl, fluorinated or partly-fluorinated alkyl, unsaturated alkyl, and alkoxy. R3 and R6 are independently of one another a substituted or unsubstituted homocyclic 6-membered ring or a substituted or unsubstituted heterocyclic 5-membered ring or 6-membered ring.

In one configuration of the invention, X1 and X2 are S or X1 and X2 are O, and/or at least one H atom in the homocyclic 6-membered ring and/or in the heterocyclic 5-membered ring or 6-membered ring R1 is substituted by F or CF3, preferably by F.

In a further configuration of the invention, R3 and R4 and/or R5 and R6 in each case together form a heterocyclic 5-membered ring or 6-membered ring having at least one heteroatom selected from O, S or N, preferably O or S, where preferably the heterocyclic 5-membered ring or 6-membered ring is unsubstituted, or form a homocyclic 6-membered ring.

In a further configuration of the invention, R1 is a homocyclic 6-membered ring with the condition that R1 is $C_6H_nF_{5-n}$, where n=0, 1, 2, 3, 4.

In a further configuration of the invention, R1 is selected from the group consisting of:

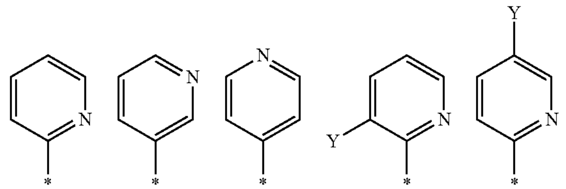

-continued

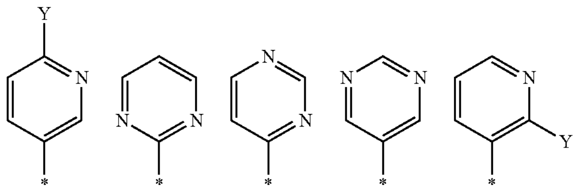
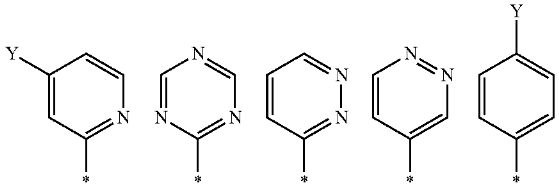
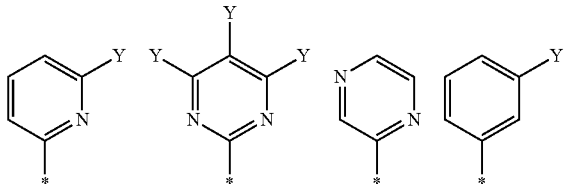
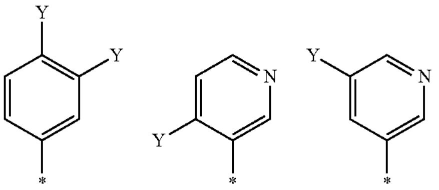
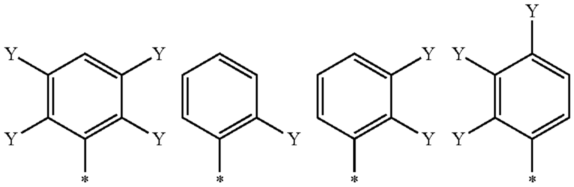
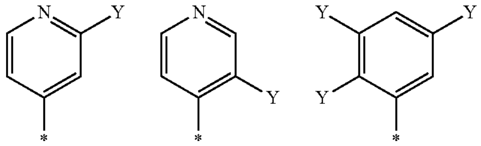
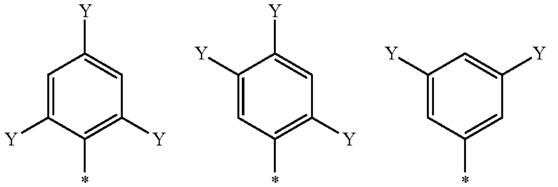
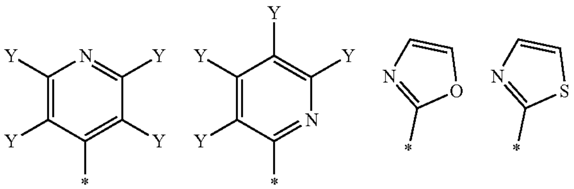
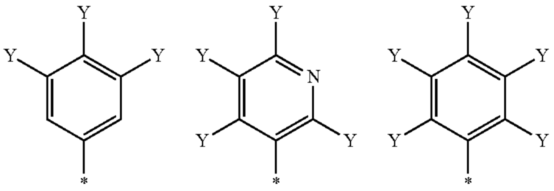

-continued

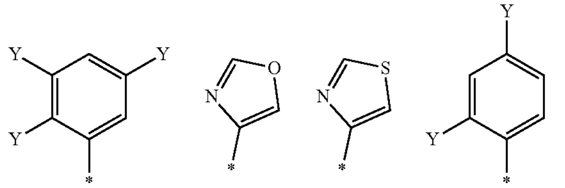
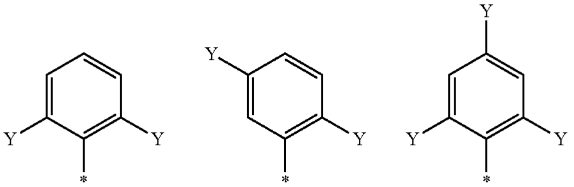
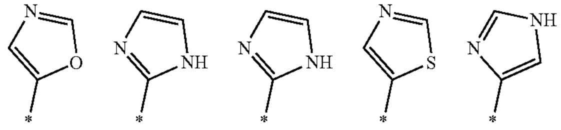
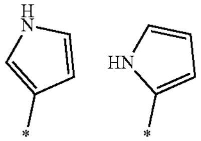

where * denotes the attachment to the compound of the general formula I, where Y independently at each occurrence is selected from the group consisting of Cl, CN, F, and CF3, preferably Y is F, and where H atoms are substituted or unsubstituted.

In a further configuration of the invention, R3 and R6 are selected independently of one another from the group consisting of

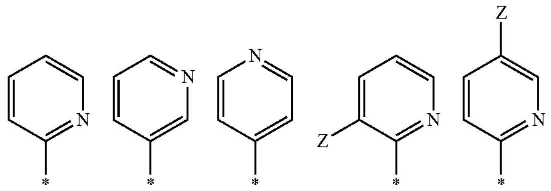
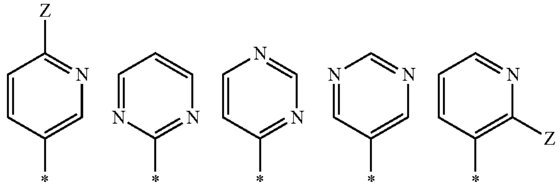
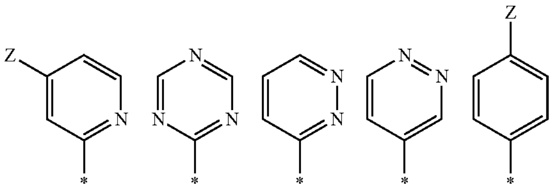
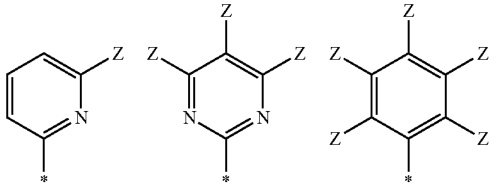

-continued

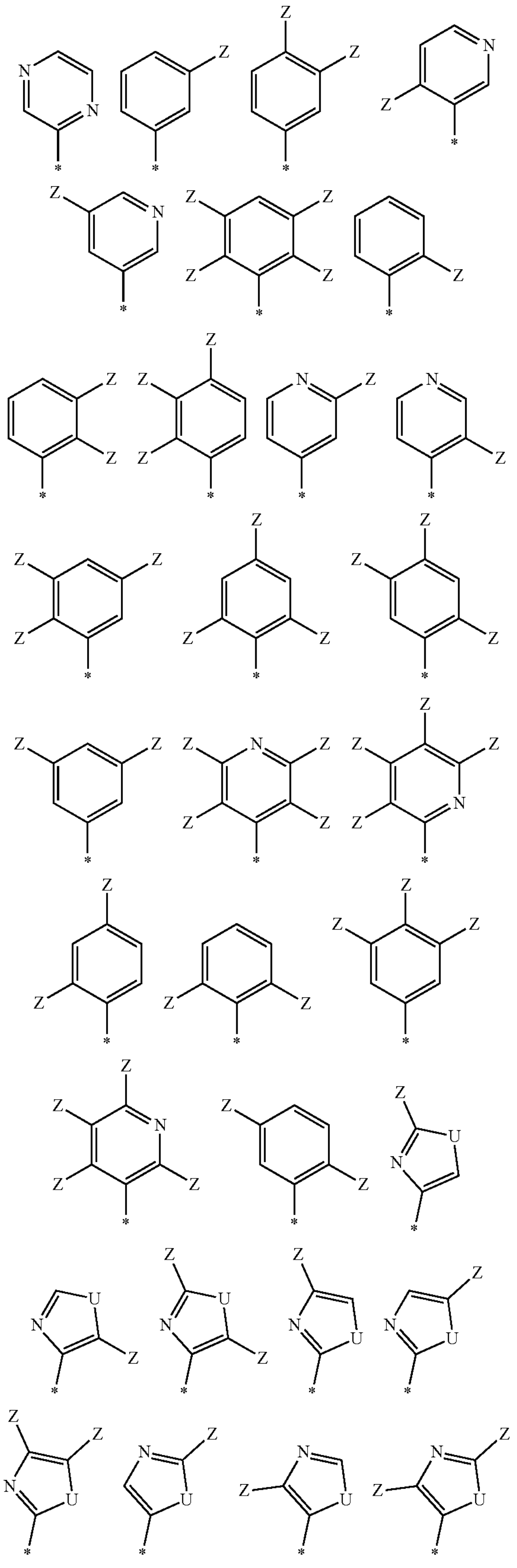

-continued

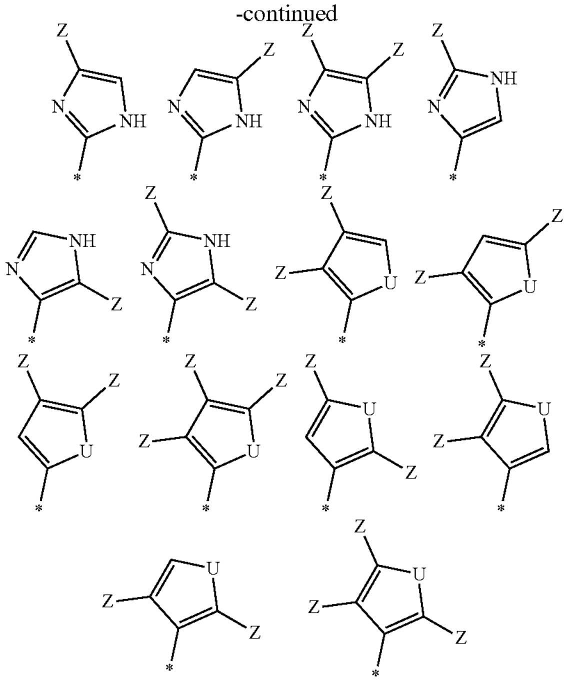

where * denotes the attachment to the compound of the general formula I, where U is selected from the group consisting of O, S, and NR19, where R19 is selected from the group consisting of H, halogen, alkyl, fluorinated alkyl, partly-fluorinated alkyl, alkoxy, alkenyl, aryl, and heteroaryl, preferably U is O or S, and where Z independently at each occurrence is selected from the group consisting of H, halogen, preferably F, CF3, CN, alkyl, fluorinated alkyl, partly-fluorinated alkyl, alkenyl, alkoxy, N-alkyl, N-alkyl2, aryl, and heteroaryl, where preferably R3 and R6 are identical.

In a further configuration of the invention, R3 and/or R6 are additionally fused, and/or R1 is a monocyclic 5-membered ring or 6-membered ring.

In a further configuration of the invention, R2 and R7 are selected independently of one another from the group consisting of H, halogen, CN, ad C1-C4 alkyl, preferably R2 and R7 are H, and/or R4 and R5 independently of one another are selected from the group consisting of H, halogen, CN, and C1-C4 alkyl, preferably R4 and R5 are H.

In a further configuration of the invention, R1 is a heterocyclic 5-membered ring or 6-membered ring having at least one sp2-hybridized N atom with a free electron pair in the ring system, preferably R1 is selected from the group consisting of substituted or unsubstituted imidazole, pyrazole, triazole, tetrazole, pyridine, pyrimidine, pyrazine, pyridazine, triazine, oxazole, isoxazole, thiazole, and isothiazole.

In a further configuration of the invention, the compound is selected from the group consisting of:

-continued
(1)
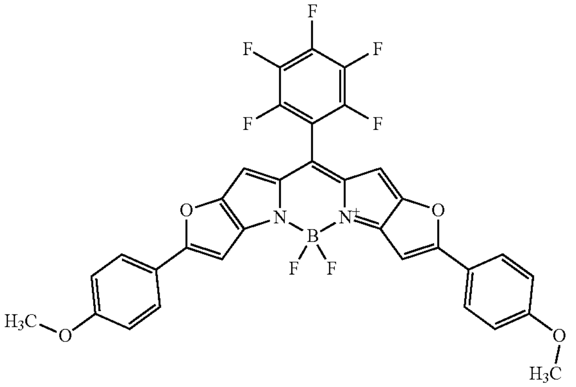
(2)
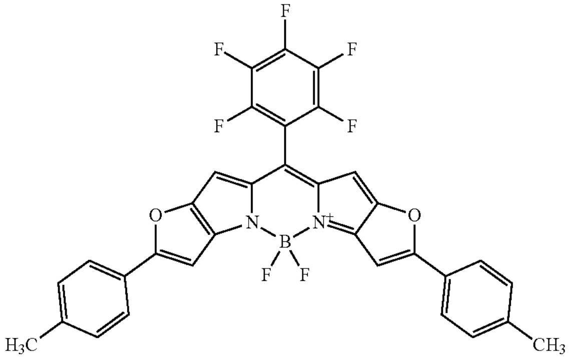
(3)
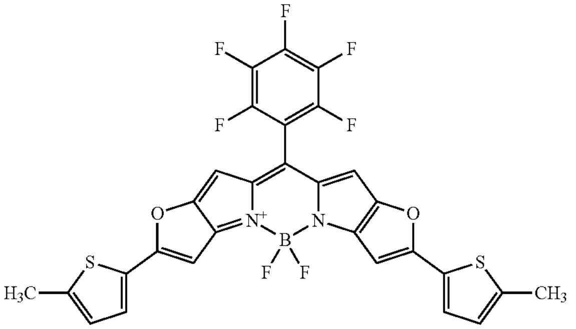
(4)
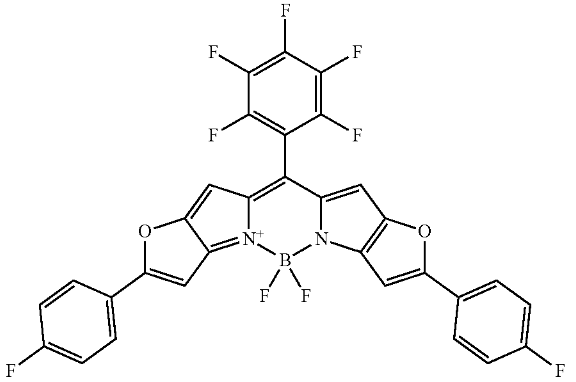
(5)
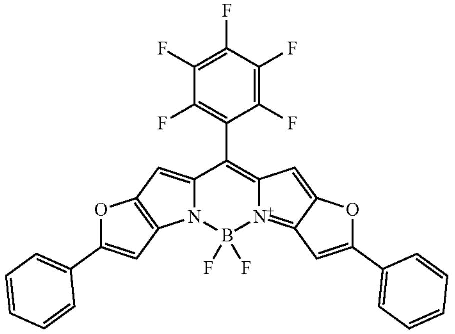
(6)
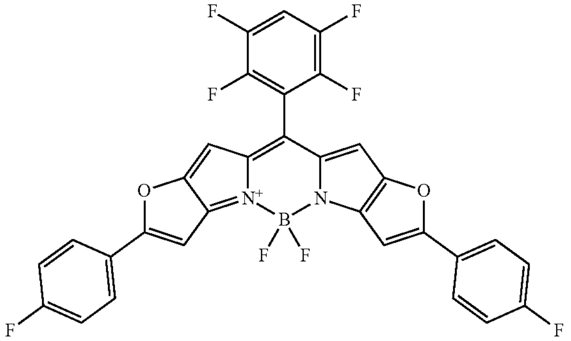
(7)
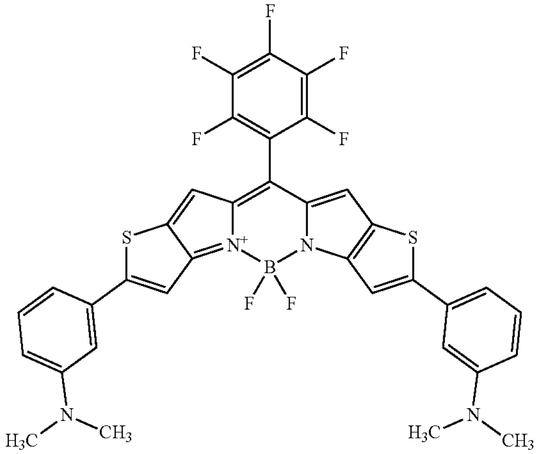
(8)
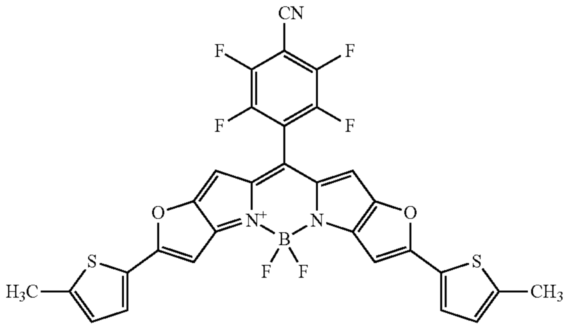

-continued
(9)
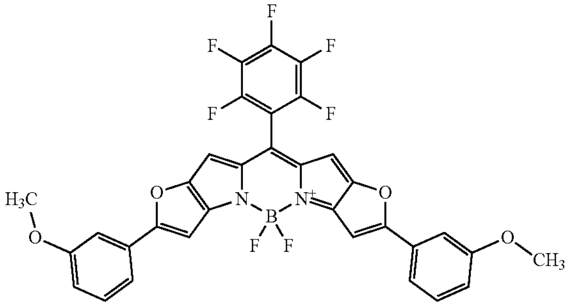
(10)
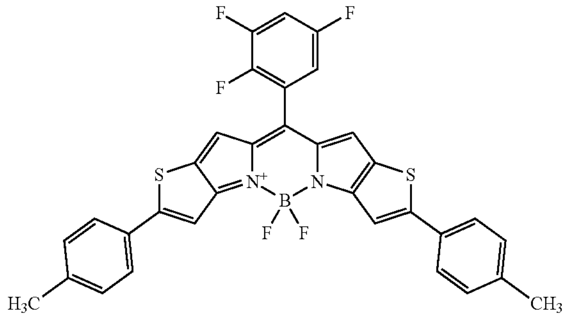
(11)
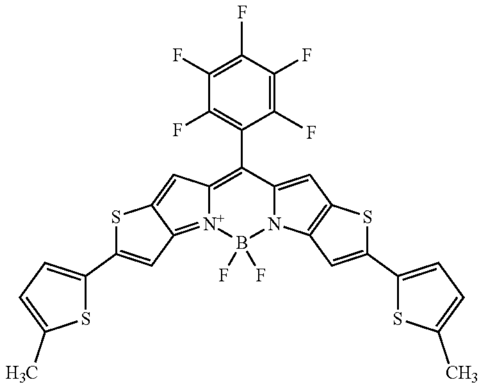
(12)
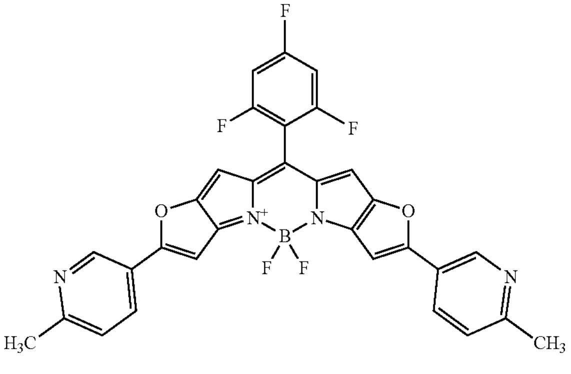
-continued
(13)
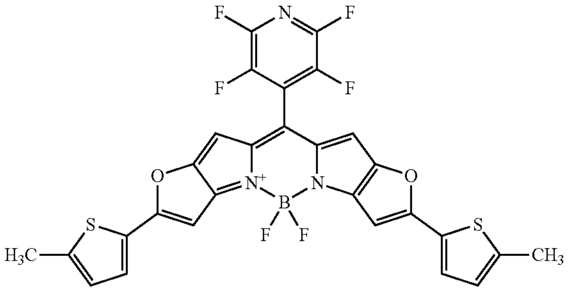
(14)
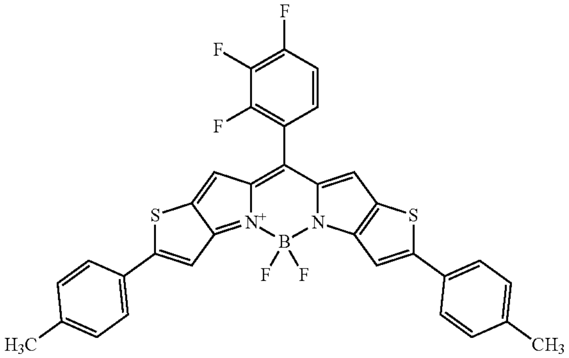
(15)
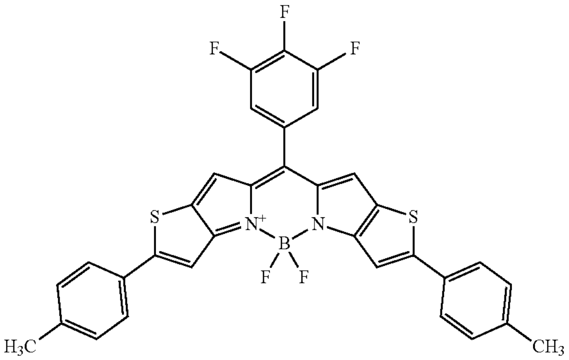
(16)
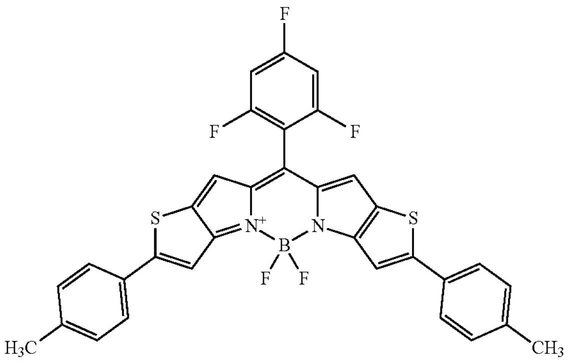

-continued
(17)
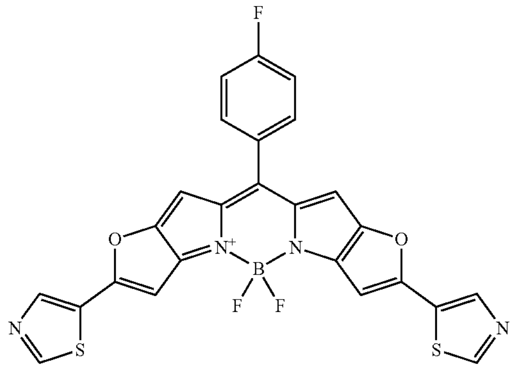
(18)
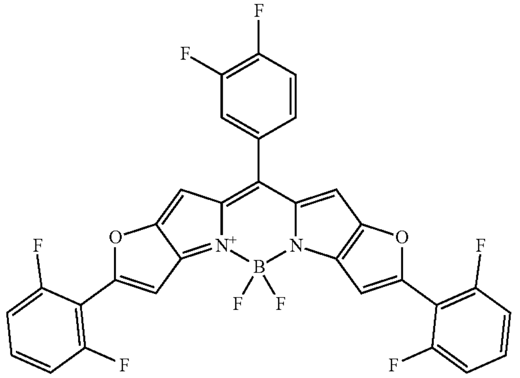
(19)
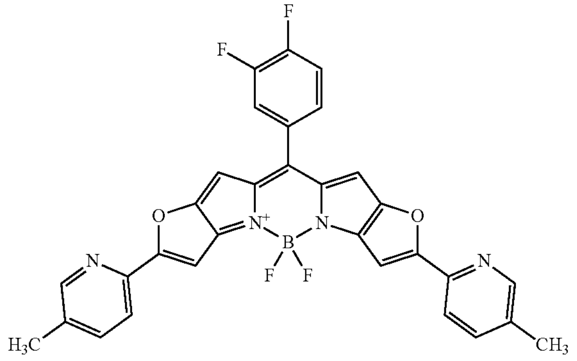
(20)
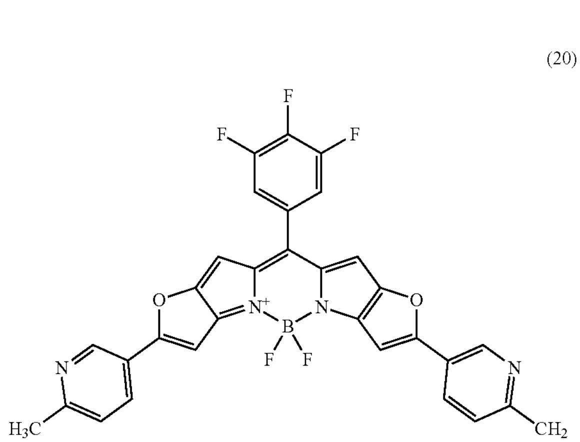
-continued
(21)
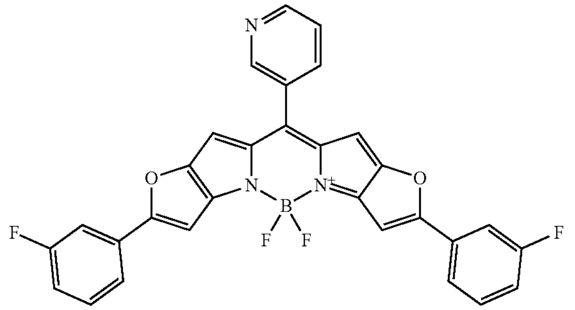
(22)
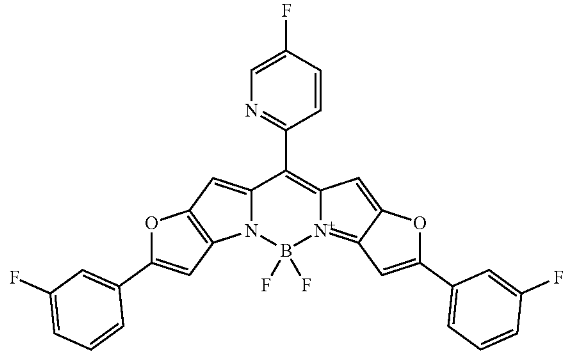
(23)
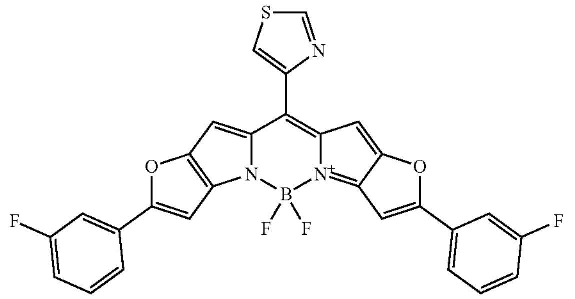
(24)
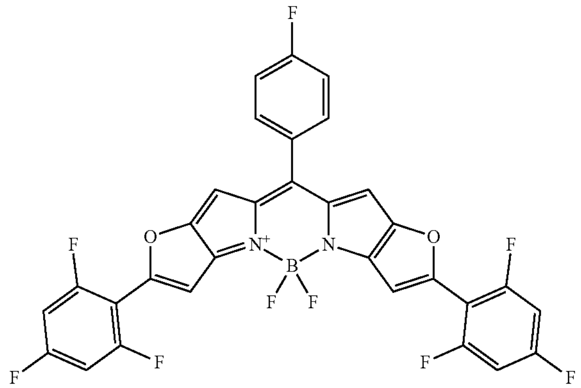

-continued
(25)
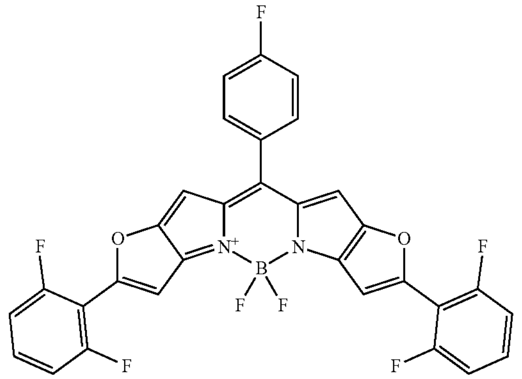
(26)
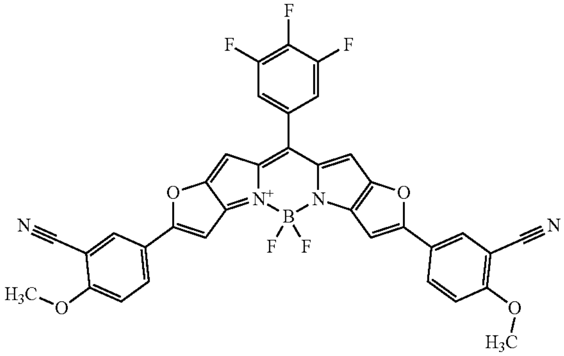
(27)
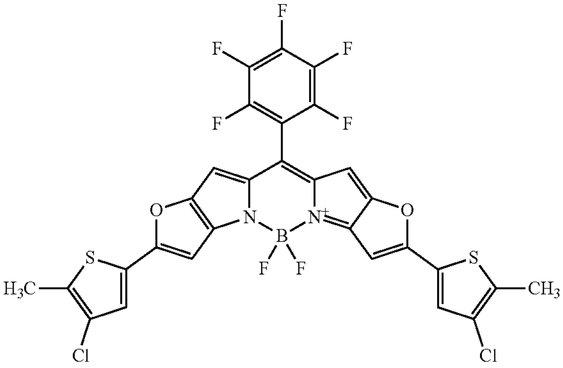
(28)
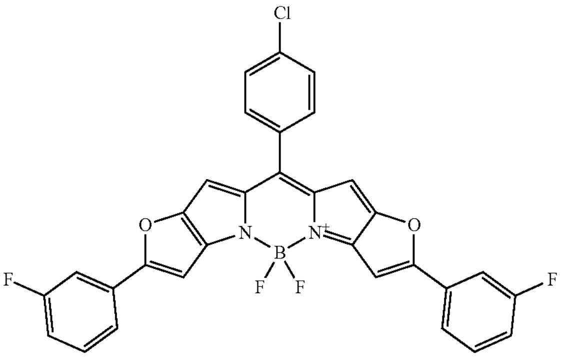
-continued
(29)
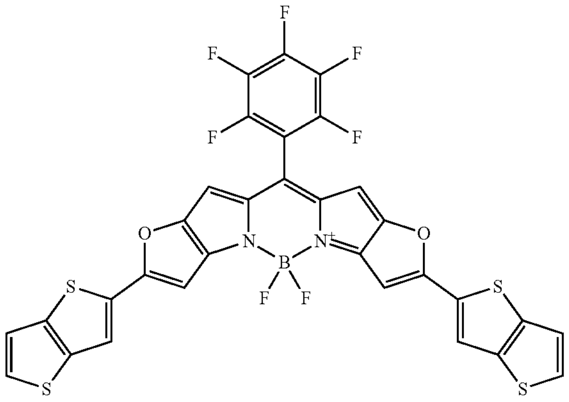
(30)
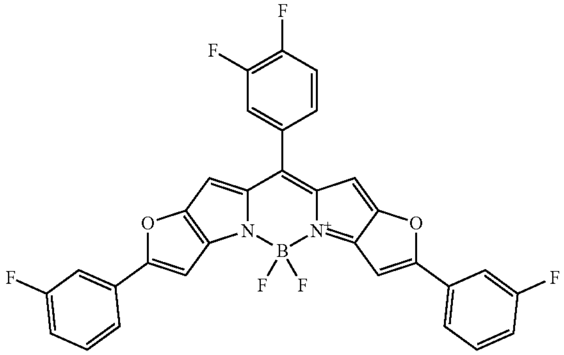
(31)
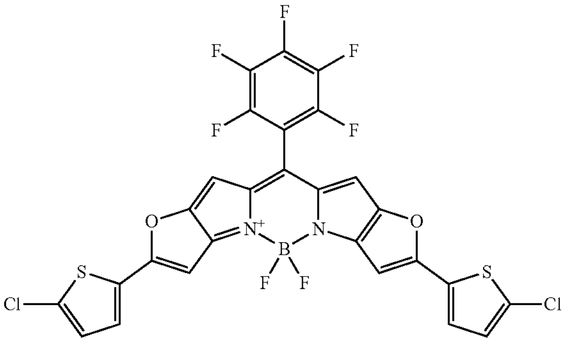
(32)
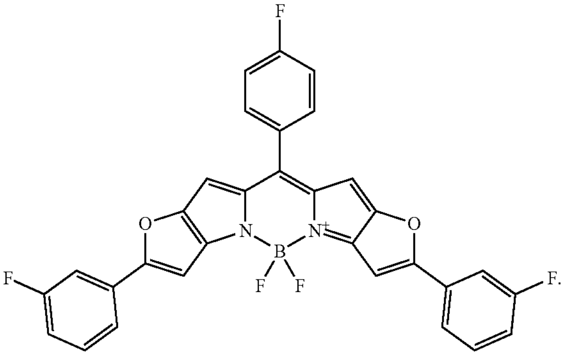
In a further configuration of the invention, all the H atoms in R1 are substituted by a halogen or CN, preferably all the H atoms are substituted by F.

In a further configuration of the invention, the compound has a molar weight of 300-1500 g/mol.

The compound of the invention is used, in one configuration of the invention, in an optoelectronic component, preferably an organic optoelectronic component, especially preferably an organic solar cell, an OLED, an OFET, or an organic photodetector.

In the following FIGS. 2 to 21, specific exemplary embodiments are shown of the chemical compound of the invention having the general formula I and also of its optical properties. The parameters of open-circuit voltage Uoc, short-circuit current Jsc and fill factor FF are each based on the same construction of the photovoltaic element.

Figure 2:
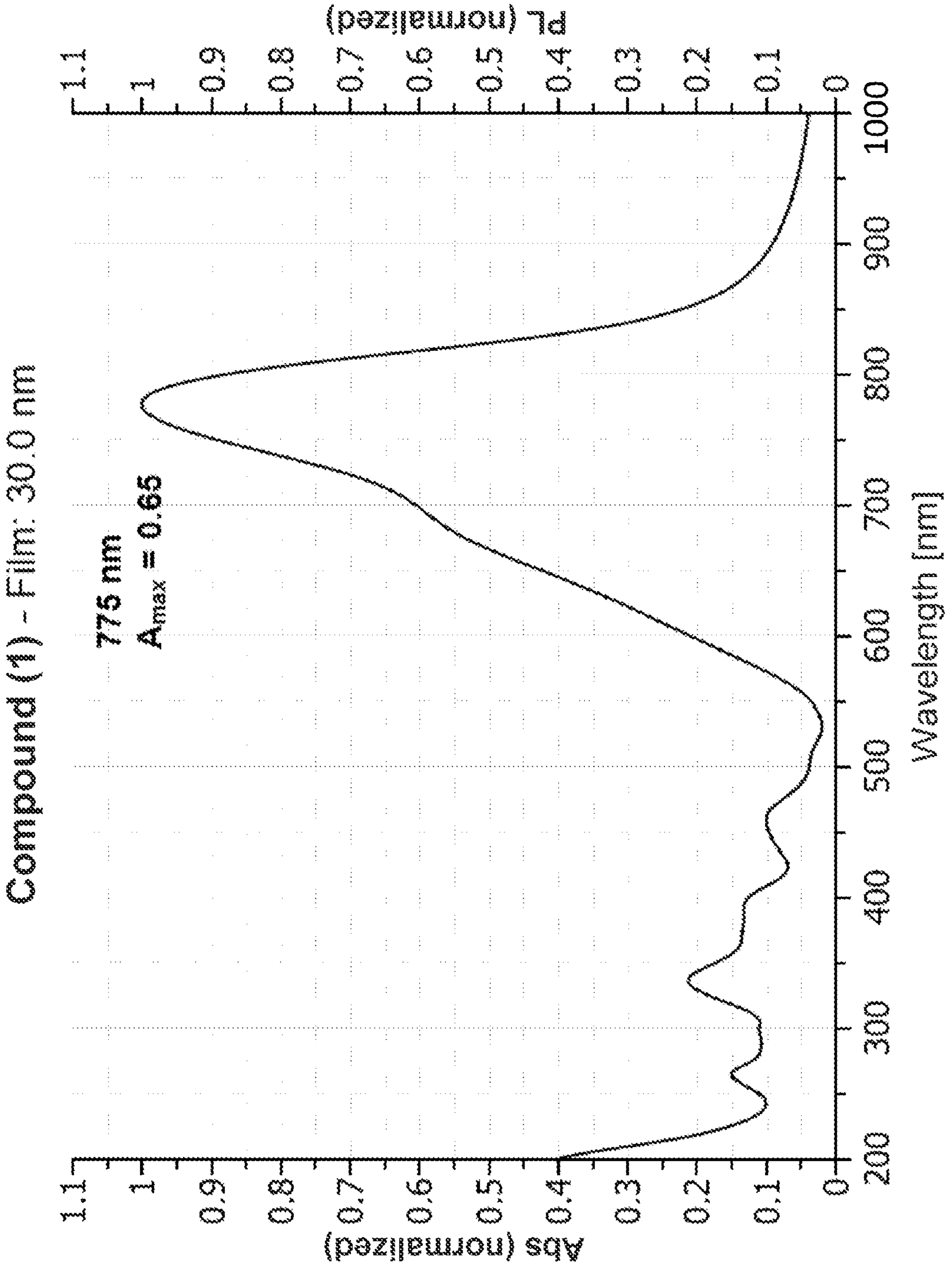
FIG. 2 shows a graphic representation of the absorption spectrum of the compound (1)

FIG. 2 shows a graphic representation of the absorption spectrum of the compound (1).

The absorption spectra (optical density over wavelength in nm) of the compounds (1) to (32) were measured in each case for layers 30 nm thick applied by vacuum vapor deposition to fused silica, and in a solution of dichloromethane.

Figure 3:
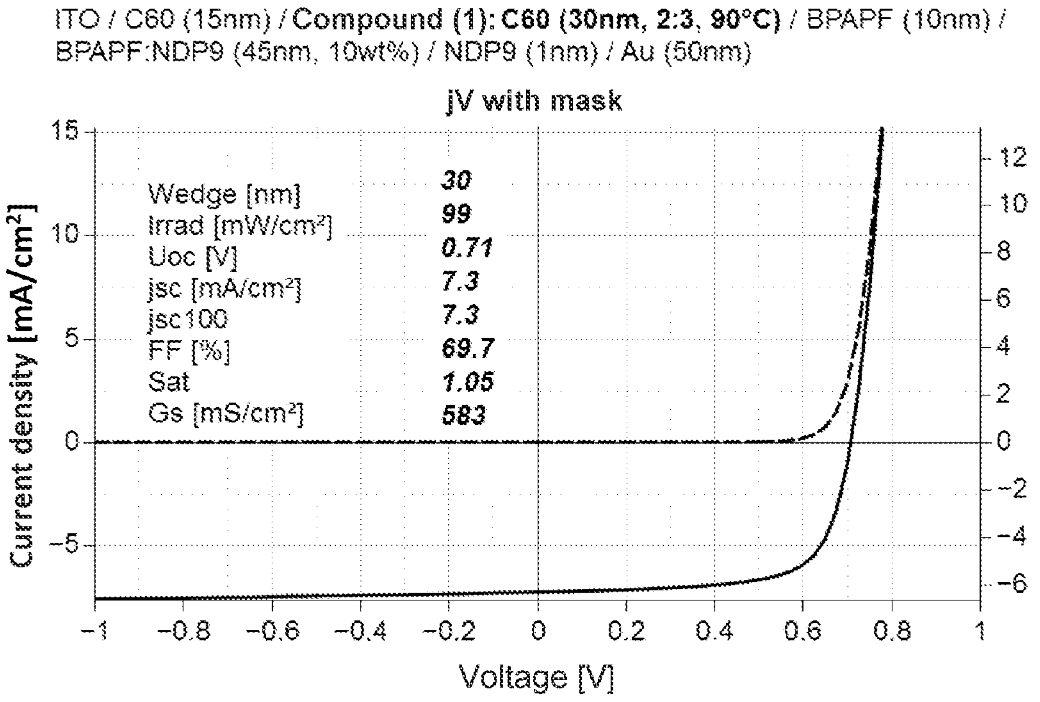
FIG. 3 shows a graphic representation of the current-voltage curve, the spectral external quantum efficiency and the fill factor of a BHJ cell with the compound (1), measured on an organic optoelectronic component.
Figure 3:
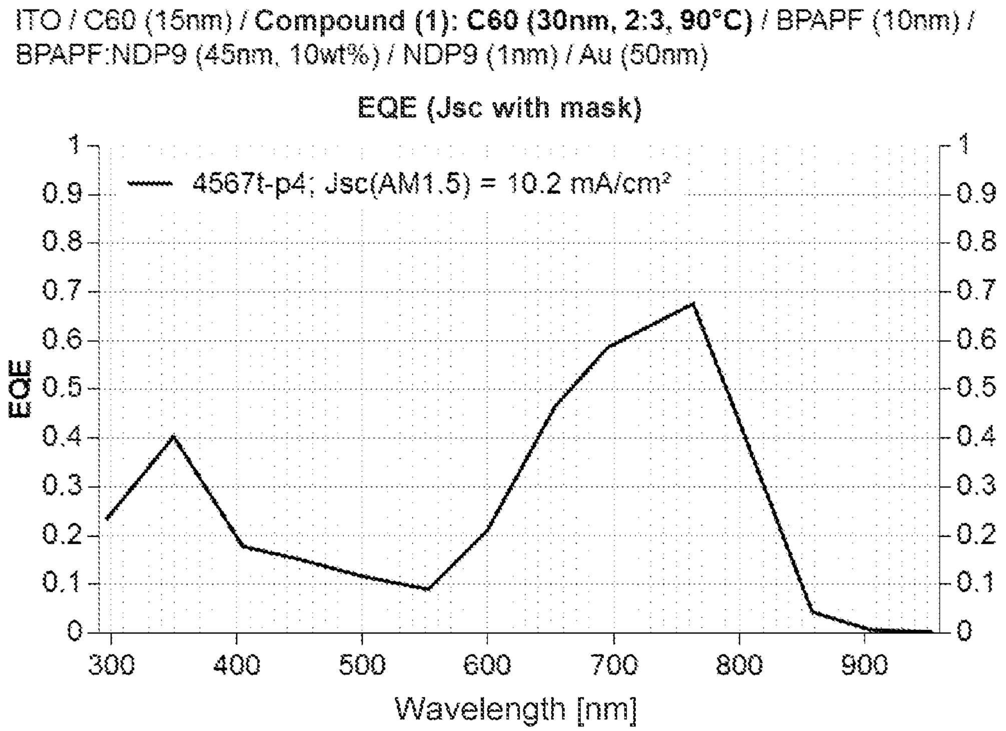

FIG. 3 shows a graphic representation of the current-voltage curve, the spectral external quantum efficiency and the fill factor of a BHJ cell with the compound (1), measured on an organic optoelectronic component. In this exemplary embodiment, the optoelectronic component is an organic solar cell.

The current-voltage curve contains quantities which characterize the organic solar cell. The most important quantities here are the fill factor FF, the open-circuit voltage Uoc and the short-circuit current Jsc.

For the investigation of the compounds, i.e., for use thereof as absorber materials in organic optoelectronic components, the current-voltage curve of a BHJ cell was measured. In this exemplary embodiment, the BHJ cell on the ITO layer has a layer of C60 with a layer thickness of 15 nm. The compound (1) was applied to this layer, together with C60, in a thickness of 30 nm. Following this layer is a layer of BPAPF (9,9-bis[4-(N,N-bisbiphenyl-4-yl-amino)phenyl]-9H-fluorene) in a layer thickness of 10 nm. Located atop this is a further layer comprising BPAPF and NDP9 in a layer thickness of 45 nm. This layer is adjoined by a further layer with NDP9 in a thickness of 1 nm, followed by a gold layer in a thickness of 50 nm. In this configuration, ITO serves as electrode 2, and the adjacent fullerene C60 serves as electron transport layer (ETL) 3, followed by the photoactive layer 4 with C60 as electron acceptor material and the respective absorber, followed by BPAPF (9,9-bis[4-(N,N-bisbiphenyl-4-ylamino)phenyl]-9H-fluorene) as hole transport layer (HTL) 5 and BPAPF doped with NDP9 (Novaled AG), followed by a gold electrode 6. In accordance with the invention at least one layer in a layer system of a semiconducting component comprises a compound of the general formula I.

The current-voltage curve of a BHJ cell having the following construction: ITO/C60 (15 nm)/compound(1): C60 (30 nm, 3:2, 90° C.)/BPAPF (10 nm)/BPAPF:NDP9 (45 nm, 10 wt % NDP9)/NDP9 (1 nm)/Au (50 nm) was determined. The parameters of the cell were measured under AM1.5 illumination (AM=air mass; AM=1.5 with this spectrum the overall radiant power is 1000 $W/m^2$; AM=1.5 as standard value for the measurement of solar modules), with the photoactive layer comprising a bulk heterojunction (BHJ).

In the optoelectronic component with compound (I), the fill factor FF is 69.7%, the open-circuit voltage Uoc is 0.71 V and the short-circuit current Jsc is 10.2 mA/cm2. The cell efficiency of an optoelectronic component of this kind, more particularly of a solar cell, with the compound (1) is 5.05%.

The compound (1) exhibits good evaporability under vacuum. The evaporation temperature of the compound (1) is 230° C., while the decomposition temperature is 377° C. In comparison to this, a corresponding comparative compound (1) which has a CF3 group rather than a C6F5 group in the meso position of the compound (1) has an evaporation temperature of 215° C. and a decomposition temperature of just 317° C., which is lower by 60° C.

Figure 4:
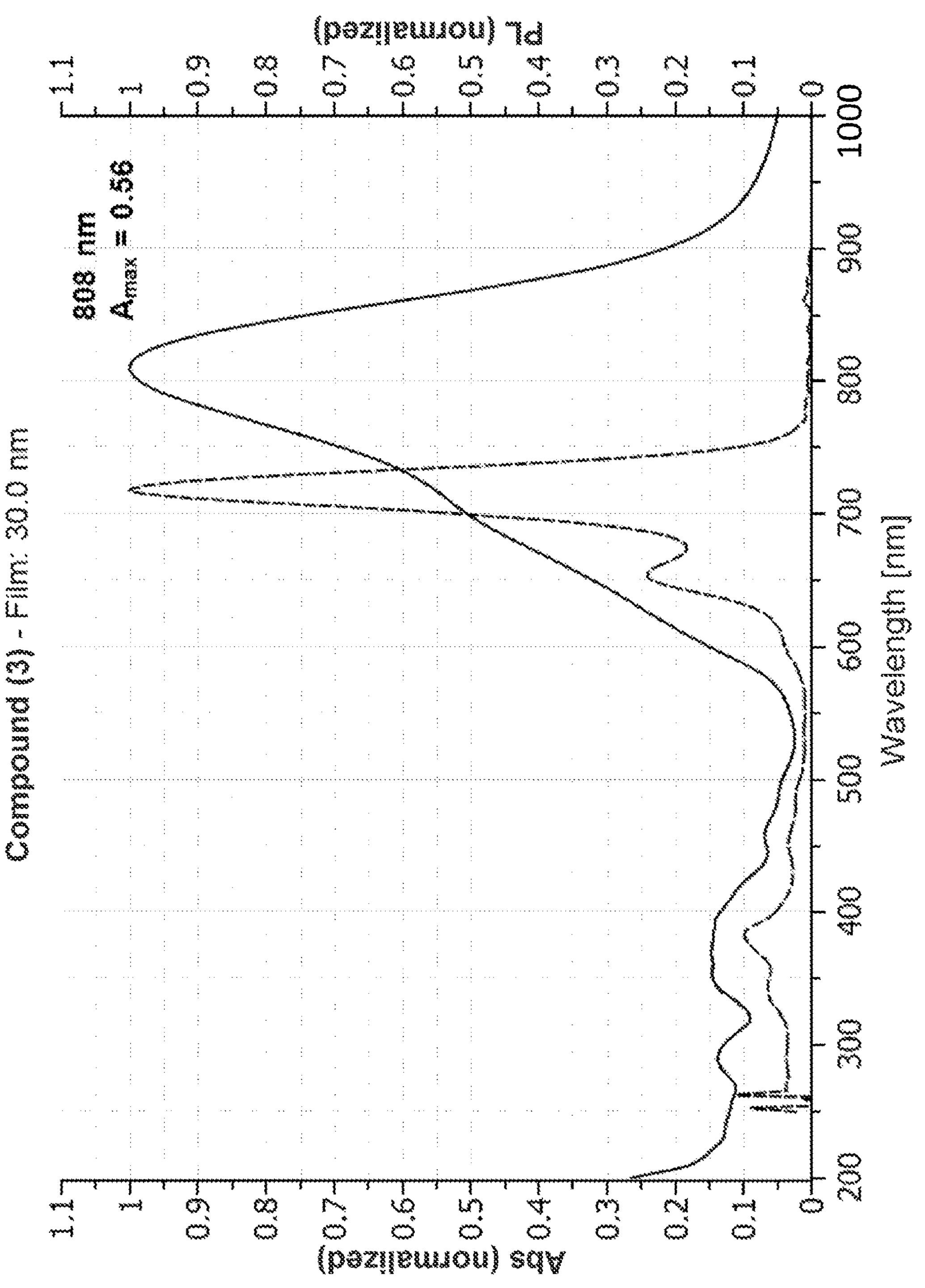
FIG. 4 shows a graphic representation of the absorption spectrum of the compound (3)

FIG. 4 shows a graphic representation of the absorption spectrum of the compound (3).

Figure 5:
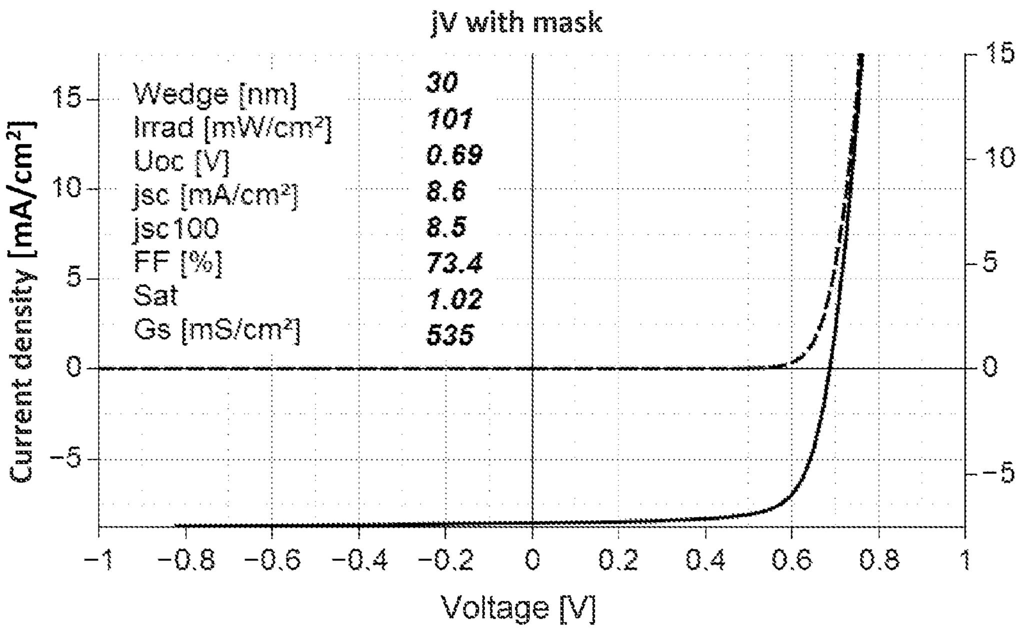
FIG. 5 shows a graphic representation of the current-voltage curve, the spectral external quantum efficiency and the fill factor of a BHJ cell with the compound (3), measured on an organic optoelectronic component.
Figure 5:
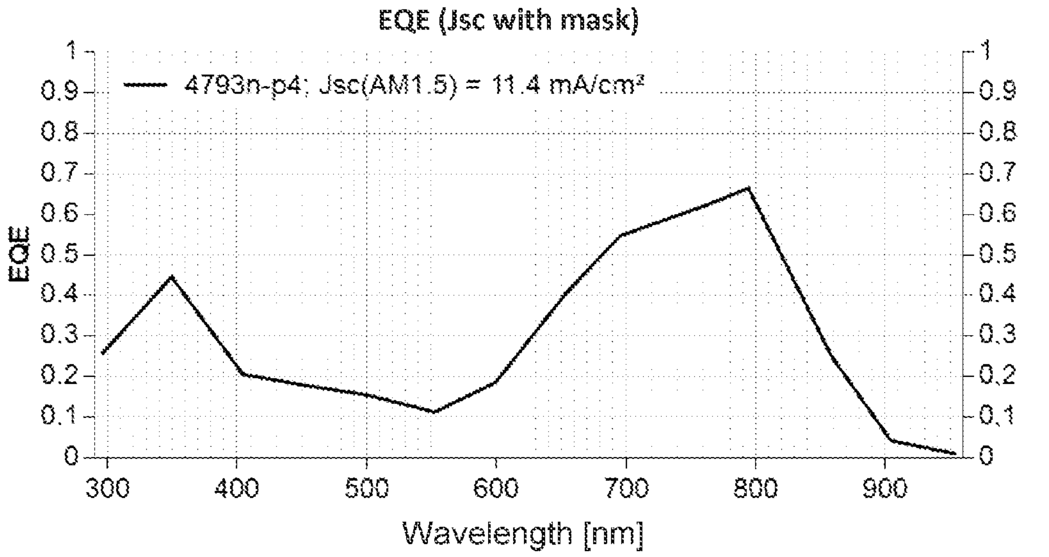

FIG. 5 shows a graphic representation of the current-voltage curve, the spectral external quantum efficiency and the fill factor of a BHJ cell with the compound (3), measured on an organic optoelectronic component. In this exemplary embodiment, the optoelectronic component is an organic solar cell.

The current-voltage curve of a BHJ cell having the following construction: ITO/C60 (15 nm)/compound(3): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (3), the fill factor FF is 73.4%, the open-circuit voltage Uoc is 0.69 V and the short-circuit current Jsc is 11.4 mA/cm2. The cell efficiency of an optoelectronic component of this kind, more particularly of a solar cell, with the compound (3) is 5.77%.

The compound (3) exhibits good evaporability under vacuum.

Figure 6:
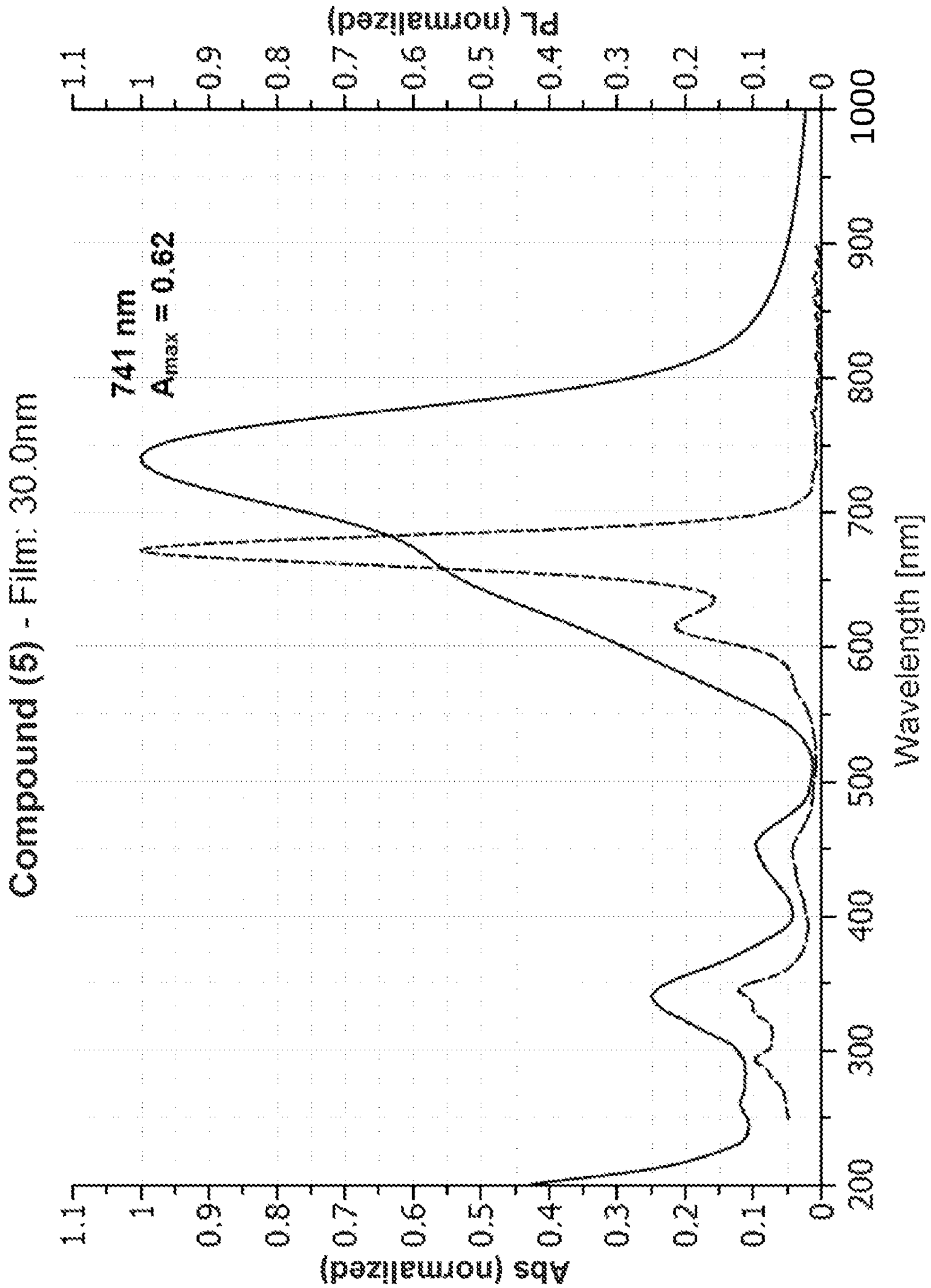
FIG. 6 shows a graphic representation of the absorption spectrum of the compound (5)

FIG. 6 shows a graphic representation of the absorption spectrum of the compound (5).

Figure 7:
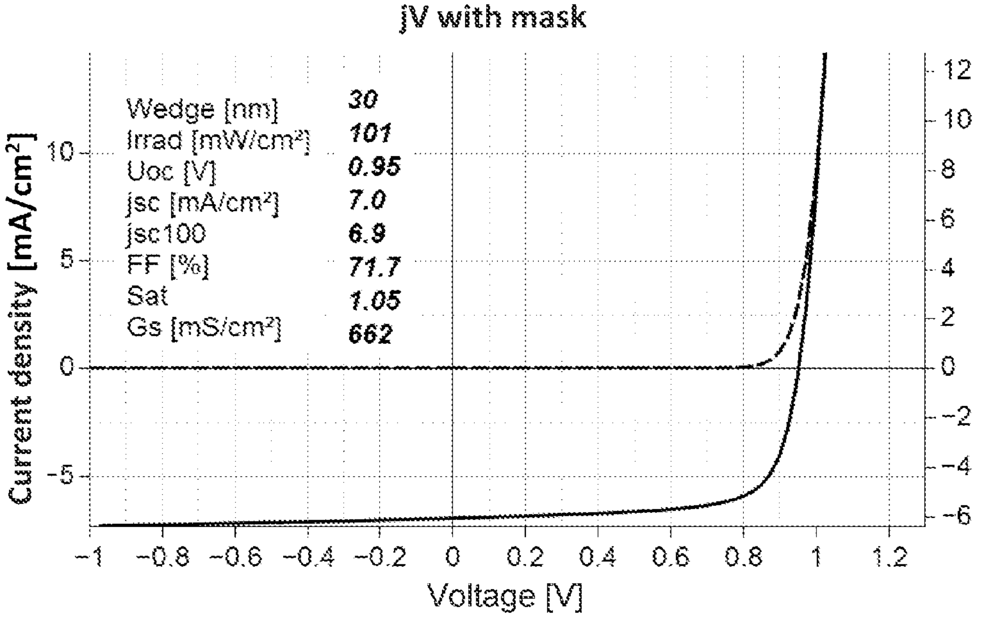
FIG. 7 shows a graphic representation of the current-voltage curve, the spectral external quantum efficiency and the fill factor of a BHJ cell with the compound (5), measured on an organic optoelectronic component.
Figure 7:
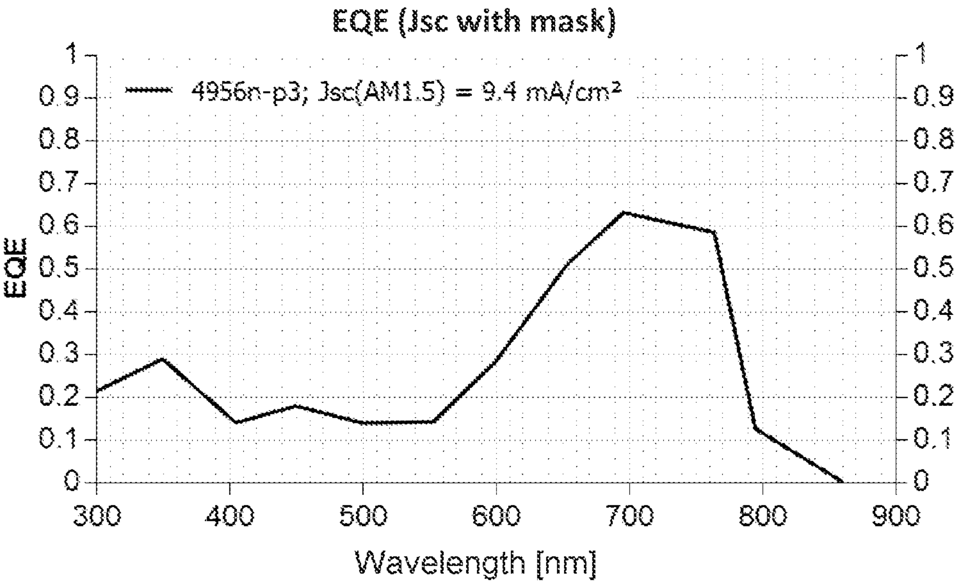

FIG. 7 shows a graphic representation of the current-voltage curve, the spectral external quantum efficiency and the fill factor of a BHJ cell with the compound (5), measured on an organic optoelectronic component. In this exemplary embodiment, the optoelectronic component is an organic solar cell.

The current-voltage curve of a BHJ cell having the following construction: ITO/C60 (15 nm)/compound(5): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (5), the fill factor FF is 71.7%, the open-circuit voltage Uoc is 0.95 V and the short-circuit current Jsc is 9.4 mA/cm2. The cell efficiency of an optoelectronic component of this kind, more particularly of a solar cell, with the compound (5) is 6.40%.

Figure 8:
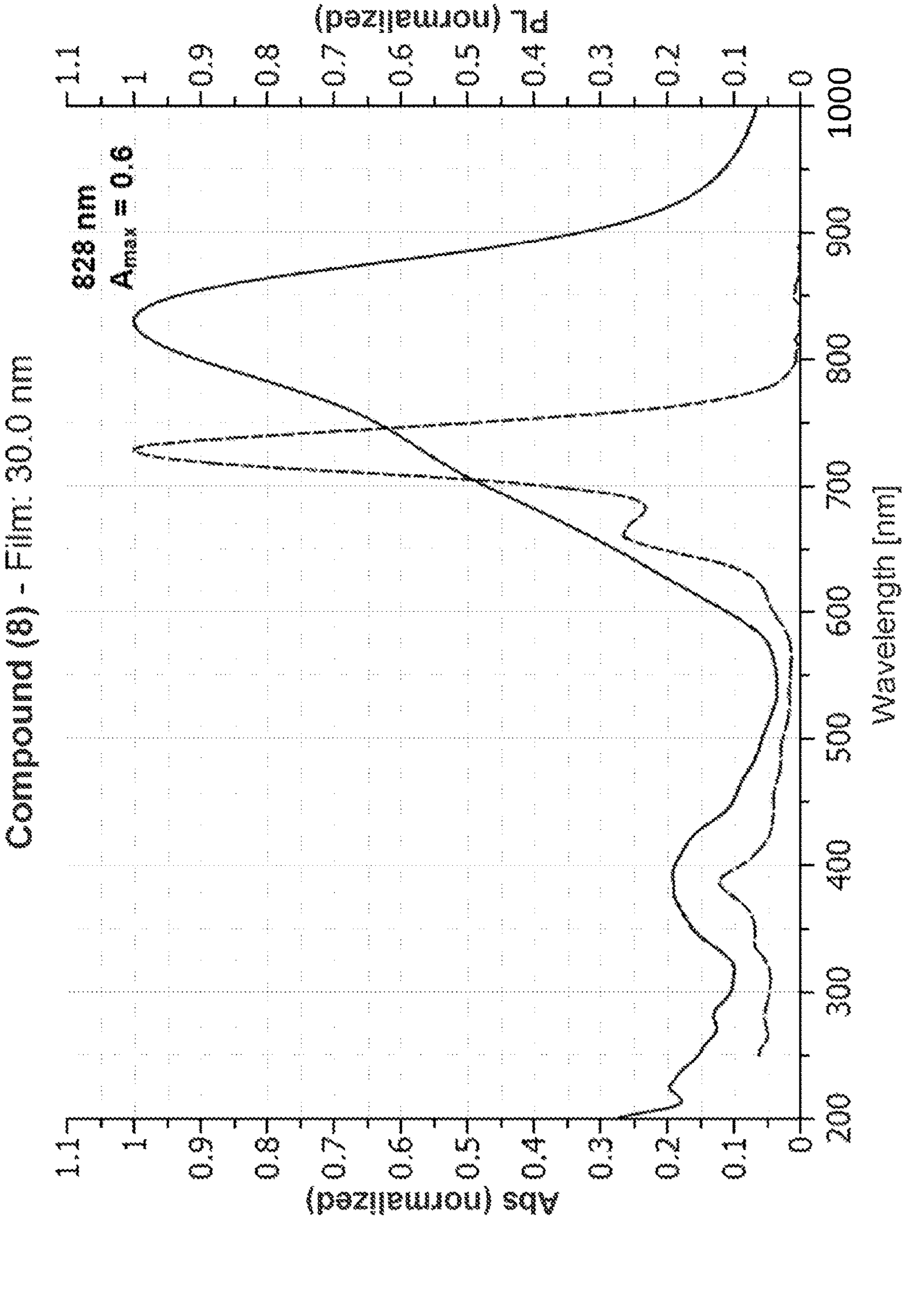
FIG. 8 shows a graphic representation of the absorption spectrum of the compound (8)

FIG. 8 shows a graphic representation of the absorption spectrum of the compound (8).

Figure 9:
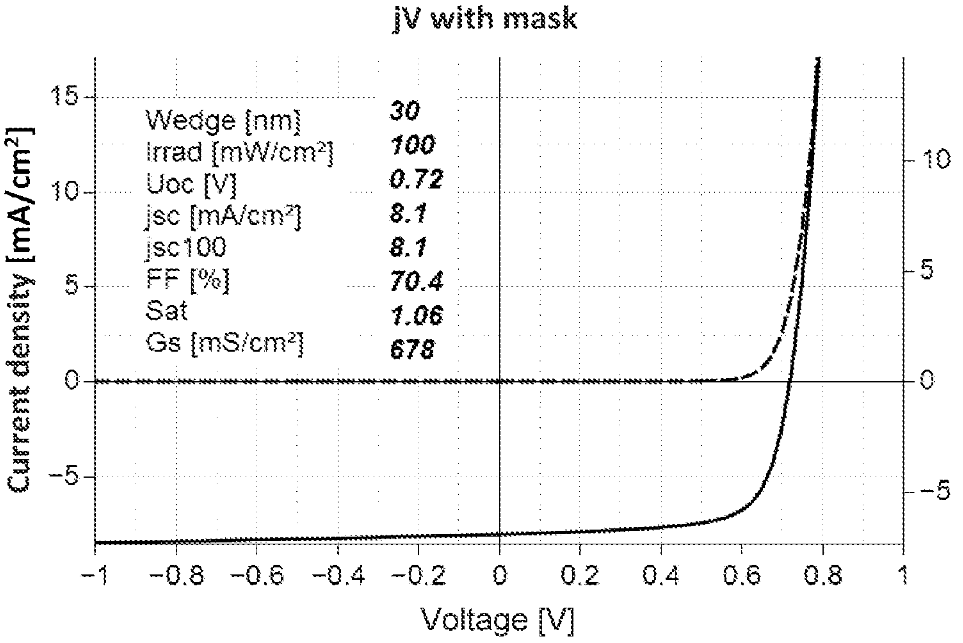
FIG. 9 shows a graphic representation of the current-voltage curve, the spectral external quantum efficiency and the fill factor of a BHJ cell with the compound (8), measured on an organic optoelectronic component.
Figure 9:
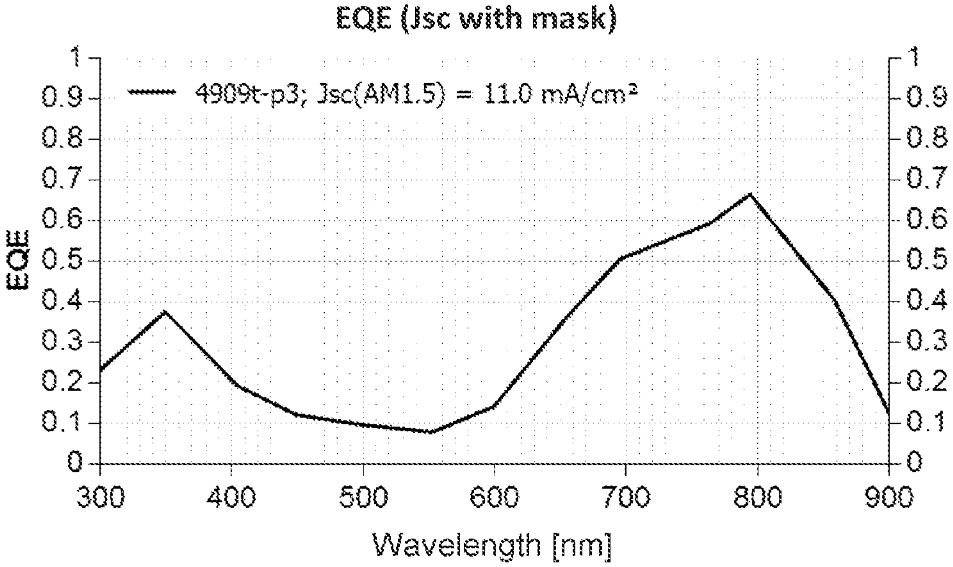

FIG. 9 shows a graphic representation of the current-voltage curve, the spectral external quantum efficiency and the fill factor of a BHJ cell with the compound (8), measured on an organic optoelectronic component. In this exemplary embodiment, the optoelectronic component is an organic solar cell.

The current-voltage curve of a BHJ cell having the following construction: ITO/C60 (15 nm)/compound(8): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (8), the fill factor FF is 70.4%, the open-circuit voltage Uoc is 0.72 V and the short-circuit current Jsc is 11.0 mA/cm2. The cell efficiency of an optoelectronic component of this kind, more particularly of a solar cell, with the compound (8) is 5.58%.

Figure 10:
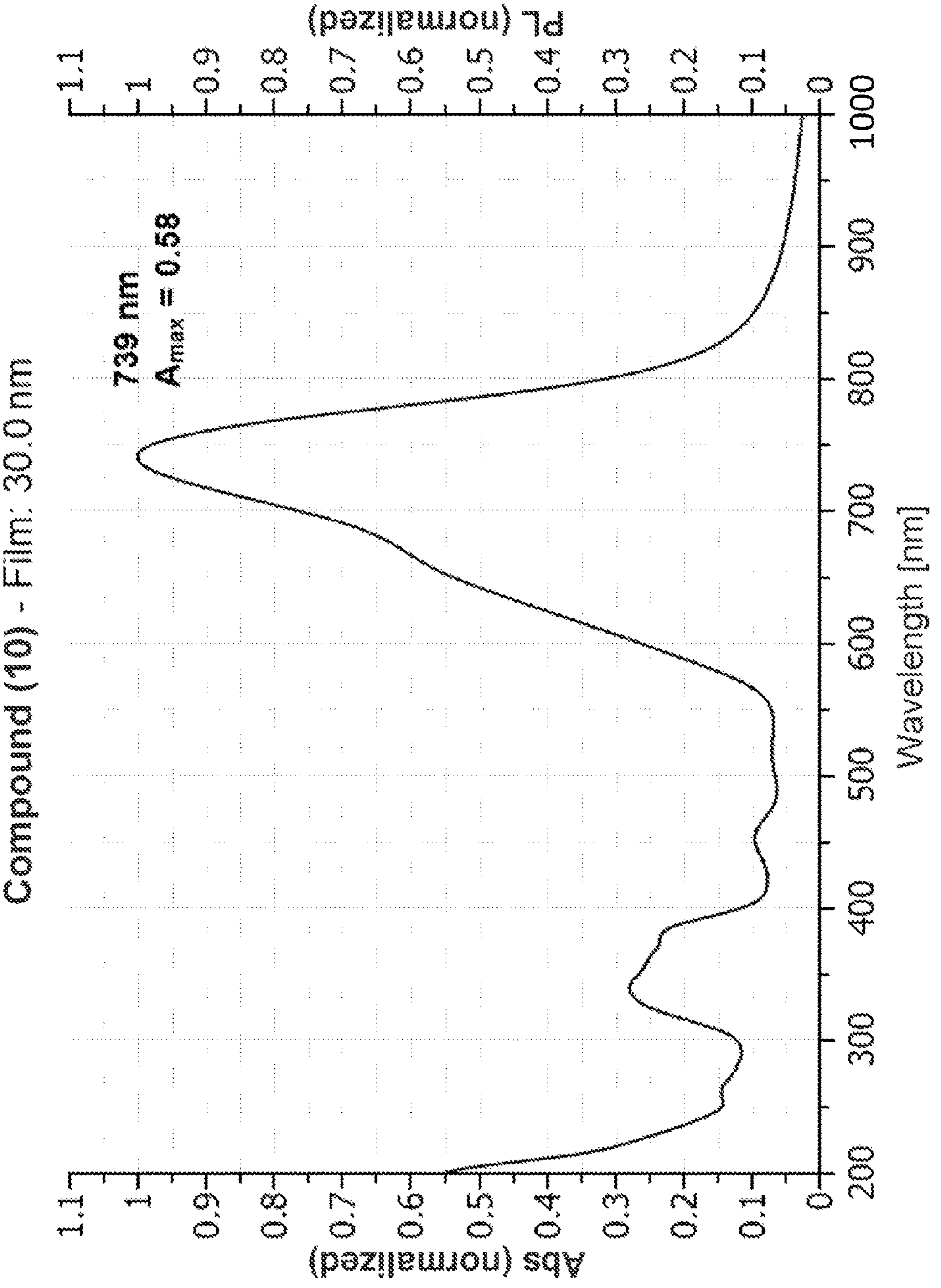
FIG. 10 shows a graphic representation of the absorption spectrum of the compound (10)

FIG. 10 shows a graphic representation of the absorption spectrum of the compound (10).

Figure 11:
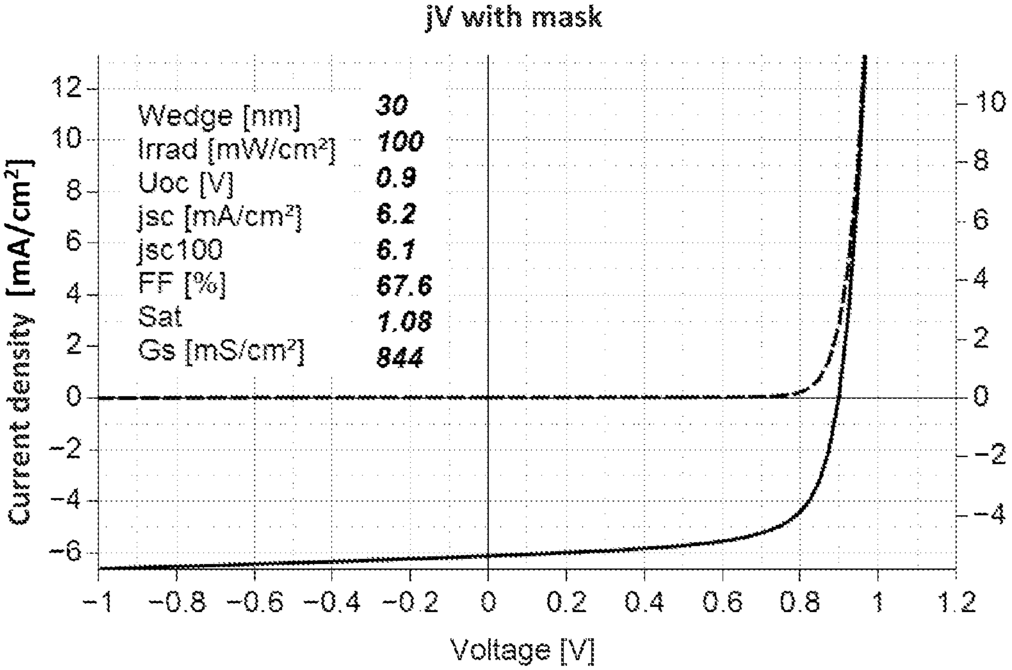
FIG. 11 shows a graphic representation of the current-voltage curve, the spectral external quantum efficiency and the fill factor of a BHJ cell with the compound (10), measured on an organic optoelectronic component.
Figure 11:
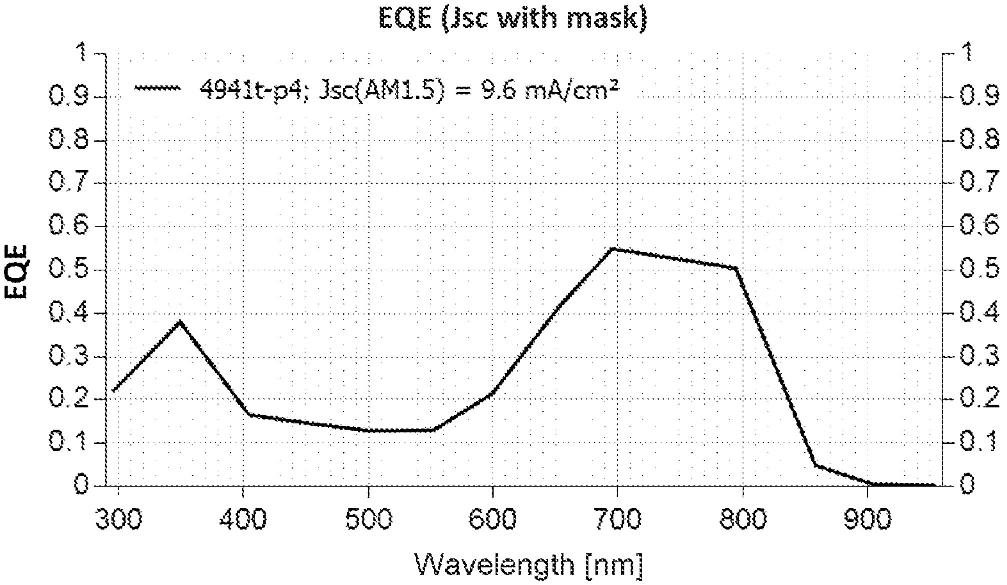

FIG. 11 shows a graphic representation of the current-voltage curve, the spectral external quantum efficiency and the fill factor of a BHJ cell with the compound (10), measured on an organic optoelectronic component. In this exemplary embodiment, the optoelectronic component is an organic solar cell.

The current-voltage curve of a BHJ cell having the following construction: ITO/C60 (15 nm)/compound(10): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (10), the fill factor FF is 67.6%, the open-circuit voltage Uoc is 0.90 V and the short-circuit current Jsc is 9.6 mA/cm2. The cell efficiency of an optoelectronic component of this kind, more particularly of a solar cell, with the compound (10) is 5.84%.

Figure 12:
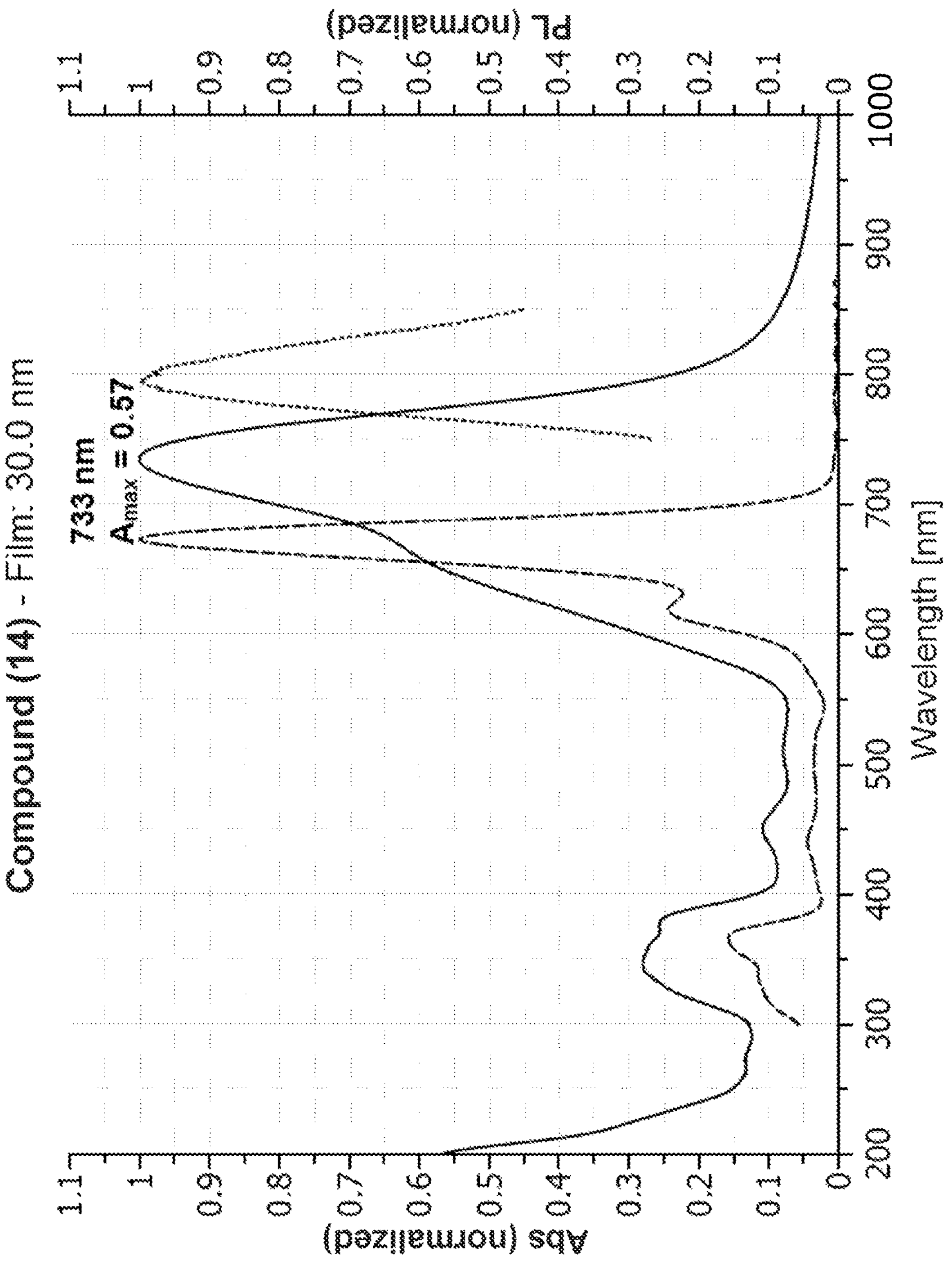
FIG. 12 shows a graphic representation of the absorption spectrum of the compound (14)

FIG. 12 shows a graphic representation of the absorption spectrum of the compound (14).

Figure 13:
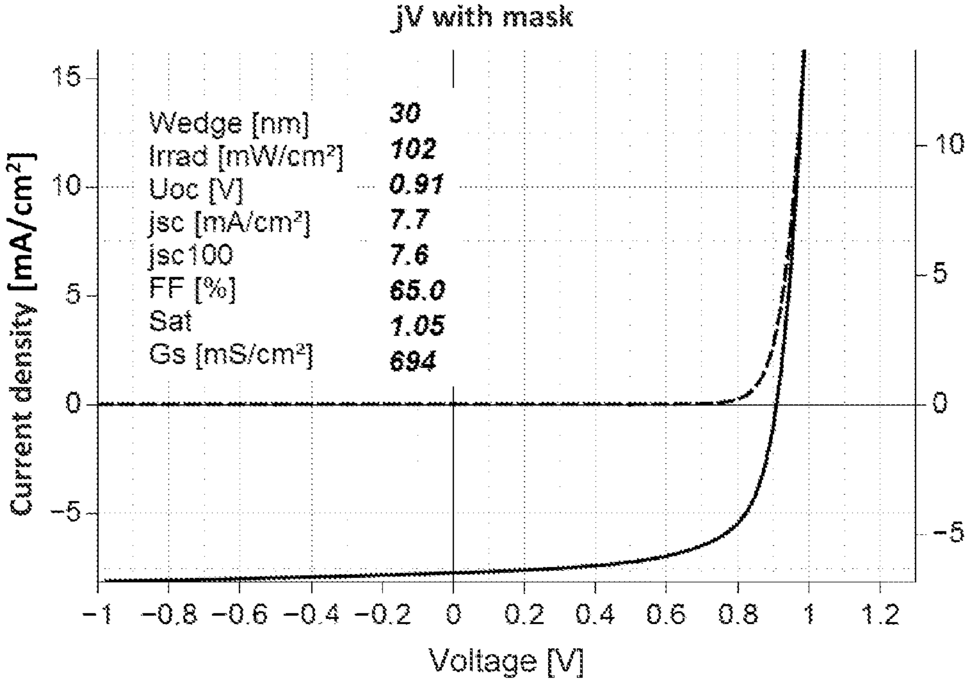
FIG. 13 shows a graphic representation of the current-voltage curve, the spectral external quantum efficiency and the fill factor of a BHJ cell with the compound (14), measured on an organic optoelectronic component.
Figure 13:
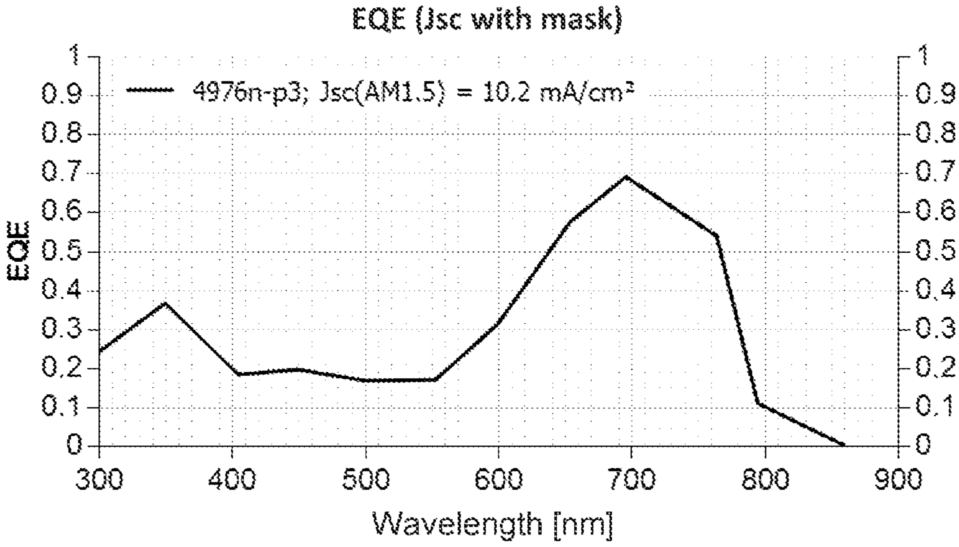

FIG. 13 shows a graphic representation of the current-voltage curve, the spectral external quantum efficiency and the fill factor of a BHJ cell with the compound (14), measured on an organic optoelectronic component. In this exemplary embodiment, the optoelectronic component is an organic solar cell.

The current-voltage curve of a BHJ cell having the following construction: ITO/C60 (15 nm)/compound(14): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (14), the fill factor FF is 65.0%, the open-circuit voltage Uoc is 0.91 V and the short-circuit current Jsc is 10.2 mA/cm2. The cell efficiency of an optoelectronic component of this kind, more particularly of a solar cell, with the compound (14) is 6.03%.

Figure 14:
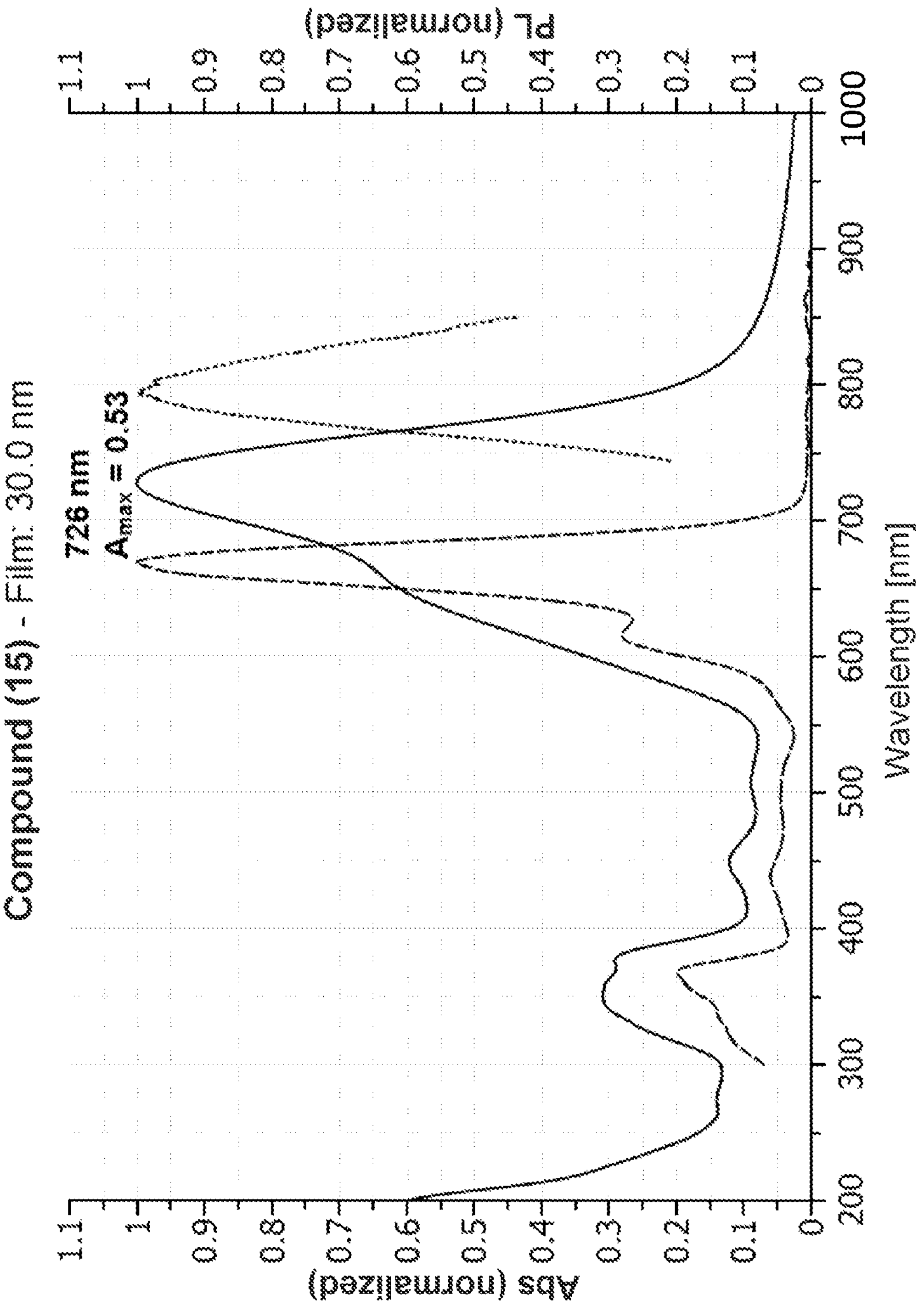
FIG. 14 shows a graphic representation of the absorption spectrum of the compound (15)

FIG. 14 shows a graphic representation of the absorption spectrum of the compound (15).

Figure 15:
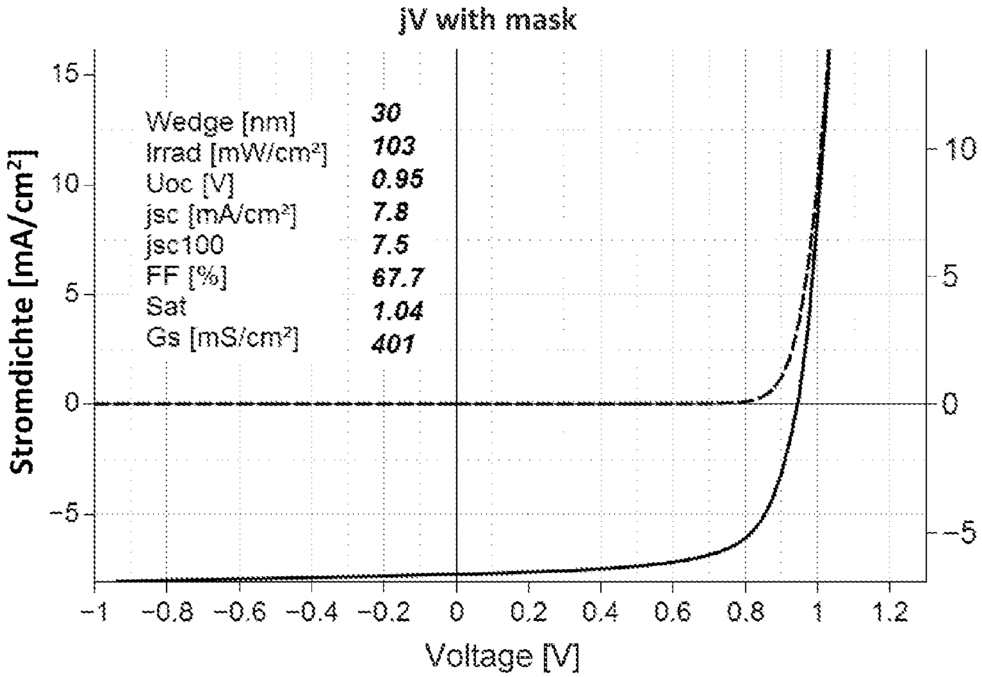
FIG. 15 shows a graphic representation of the current-voltage curve, the spectral external quantum efficiency and the fill factor of a BHJ cell with the compound (15), measured on an organic optoelectronic component.
Figure 15:
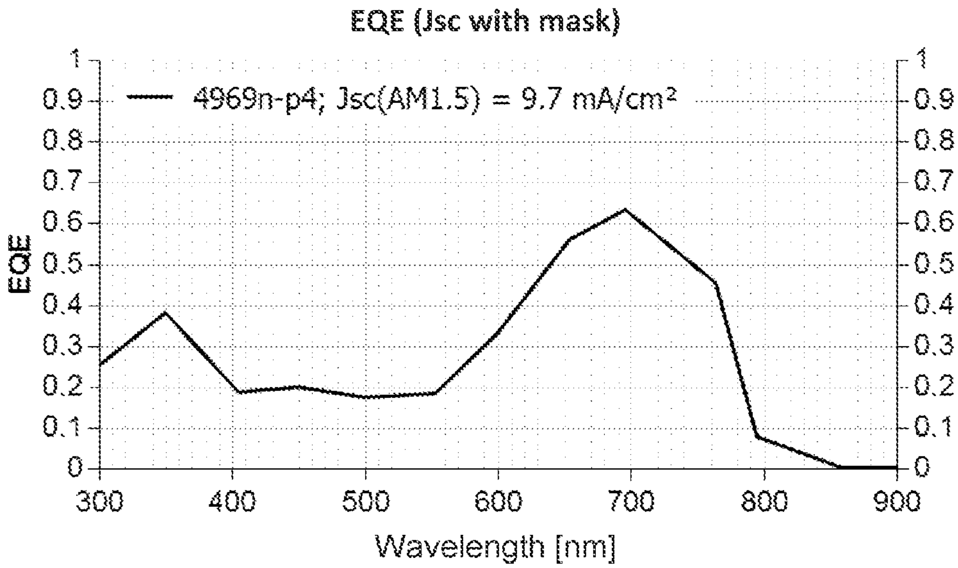

FIG. 15 shows a graphic representation of the current-voltage curve, the spectral external quantum efficiency and the fill factor of a BHJ cell with the compound (15), measured on an organic optoelectronic component. In this exemplary embodiment, the optoelectronic component is an organic solar cell.

The current-voltage curve of a BHJ cell having the following construction: ITO/C60 (15 nm)/compound(15): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (15), the fill factor FF is 67.7%, the open-circuit voltage Uoc is 0.95 V and the short-circuit current Jsc is 9.7 mA/cm2. The cell efficiency of an optoelectronic component of this kind, more particularly of a solar cell, with the compound (15) is 6.24%.

Figure 16:
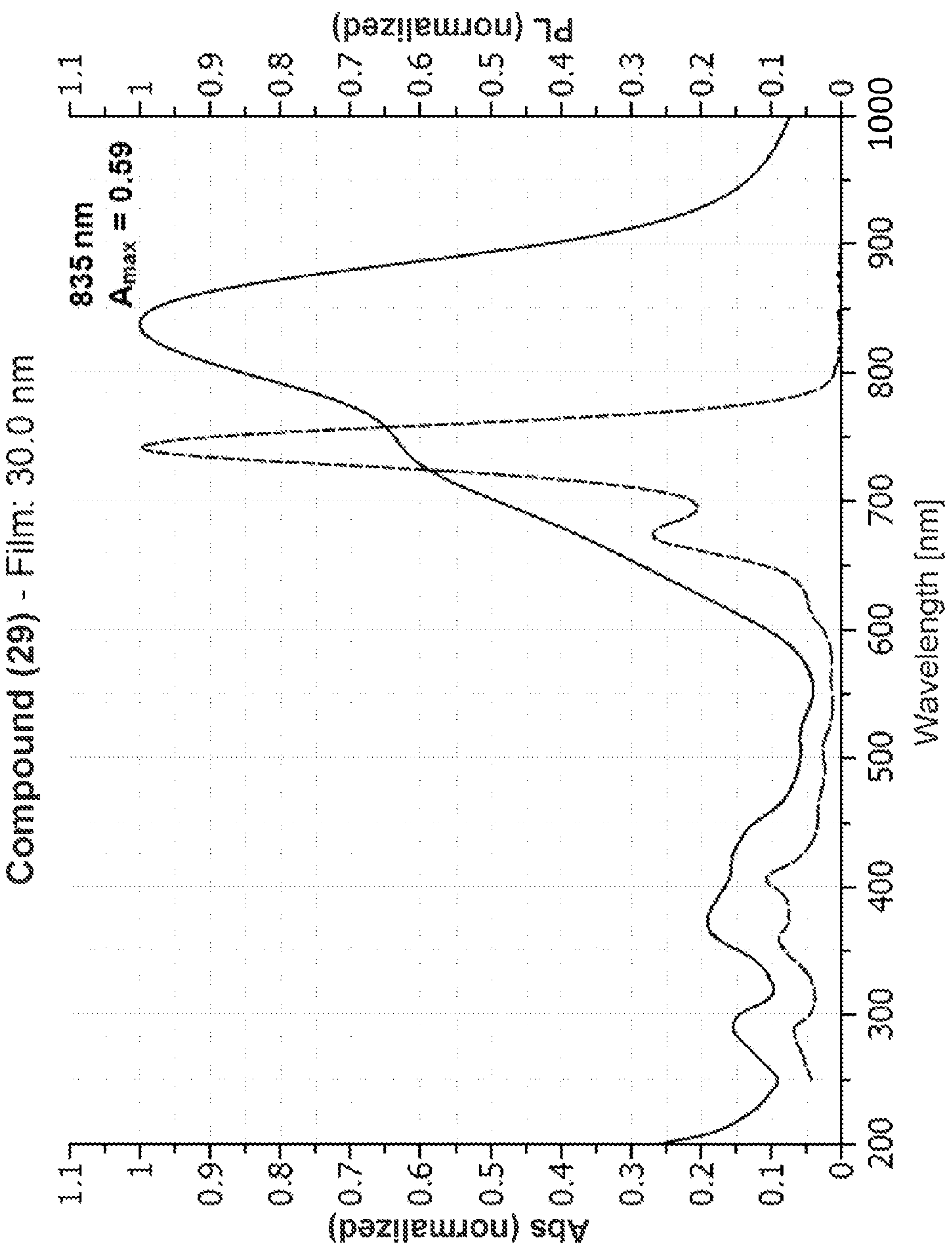
FIG. 16 shows a graphic representation of the absorption spectrum of the compound (29)

FIG. 16 shows a graphic representation of the absorption spectrum of the compound (29).

Figure 17:
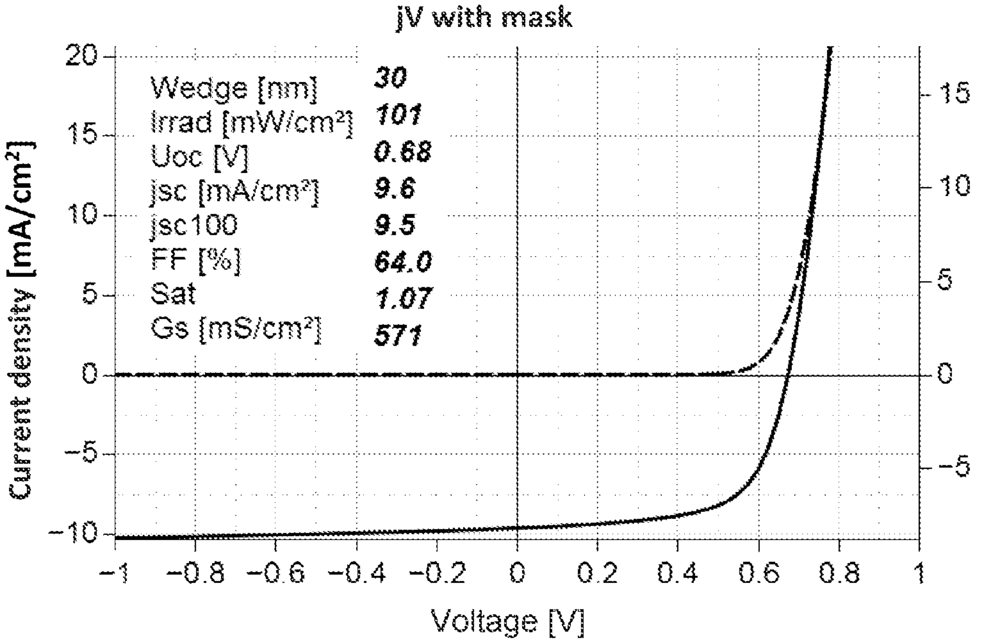
FIG. 17 shows a graphic representation of the current-voltage curve, the spectral external quantum efficiency and the fill factor of a BHJ cell with the compound (29), measured on an organic optoelectronic component.
Figure 17:
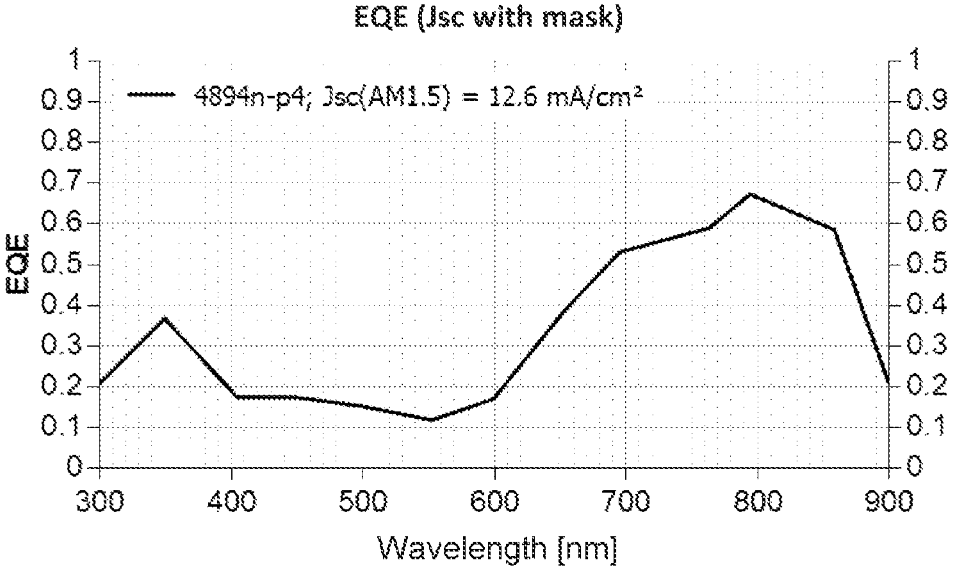

FIG. 17 shows a graphic representation of the current-voltage curve, the spectral external quantum efficiency and the fill factor of a BHJ cell with the compound (29), measured on an organic optoelectronic component. In this exemplary embodiment, the optoelectronic component is an organic solar cell.

The current-voltage curve of a BHJ cell having the following construction: ITO/C60 (15 nm)/compound(29): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (29), the fill factor FF is 64.0%, the open-circuit voltage Uoc is 0.68 V and the short-circuit current Jsc is 12.6 mA/cm2. The cell efficiency of an optoelectronic component of this kind, more particularly of a solar cell, with the compound (29) is 5.48%.

Figure 18:
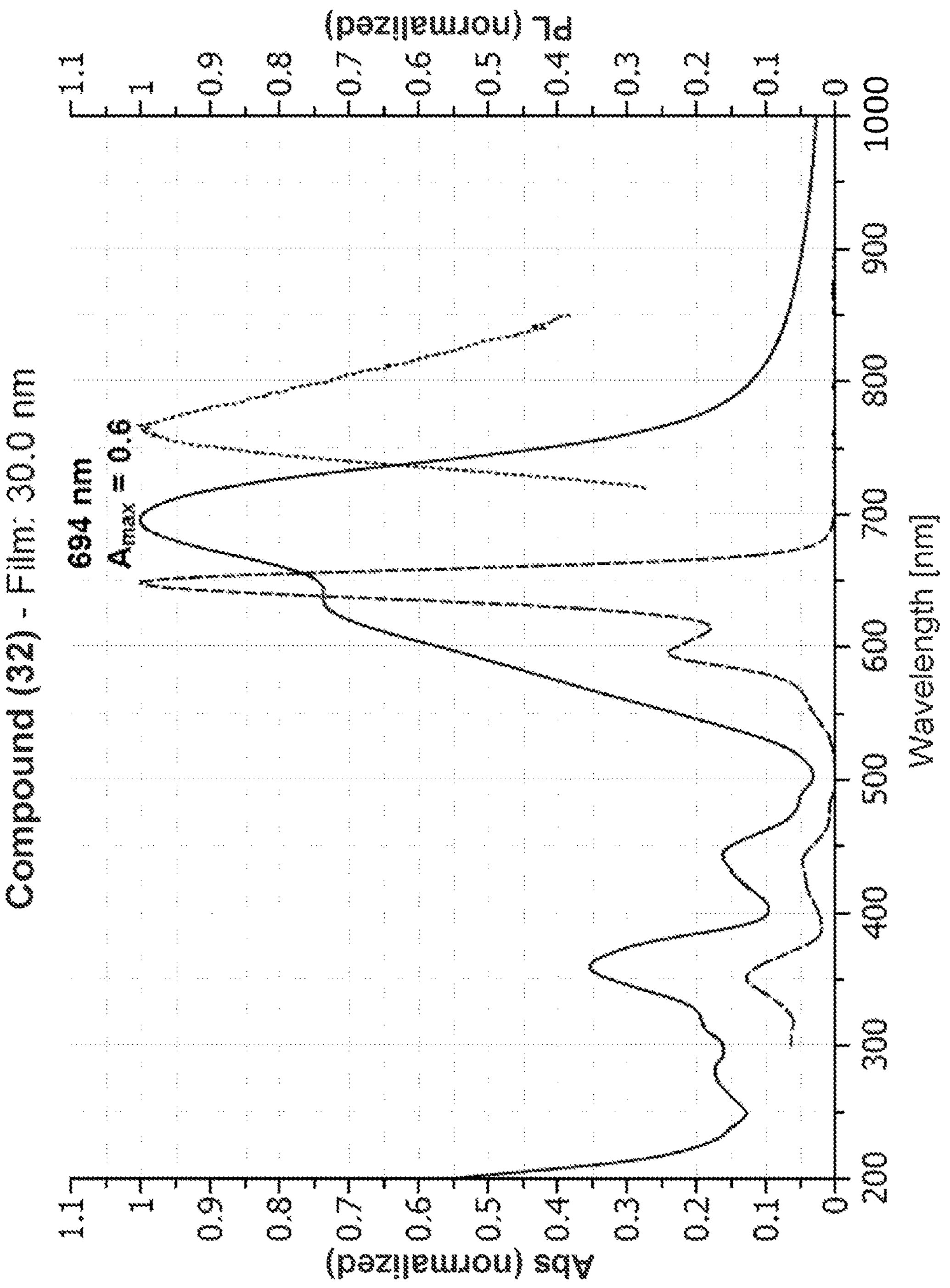
FIG. 18 shows a graphic representation of the absorption spectrum of the compound (32)

FIG. 18 shows a graphic representation of the absorption spectrum of the compound (32).

Figure 19:
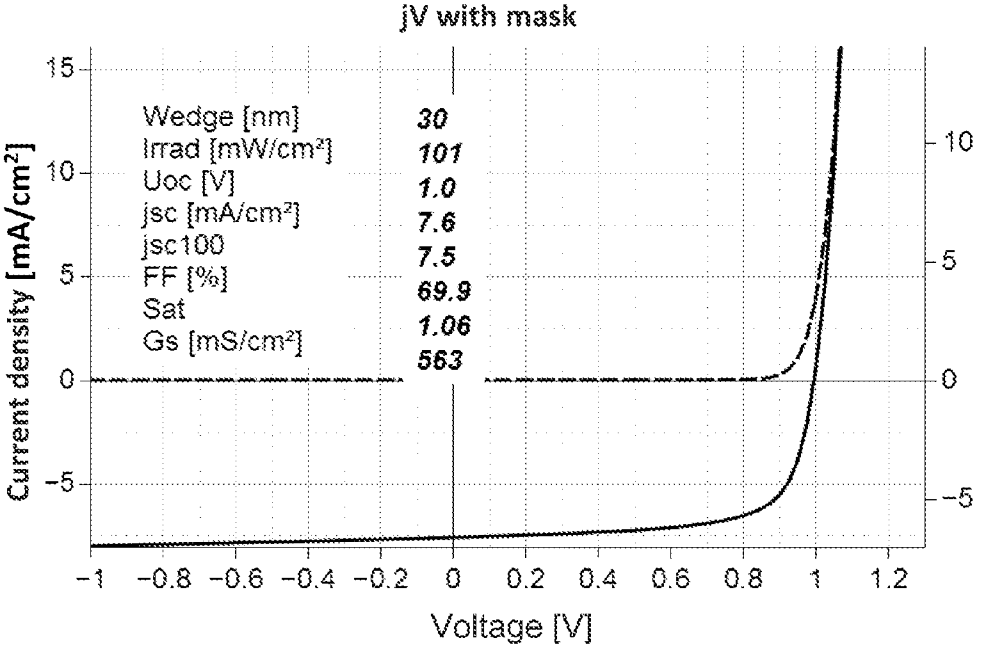
FIG. 19 shows a graphic representation of the current-voltage curve, the spectral external quantum efficiency and the fill factor of a BHJ cell with the compound (32), measured on an organic optoelectronic component.
Figure 19:
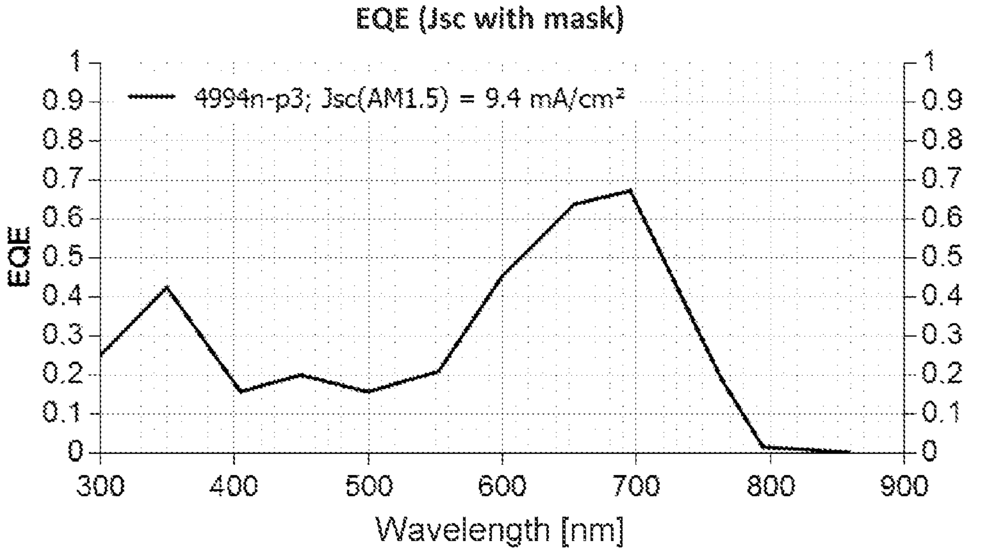

FIG. 19 shows a graphic representation of the current-voltage curve, the spectral external quantum efficiency and the fill factor of a BHJ cell with the compound (32), measured on an organic optoelectronic component. In this exemplary embodiment, the optoelectronic component is an organic solar cell.

The current-voltage curve of a BHJ cell having the following construction: ITO/C60 (15 nm)/compound(32): C60 (30 nm, 3:2, 90° C.)/BPAPF (10 nm)/BPAPF:NDP9 (45 nm, 10 wt % NDP9)/NDP9 (1 nm)/Au (50 nm) was determined, with the photoactive layer 4 comprising a bulk heterojunction (BHJ). In the optoelectronic component with compound (32), the fill factor FF is 69.9%, the open-circuit voltage Uoc is 1.0 V and the short-circuit current Jsc is 9.4 mA/cm2. The cell efficiency of an optoelectronic component of this kind, more particularly of a solar cell, with the compound (32) is 6.57%.

The advantageous properties of the compounds of the invention are apparent, for identical construction of the solar cells, in the parameters of open-circuit voltage Uoc, short-circuit current Jsc and fill factor FF as well. The compounds of the invention have not only improved absorption properties, but also suitable charge transport properties. The experimental data for the compounds (1), (3), (5), (8), (10), (14), (15), (29) and (32) with the absorption properties and the current-voltage profiles measured in organic solar cells demonstrate that these compounds are extremely suitable for application in organic solar cells and also other organic optoelectronic components.

Table 1 sets out the absorption maxima of the compounds (1) to (61) in solution and in a film.

| Compound | Absorption maximum [nm] in solution | Absorption maximum [nm] in a film | Melting point [°C] |
|---|---|---|---|
| 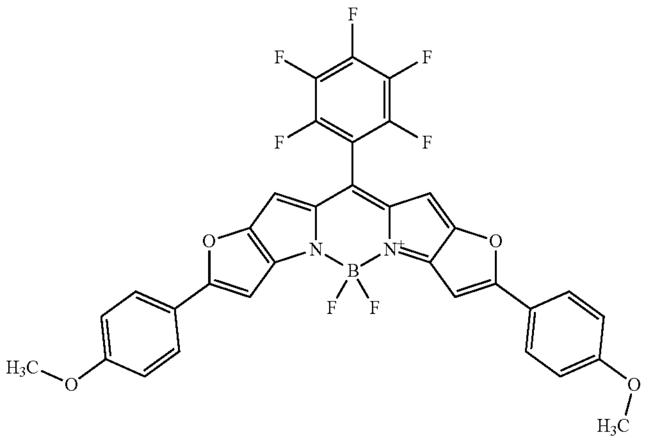 1 | 700 | 775 | 378 |
| 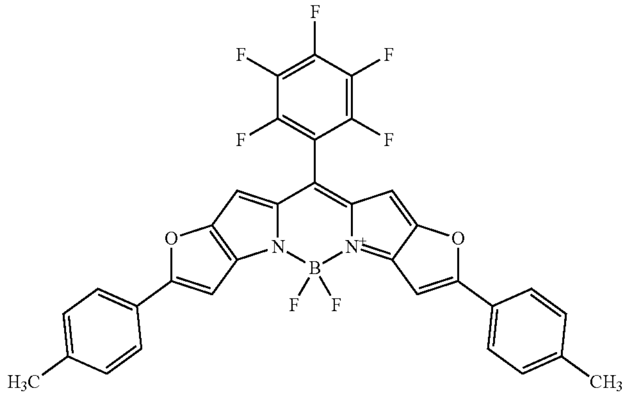 2 | 682 | 754 | |
| 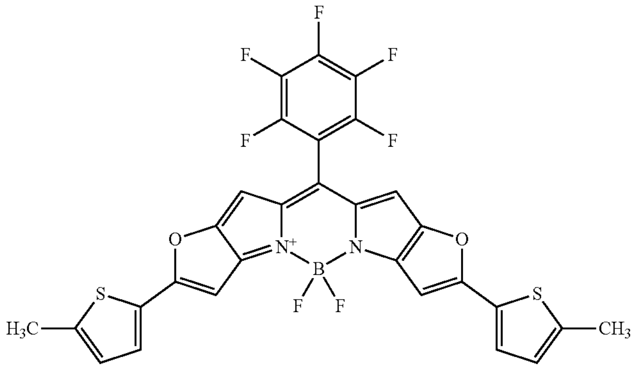 3 | 718 | 808 | |

-continued
| Compound | Absorption maximum [nm] in solution | Absorption maximum [nm] in a film | Melting point [°C] |
|---|---|---|---|
| 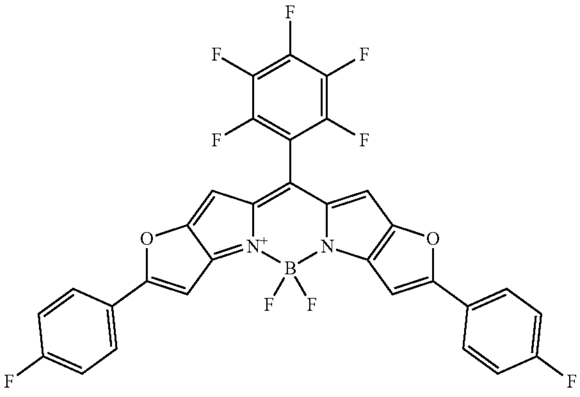 4 | 671 | 738 | 314 |
| 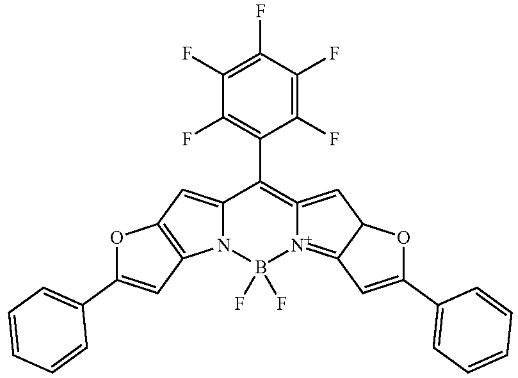 5 | 672 | 741 | 302 |
| 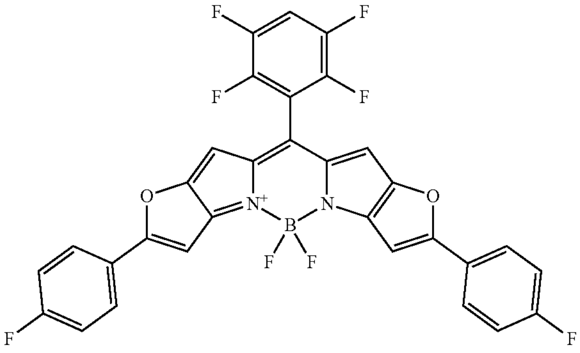 6 | 669 | 735 | 310 |

-continued
| Compound | Absorption maximum [nm] in solution | Absorption maximum [nm] in a film | Melting point [°C] |
|---|---|---|---|
| 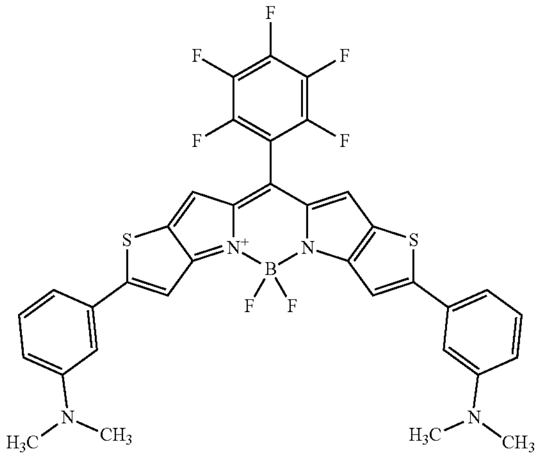 7 | 693 | 743 | |
| 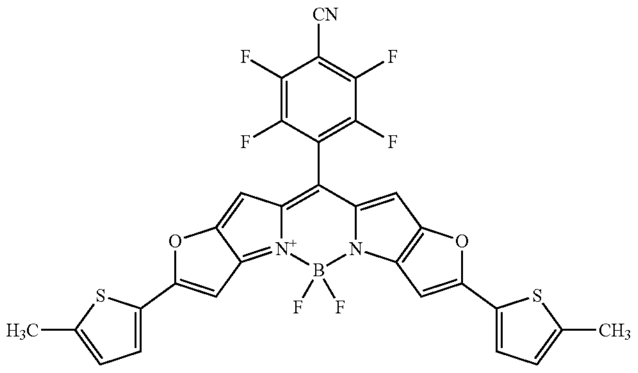 8 | 728 | 828 | |
| 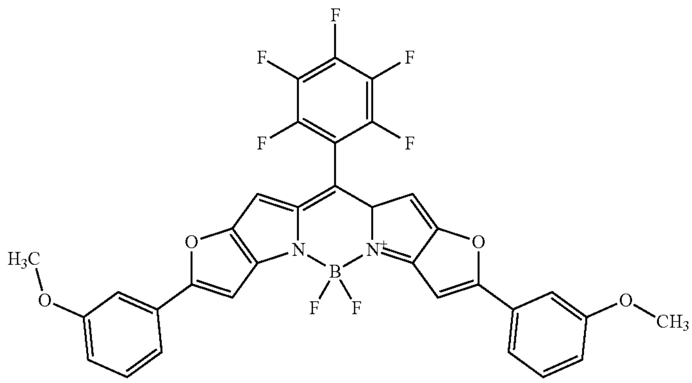 9 | 677 | 746 | 233 |

-continued
| Compound | Absorption maximum [nm] in solution | Absorption maximum [nm] in a film | Melting point [°C] |
|---|---|---|---|
| 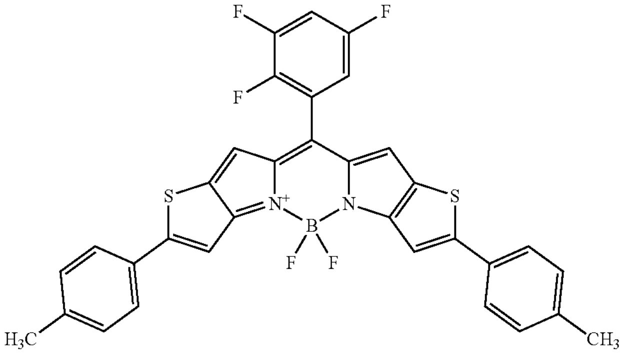 10 | 678 | 739 | 271 |
| 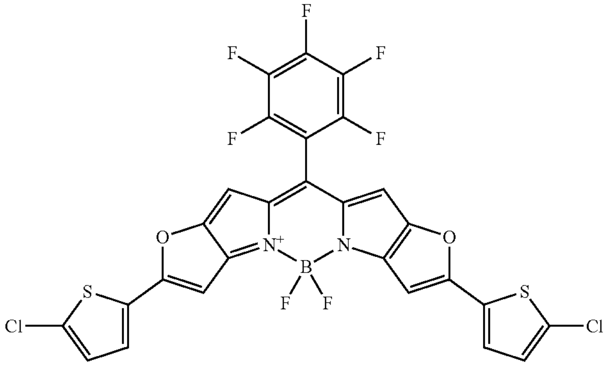 11 | 730 | 821 | |
| 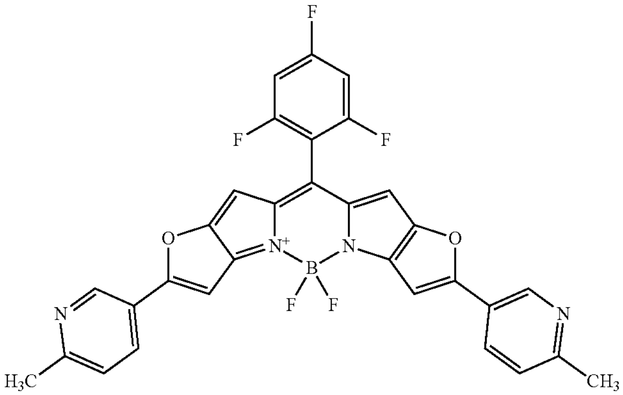 12 | 666 | 614 | |

-continued
| Compound | Absorption maximum [nm] in solution | Absorption maximum [nm] in a film | Melting point [°C] |
|---|---|---|---|
| 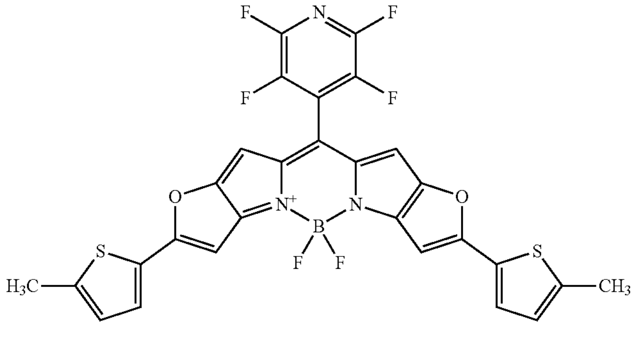 13 | 727 | 827 | 308 |
| 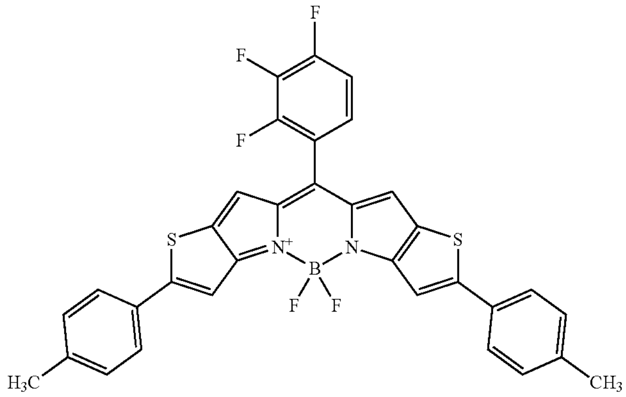 14 | 673 | 733 | 290 |
| 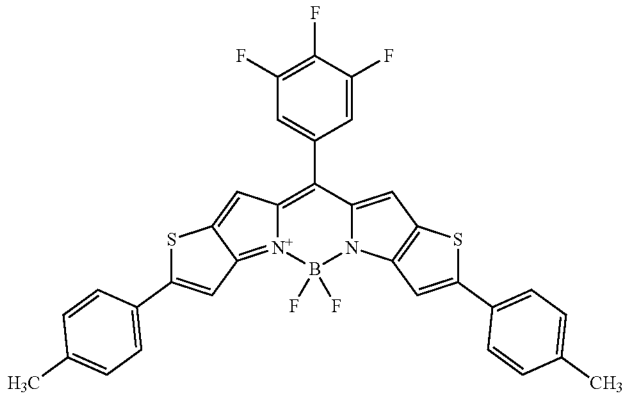 15 | 669 | 726 | 315 |

-continued
| Compound | Absorption maximum [nm] in solution | Absorption maximum [nm] in a film | Melting point [°C] |
|---|---|---|---|
| 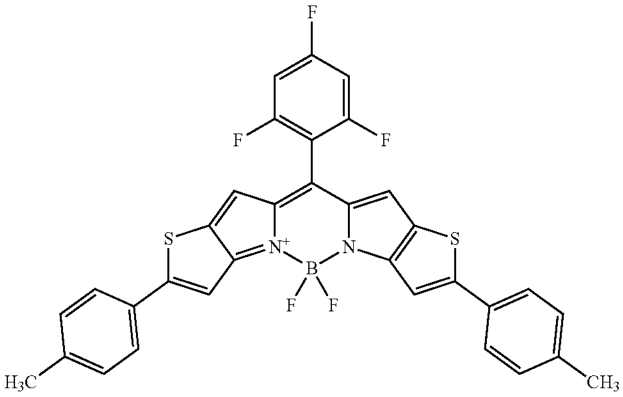 16 | 680 | 742 | 234 |
| 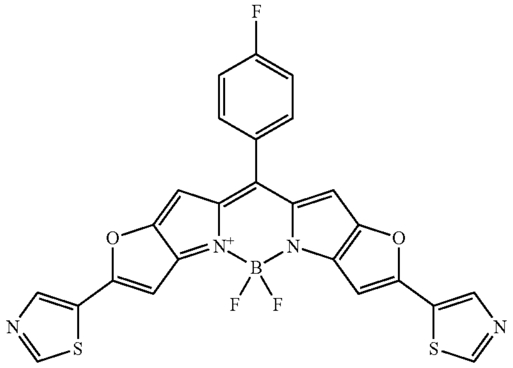 17 | | | |
| 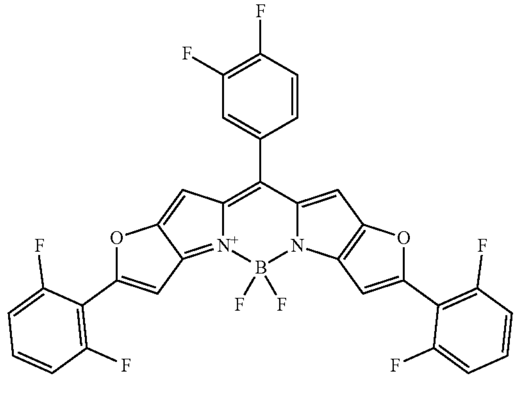 18 | | | |

-continued
| Compound | Absorption maximum [nm] in solution | Absorption maximum [nm] in a film | Melting point [°C] |
|---|---|---|---|
| 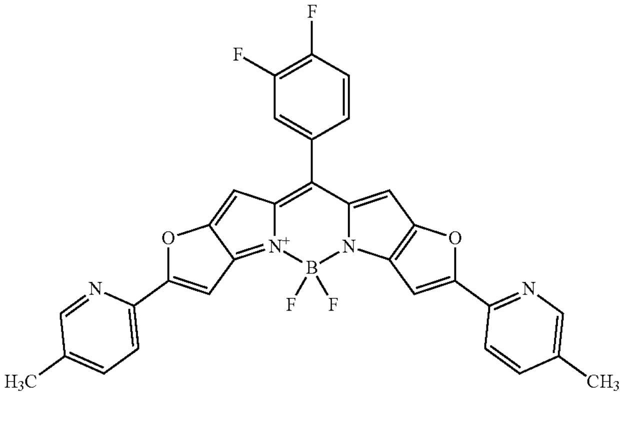 19 | 652 | 704 | 307 |
| 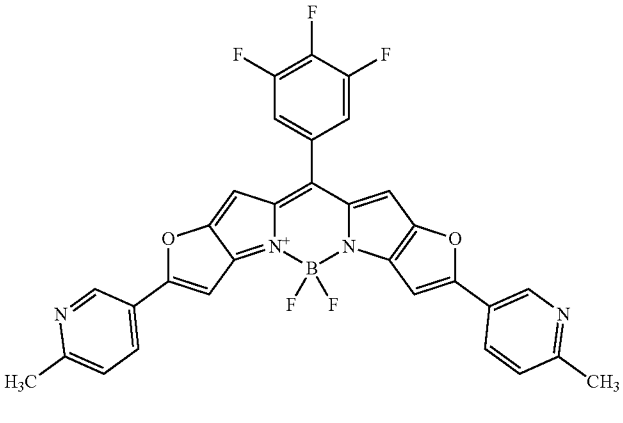 20 | | | |
| 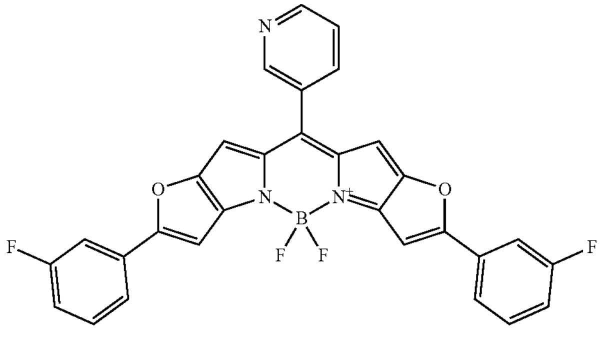 21 | | | |

-continued
| Compound | Absorption maximum [nm] in solution | Absorption maximum [nm] in a film | Melting point [°C] |
|---|---|---|---|
| 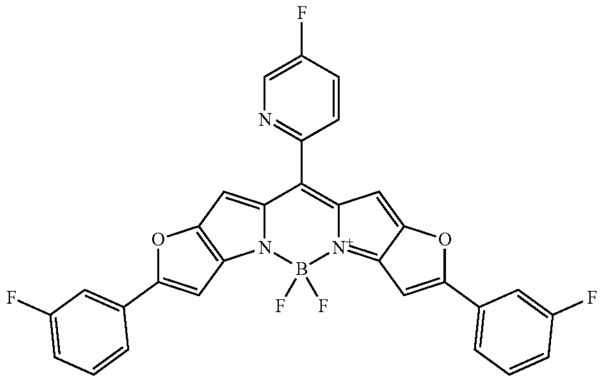 22 | | | |
| 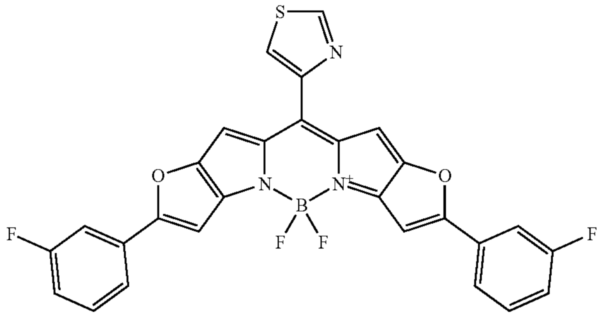 23 | | | |
| 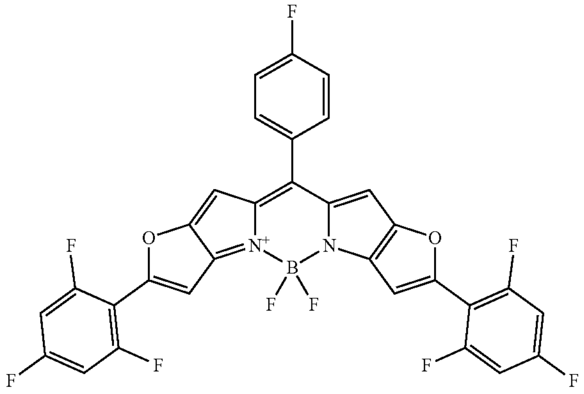 24 | | | |

-continued
| Compound | Absorption maximum [nm] in solution | Absorption maximum [nm] in a film | Melting point [°C] |
|---|---|---|---|
| 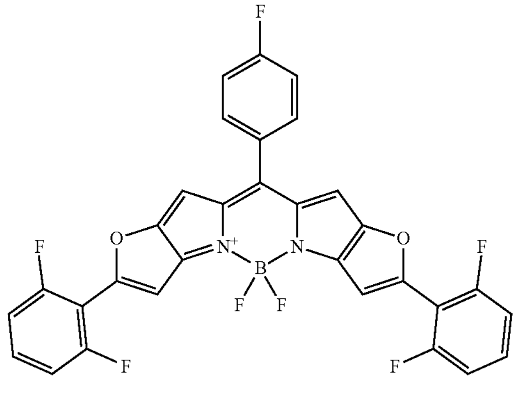 25 | | | |
| 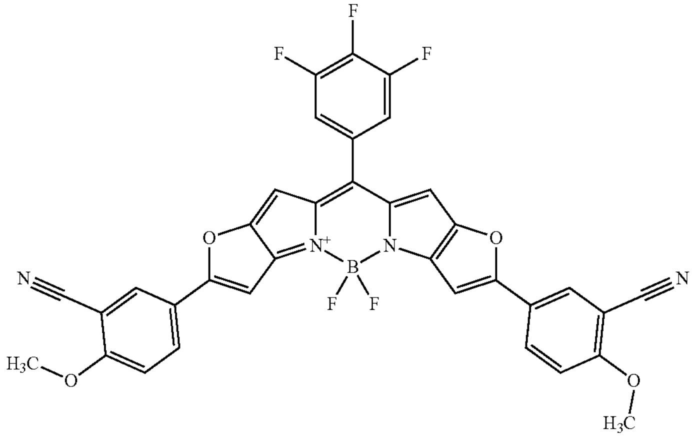 26 | 671 | 731 | 352 |
| 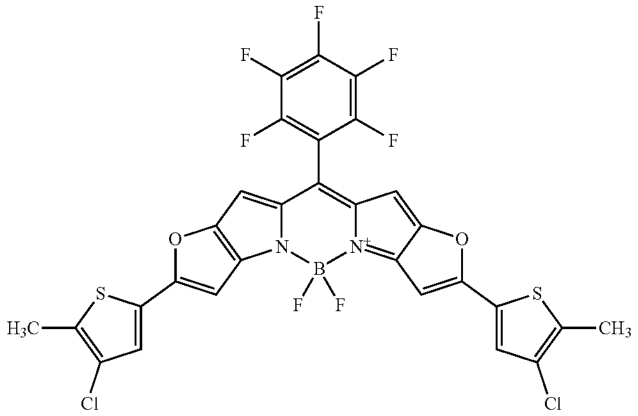 27 | 715 | 797 | 306 |

-continued
| Compound | Absorption maximum [nm] in solution | Absorption maximum [nm] in a film | Melting point [°C] |
|---|---|---|---|
| 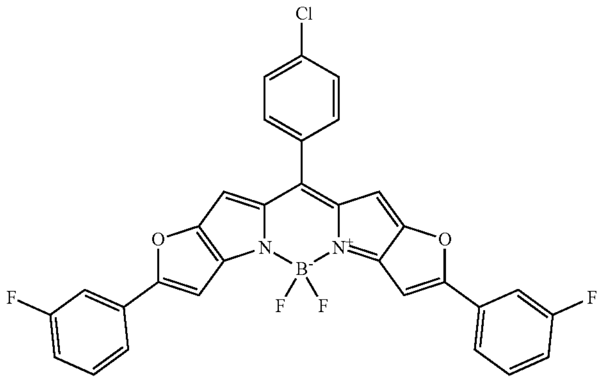 28 | 650 | 698 | 277 |
| 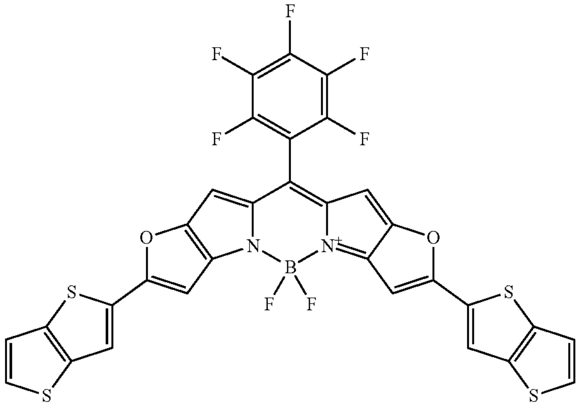 29 | 742 | 835 | |
| 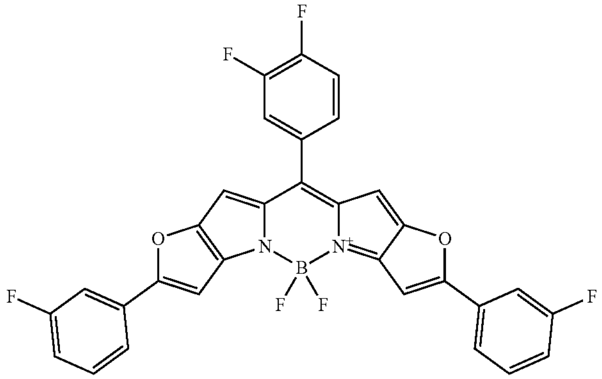 30 | 651 | 701 | 332 |

-continued
| Compound | Absorption maximum [nm] in solution | Absorption maximum [nm] in a film | Melting point [°C] |
|---|---|---|---|
| 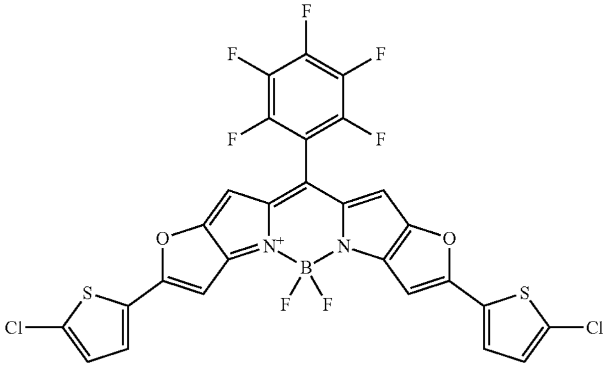 31 | 711 | 787 | 311 |
| 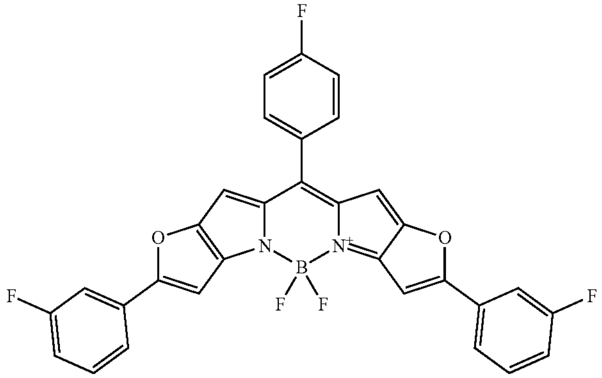 32 | 650 | 694 | 338 |
| 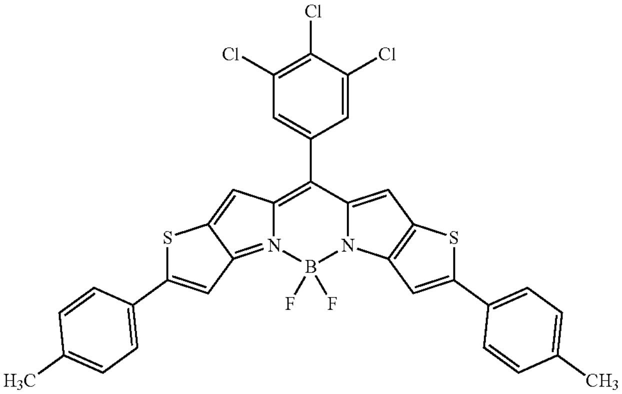 33 | 670 | 732 | 312 |

-continued
| Compound | Absorption maximum [nm] in solution | Absorption maximum [nm] in a film | Melting point [°C] |
|---|---|---|---|
| 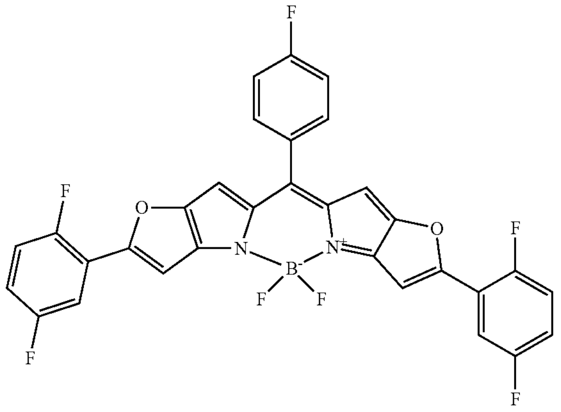 [SMILES: Fc1ccc(C2=C3C=c4oc(-c5cc(F)ccc5F)cc4=[N+]3[B-](F)(F)n3c2cc2oc(-c4cc(F)ccc4F)cc23)cc1] 34 | 648 | 700 | 318 |
| 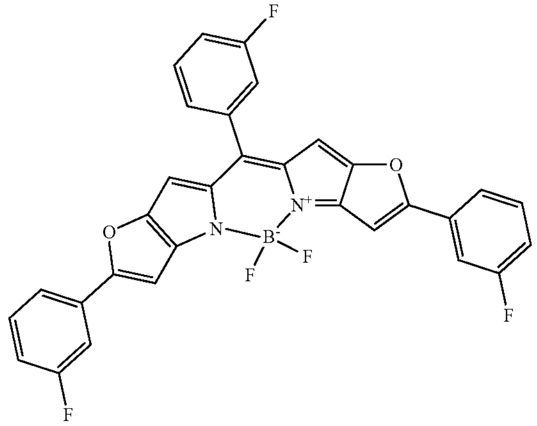 [SMILES: Fc1cccc(C2=C3C=c4oc(-c5cccc(F)c5)cc4=[N+]3[B-](F)(F)n3c2cc2oc(-c4cccc(F)c4)cc23)c1] 35 | 651 | 702 | 329 |
| 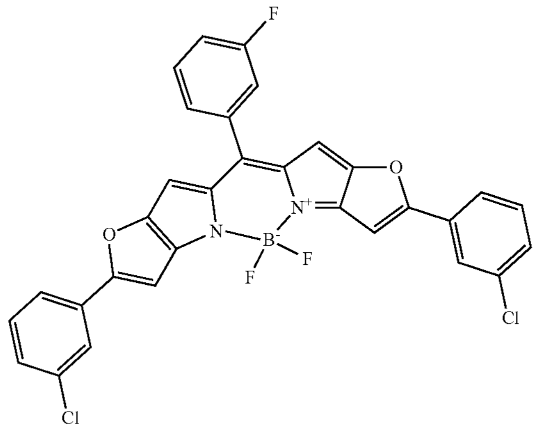 [SMILES: Fc1cccc(C2=C3C=c4oc(-c5cccc(Cl)c5)cc4=[N+]3[B-](F)(F)n3c2cc2oc(-c4cccc(Cl)c4)cc23)c1] 36 | 652 | 702 | 303 |

-continued
| Compound | Absorption maximum [nm] in solution | Absorption maximum [nm] in a film | Melting point [°C] |
|---|---|---|---|
| 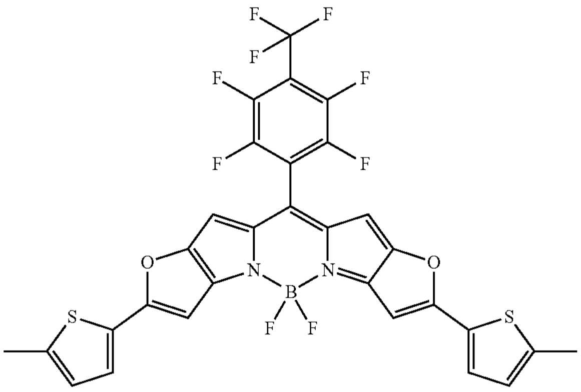 37 | 724 | 816 | 299 |
| 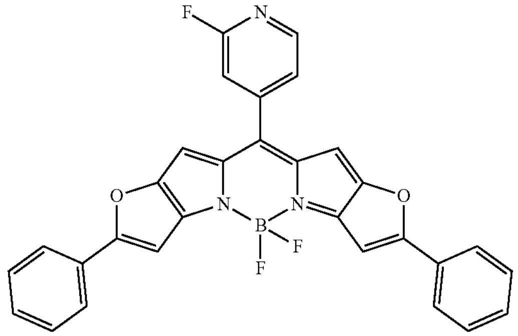 38 | 660 | 720 | 303 |
| 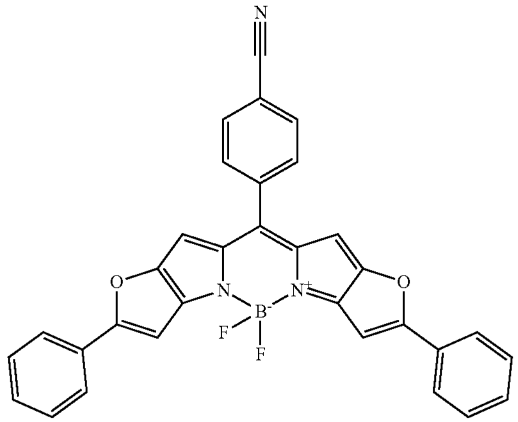 [SMILES: N#Cc1ccc(C2=C3C=c4oc(-c5ccccc5)cc4=[N+]3[B-](F)(F)n3c2cc2oc(-c4ccccc4)cc23)cc1] 39 | 659 | 713 | 310 |

-continued
| Compound | Absorption maximum [nm] in solution | Absorption maximum [nm] in a film | Melting point [°C] |
| --- | --- | --- | --- |
| 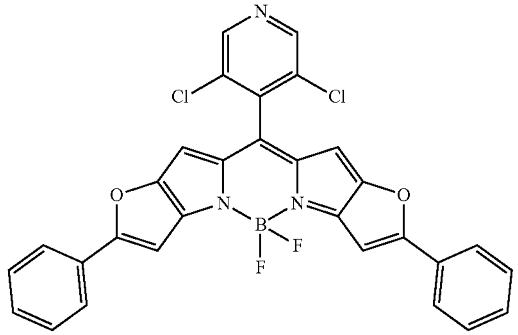 | 670 | 743 | |
| 40<br>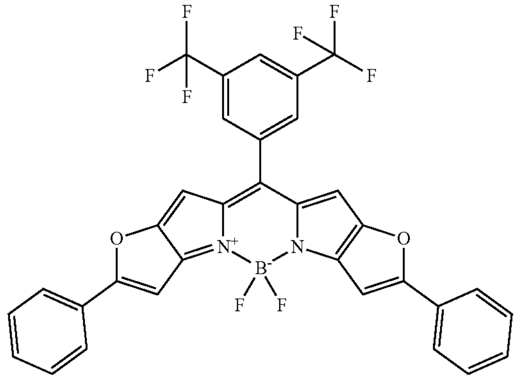 [SMILES: F[B-]1(F)n2c(cc3oc(-c4ccccc4)cc32)C(c2cc(C(F)(F)F)cc(C(F)(F)F)c2)=C2C=c3oc(-c4ccccc4)cc3=[N+]21] | 660 | 707 | 323 |
| 41<br>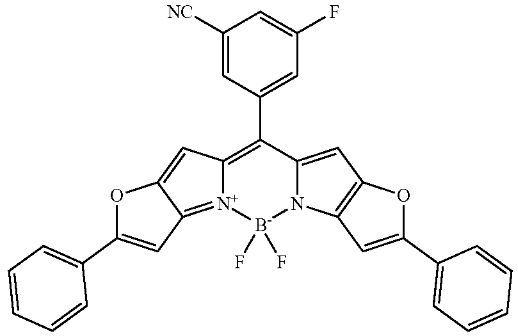 [SMILES: N#Cc1cc(F)cc(C2=C3C=c4oc(-c5ccccc5)cc4=[N+]3[B-](F)(F)n3c2cc2oc(-c4ccccc4)cc23)c1] | 661 | 717 | 306 |
| 42<br>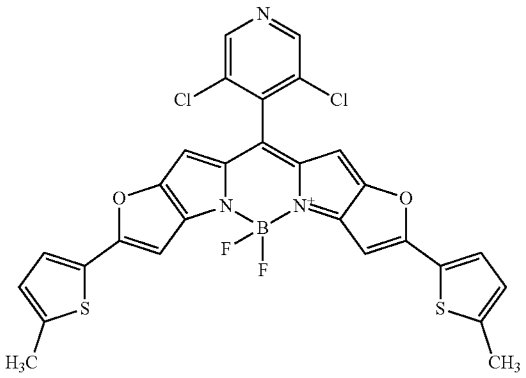 | 715 | 815 | |

-continued
| Compound | Absorption maximum [nm] in solution | Absorption maximum [nm] in a film | Melting point [°C] |
|---|---|---|---|
| 43<br>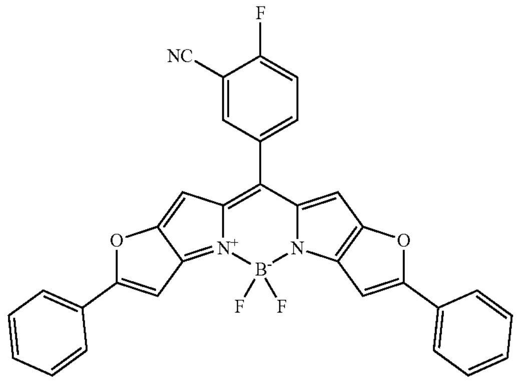 [SMILES: N#Cc1cc(C2=C3C=c4oc(-c5ccccc5)cc4=[N+]3[B-](F)(F)n3c2cc2oc(-c4ccccc4)cc23)ccc1F] | 659 | 711 | 297 |
| 44<br>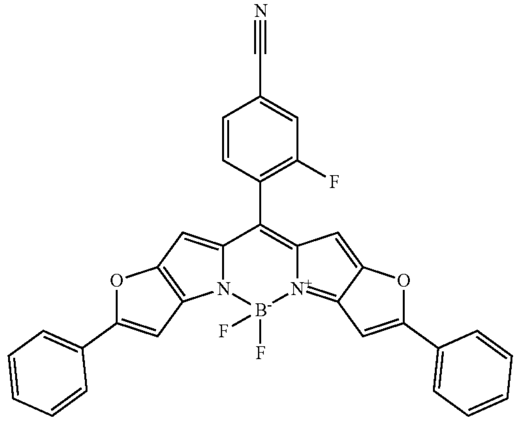 [SMILES: N#Cc1ccc(C2=C3C=c4oc(-c5ccccc5)cc4=[N+]3[B-](F)(F)n3c2cc2oc(-c4ccccc4)cc23)c(F)c1] | 665 | 726 | 316 |
| 45<br>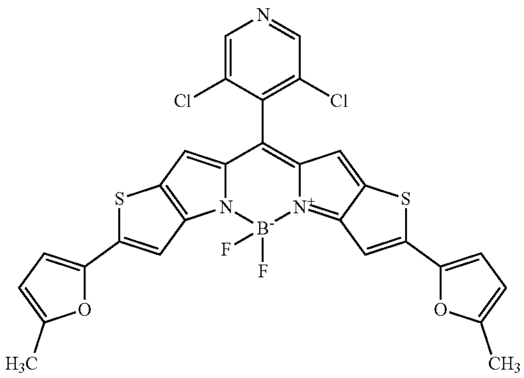 | 731 | 823 | 349 |
46

-continued
| Compound | Absorption maximum [nm] in solution | Absorption maximum [nm] in a film | Melting point [°C] |
|---|---|---|---|
| 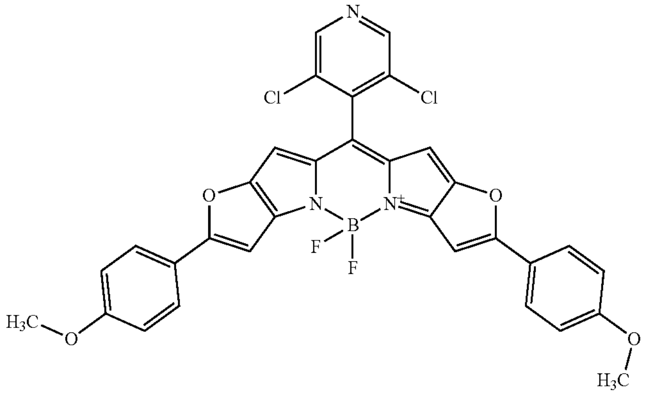 47 | 697 | 776 | 334 |
| 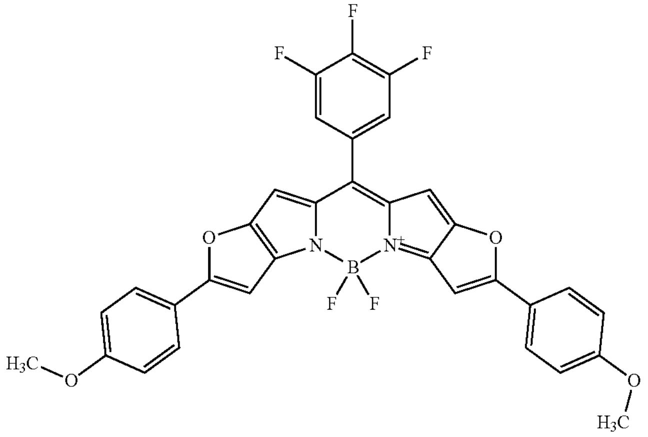 48 | | 750 | 298 |
| 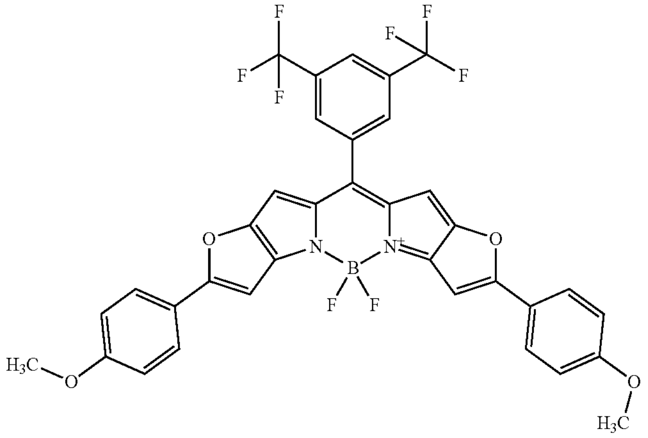 49 | | 738 | 301 |

-continued
| Compound | Absorption maximum [nm] in solution | Absorption maximum [nm] in a film | Melting point [°C] |
|---|---|---|---|
| 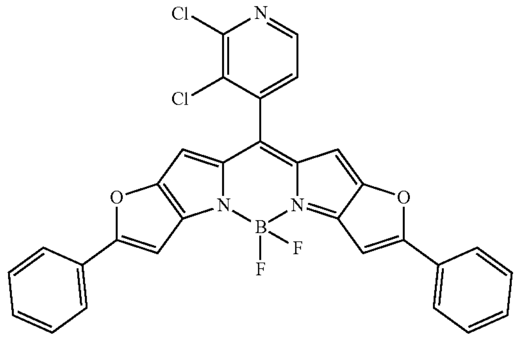 50 | 665 | 729 | 364 |
| 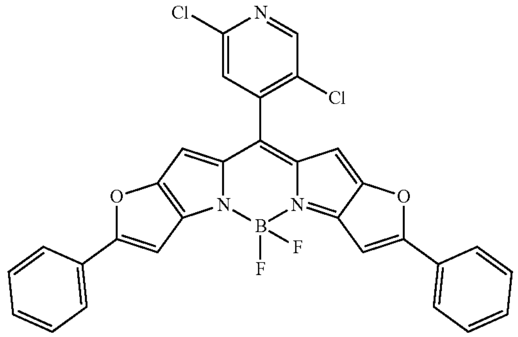 51 | 667 | 731 | 348 |
| 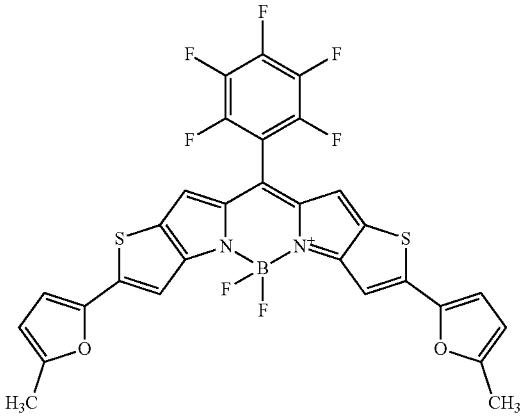 52 | 735 | 832 | 306 |

-continued
| Compound | Absorption maximum [nm] in solution | Absorption maximum [nm] in a film | Melting point [°C] |
|---|---|---|---|
| 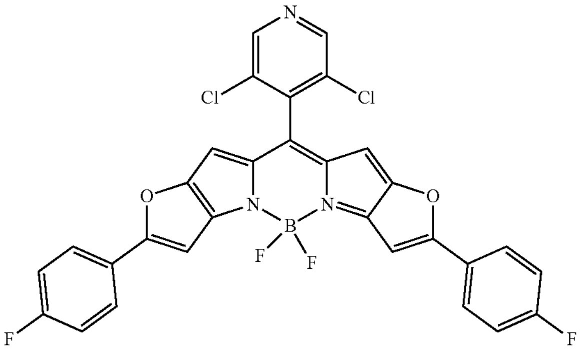 53 | 668 | 742 | 397 |
| 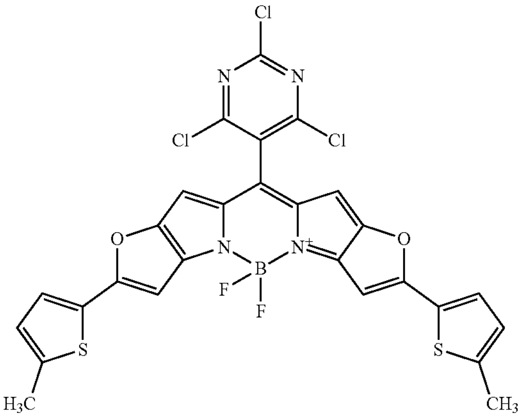 54 | 725 | 821 | 307 |
| 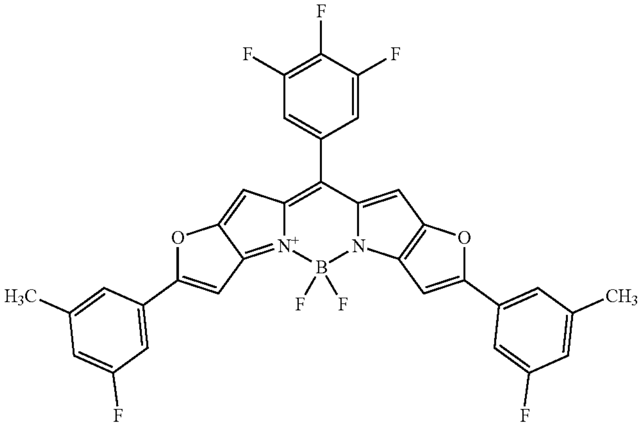 55 | 659 | 707 | 324 |

-continued
| Compound | Absorption maximum [nm] in solution | Absorption maximum [nm] in a film | Melting point [°C] |
|---|---|---|---|
| 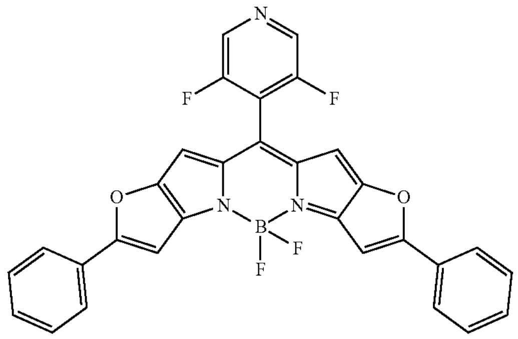 56 | 671 | 744 | 371 |
| 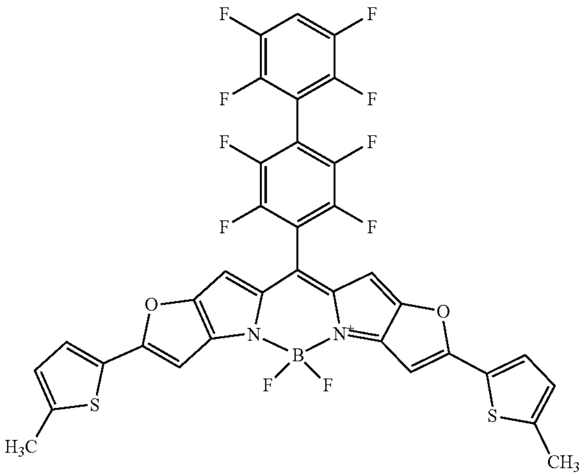 57 | 718 | 808 | 314 |
| 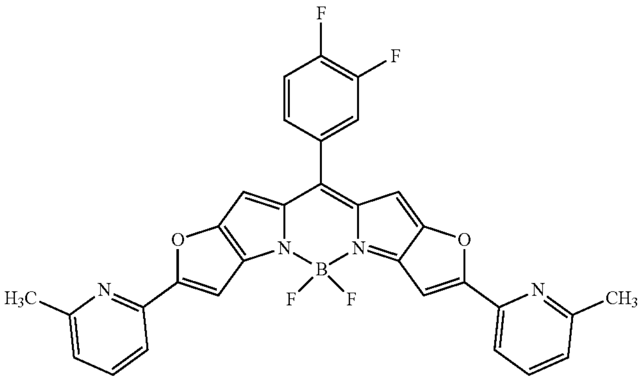 58 | 652 | 704 | 304 |

-continued

| Compound | Absorption maximum [nm] in solution | Absorption maximum [nm] in a film | Melting point [°C] |
|---|---|---|---|
| 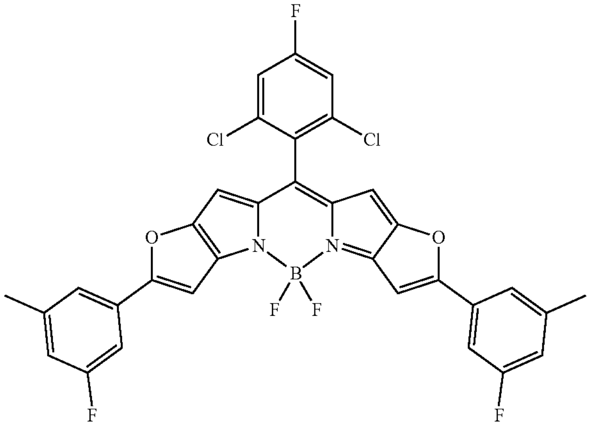 59 | 667 | 738 | 350 |
| 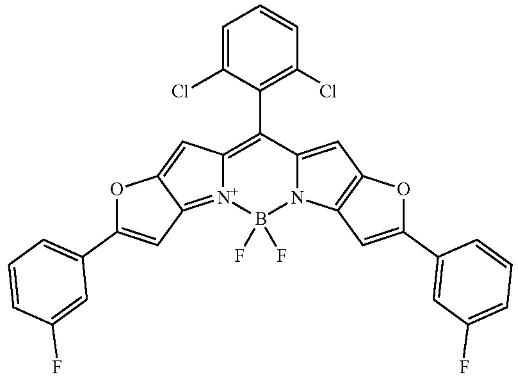 60 | 661 | | 314 |
| 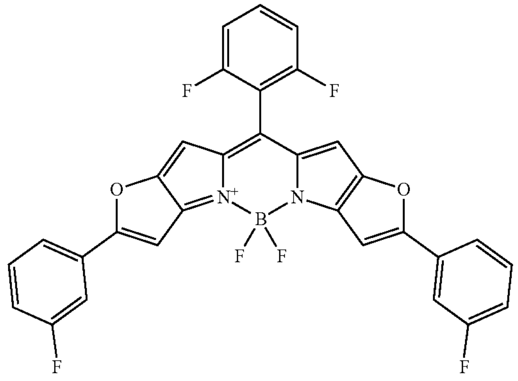 61 | 661 | | 295 |

Table 1

The optical properties were determined experimentally. The absorption maxima λmax were determined in a cuvette with dichloromethane and from vacuum vapor deposition layers 30 nm thick on fused silica, using a photometer. Surprisingly it was found that the compounds (1) to (32) in a film exhibit particularly broad absorption in the near-infrared range, above 650 nm, which is no longer visible to the human eye. It was possible, moreover, to show that the compounds (1) to (32) have a high thermal stability and can be evaporated under vacuum without decomposition. Table 1 additionally sets out the melting temperatures DSC. Table 2 shows the photovoltaic parameters of Voc, Jsc and FF parameters for the compounds (1) to (32) of the invention in direct comparison. The construction of the cells is as follows: glass with ITO/C60 (15 nm)/absorber:C60 (30 nm, 3:2, 90° C.)/BPAPF (10 nm)/BPAPF:NDP9 (45 nm, 10 wt % NDP9)/NDP9 (1 nm)/Au (50 nm), with measurement taking place under AM1.5 illumination (AM=air mass; AM=1.5 with this spectrum the overall radiant power is 1000 W/$m^2$; AM=1.5 as standard value for the measurement of solar modules).

TABLE 2

| Compound | Voc [V] | Jsc [mA/$cm^2$] | FF [%] | Eff [%] |
|---|---|---|---|---|
| (1) | 0.71 | 10.2 | 69.7 | 5.05 |
| (2) | 0.87 | 9.6 | 70.3 | 5.87 |
| (3) | 0.69 | 11.4 | 73.4 | 5.77 |
| (5) | 0.95 | 9.4 | 71.7 | 6.40 |
| (8) | 0.72 | 11.0 | 70.4 | 5.58 |
| (10) | 0.90 | 9.6 | 67.6 | 5.84 |
| (13) | 0.74 | 12.0 | 70.0 | 6.22 |
| (14) | 0.91 | 10.2 | 65.0 | 6.03 |
| (15) | 0.95 | 9.7 | 67.7 | 6.24 |
| (29) | 0.68 | 12.6 | 64.0 | 5.48 |
| (32) | 1.0 | 9.4 | 69.9 | 6.57 |
| (37) | 0.70 | 11.7 | 67.5 | 5.53 |
| (38) | 0.97 | 9.6 | 67.3 | 6.27 |
| (41) | 0.98 | 8.5 | 69.3 | 5.77 |
| (43) | 0.72 | 11.0 | 62.4 | 4.94 |
| (45) | 0.97 | 8.8 | 63.5 | 5.42 |
| (47) | 0.76 | 10.3 | 63.8 | 4.99 |
| (48) | 0.76 | 10.5 | 69.8 | 5.57 |
| (49) | 0.76 | 10.3 | 73.1 | 5.73 |
| (54) | 0.79 | 11.3 | 63.6 | 5.68 |

The experimental data for compounds of the invention, with the absorption properties of the compounds and the current-voltage profiles measured in organic solar cells, demonstrate that the compounds of the invention are extremely suitable for application in organic solar cells and also other organic optoelectronic components.

The invention claimed is:

1. A chemical compound according to the general formula I,

I

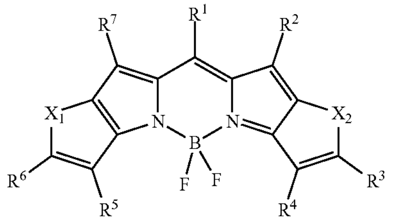

wherein X1 and X2 independently of one another are O, S or N—R8, with R8 selected from the group consisting of H, alkyl, aryl, and heteroaryl, R1 is a substituted homocyclic 6-membered ring, wherein at least one H atom is substituted by an electron-withdrawing substituent selected from the group consisting of a halogen, CN, CF3, and COR14, with R14 being C1-C4 alkyl, or is a substituted or unsubstituted heterocyclic 5-membered ring or 6-membered ring, wherein the heterocyclic 5-membered ring or 6-membered ring has at least one sp2-hybridized N atom with a free electron pair and/or has at least one heteroatom selected from O, S, or N, wherein in the substituted heterocyclic 5-membered ring or 6-membered ring at least one H atom is substituted by an electron-withdrawing substituent selected from the group consisting of a halogen, CN, CF3, and COR9, with R9 being C1-C4 alkyl, wherein R2 and R7 independently of one another are selected from the group consisting of H, halogen, CN, alkyl, fluorinated or partly-fluorinated alkyl, unsaturated alkyl, and aryl, R4 and R5 independently of one another are selected from the group consisting of H, halogen, CN, alkyl, fluorinated or partly-fluorinated alkyl, unsaturated alkyl, and alkoxy, and R3 and R6 independently of one another are a substituted or unsubstituted homocyclic 6-membered ring or a substituted or unsubstituted heterocyclic 5-membered ring or 6-membered ring; and, optionally, wherein R3 and R4 and/or R5 and R6 in each case together form a heterocyclic 5-membered ring or 6-membered ring having at least one heteroatom selected from O, S or N.

2. The chemical compound of claim 1, wherein X1 and X2 are S or X1 and X2 are O, and/or where at least one H atom in the homocyclic 6-membered ring and/or in the heterocyclic 5-membered ring or 6-membered ring R1 is substituted by F or CF3.

3. The chemical compound of claim 1, wherein R3 and R4 and/or R5 and R6 in each case together form a heterocyclic 5-membered ring or 6-membered ring having at least one heteroatom selected from O, S or N.

4. The chemical compound of claim 1, wherein R1 is a homocyclic 6-membered ring with the condition that R1 is $C_6H_nF_{5-n}$, where n=0, 1, 2, 3, 4.

5. The chemical compound of claim 1, wherein R1 is selected from the group consisting of

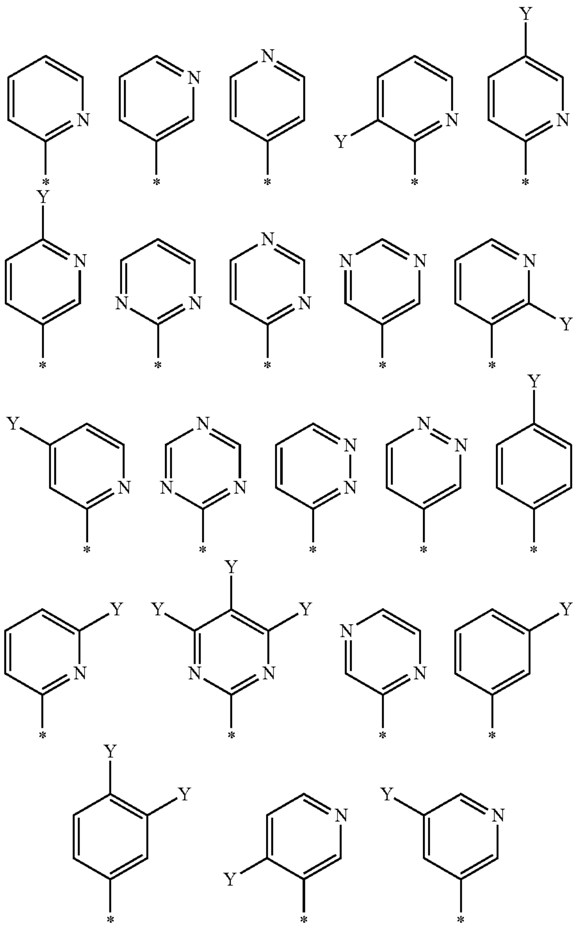

-continued
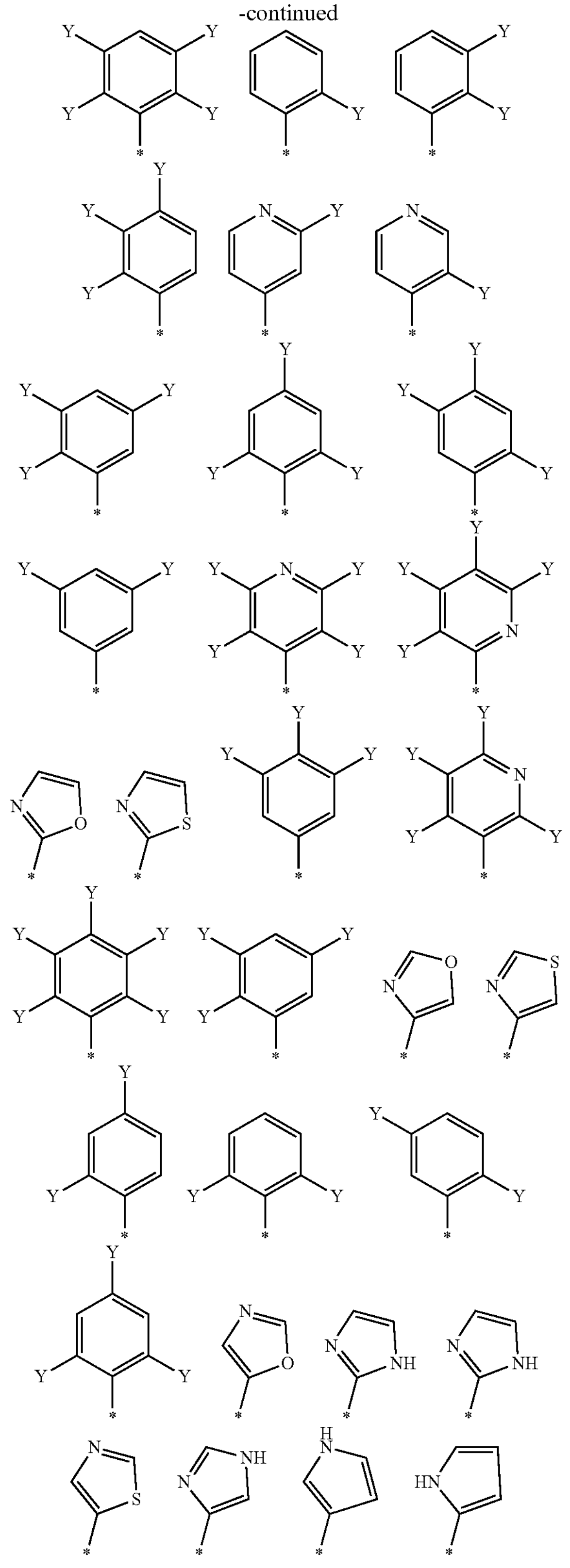
where * denotes the attachment to the compound of the general formula I, where Y independently at each occurrence is selected from the group consisting of Cl, CN, F, and CF3, and where H atoms are substituted or unsubstituted.
6. The chemical compound of claim 1, wherein R3 and R6 independently of one another are selected from the group consisting of
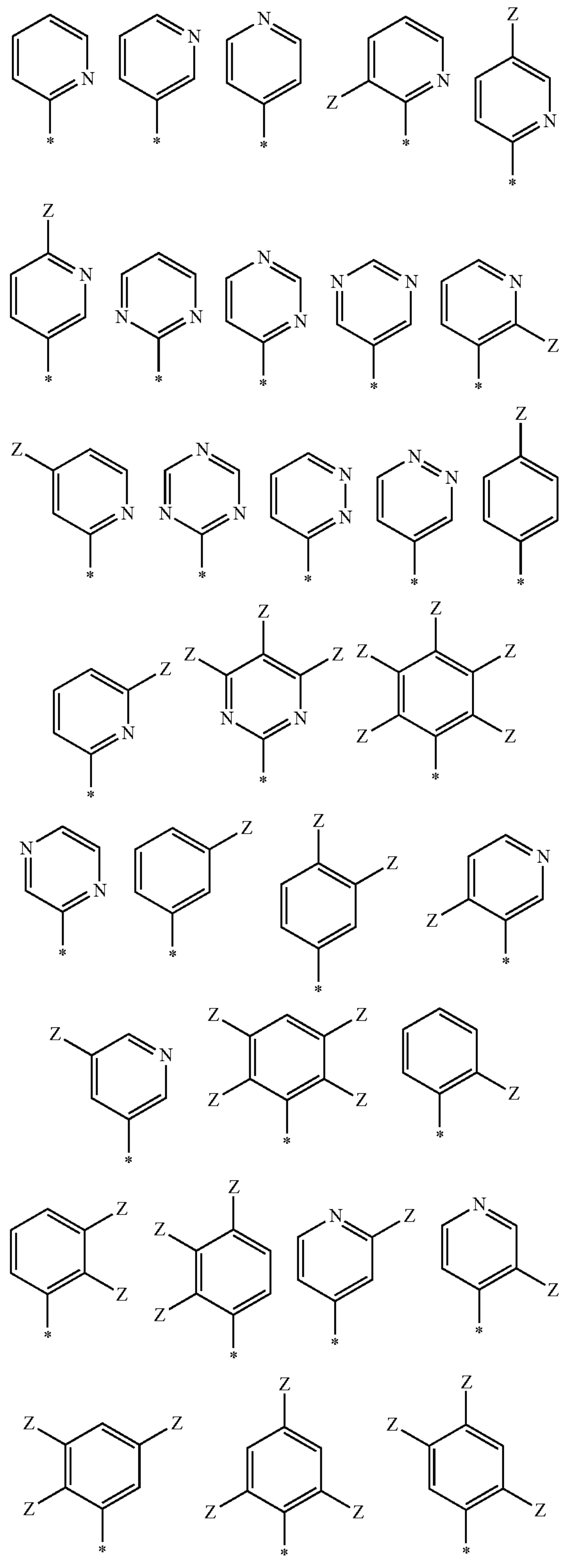

-continued

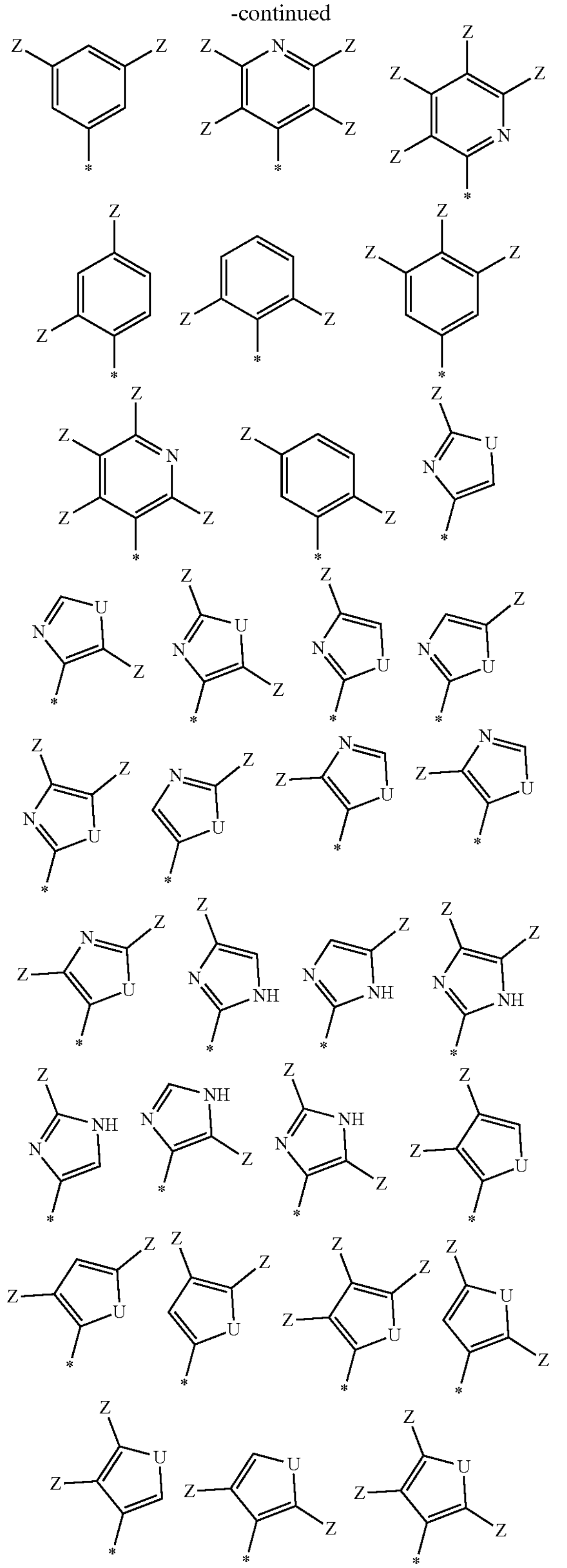

wherein * denotes the attachment to the compound of the general formula I, wherein U is selected from the group consisting of O, S, and NR19, and wherein R19 is selected from the group consisting of H, halogen, alkyl, fluorinated alkyl, partly-fluorinated alkyl, alkoxy, alkenyl, aryl, and heteroaryl, and where Z independently at each occurrence is selected from the group consisting of H, halogen, F, CF3, CN, alkyl, fluorinated alkyl, partly-fluorinated alkyl, alkenyl, alkoxy, N-alkyl, N-alkyl2, aryl, and heteroaryl.

7. The chemical compound of claim 1, wherein R3 and/or R6 are additionally fused, and/or R1 is a substituted homocyclic 6-membered ring.

8. The chemical compound of claim 1, wherein R2 and R7 independently of one another are selected from the group consisting of H, halogen, CN, and C1-C4 alkyl, and/or R4 and R5 independently of one another are selected from the group consisting of H, halogen, CN, and C1-C4 alkyl.

9. The chemical compound of claim 1, wherein R1 is a heterocyclic 5-membered ring or 6-membered ring having at least one sp2-hybridized N atom with a free electron pair in the ring system.

10. The chemical compound of claim 1, wherein the compound is selected from the group consisting of:

(1)

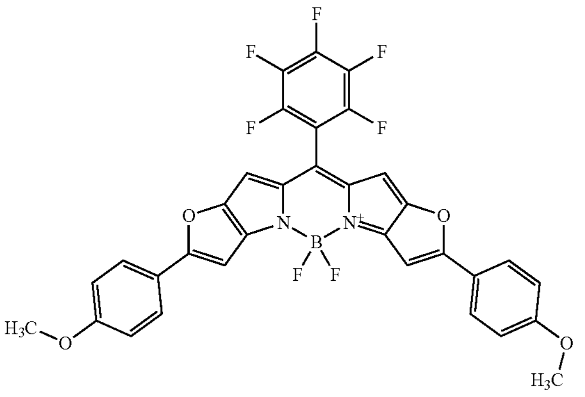

(2)

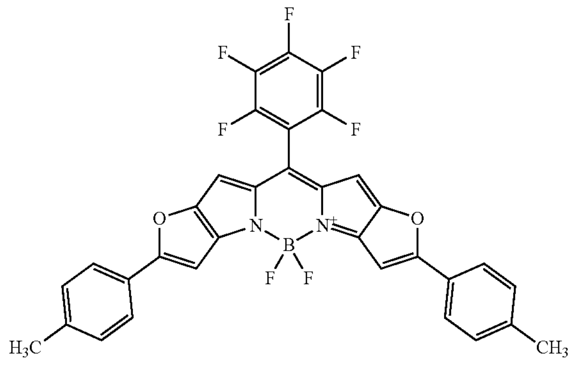

-continued
(3)
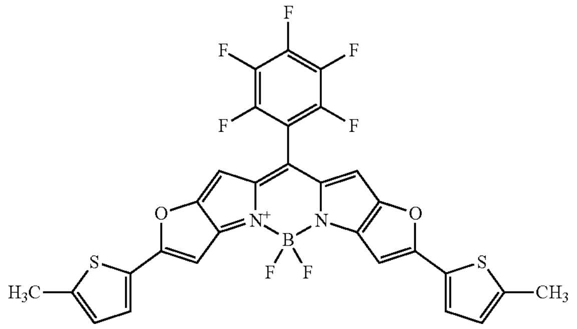
(4)
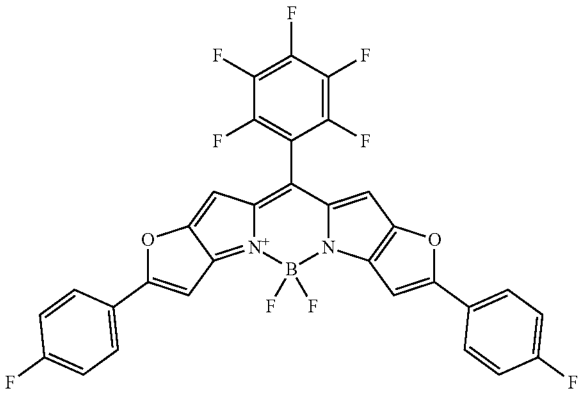
(5)
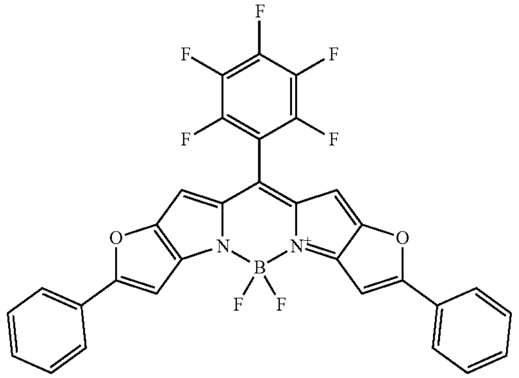
(6)
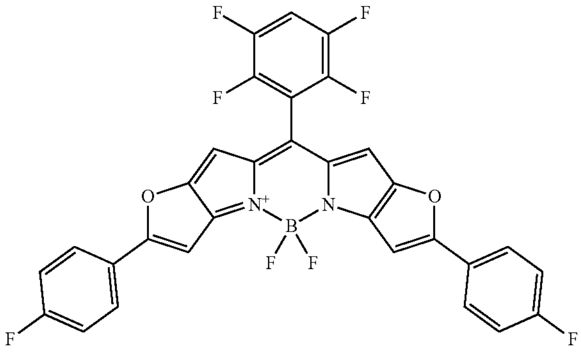
-continued
(7)
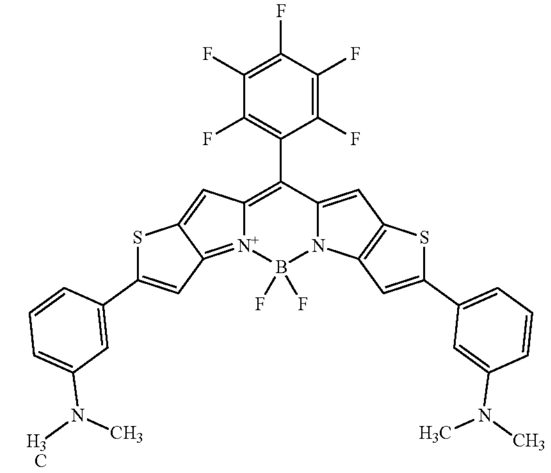
(8)
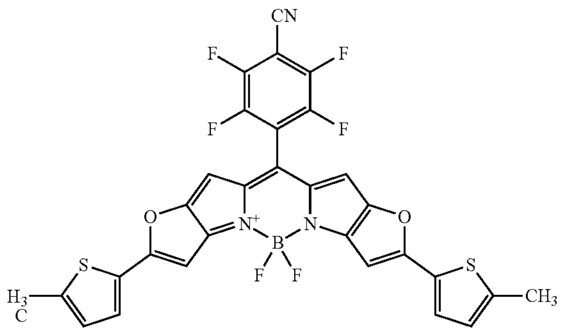
(9)
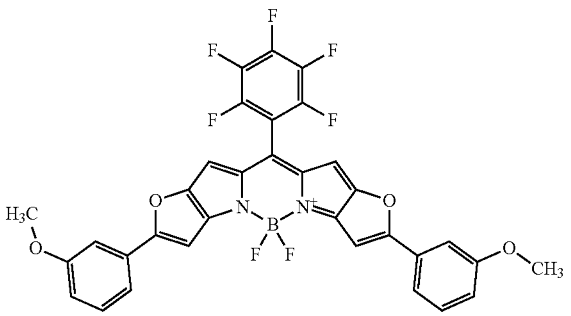
(10)
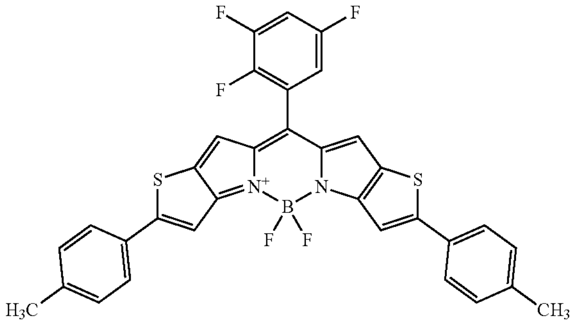

(11)
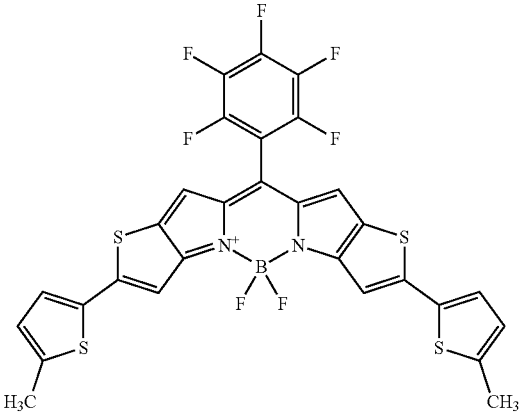
(12)
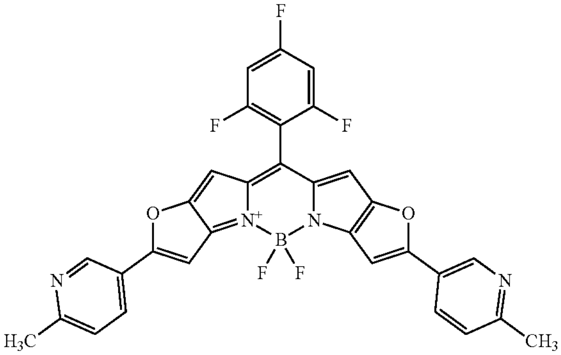
(13)
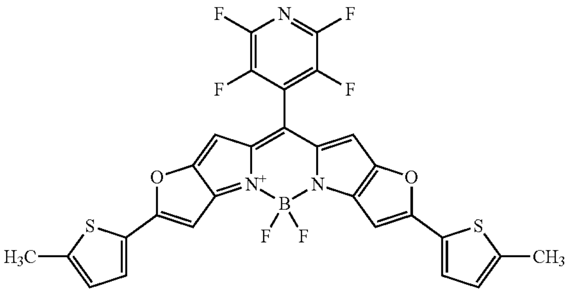
(14)
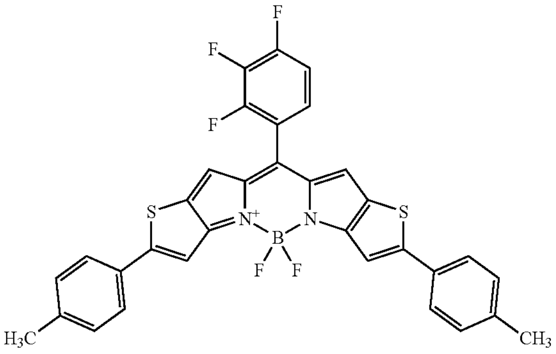
(15)
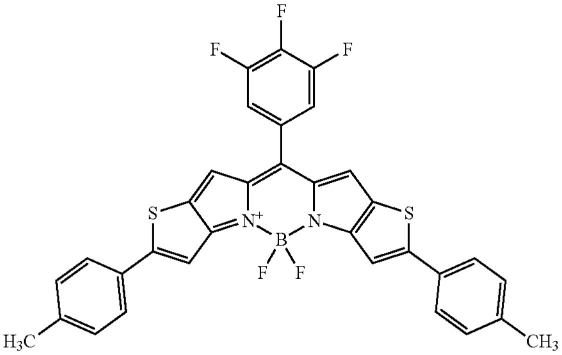
(16)
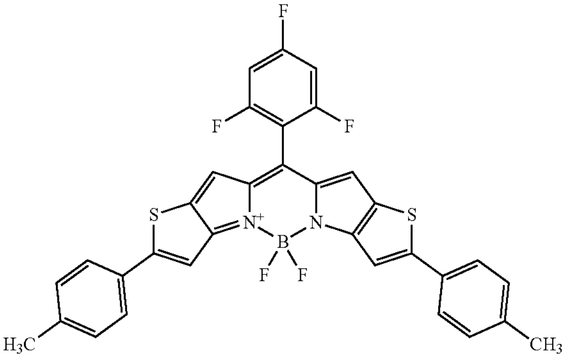
(17)
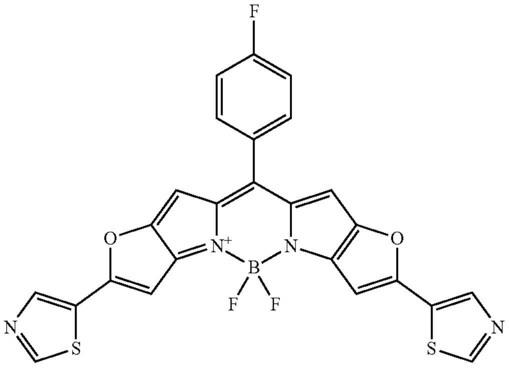
(18)
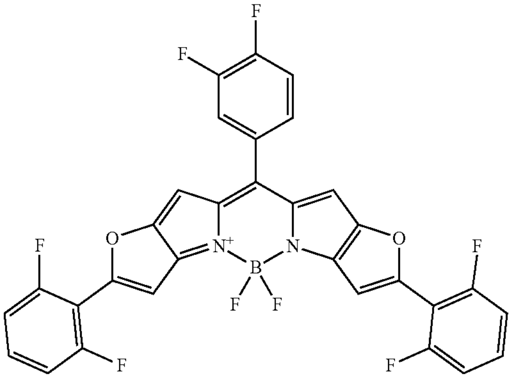

-continued
(19)
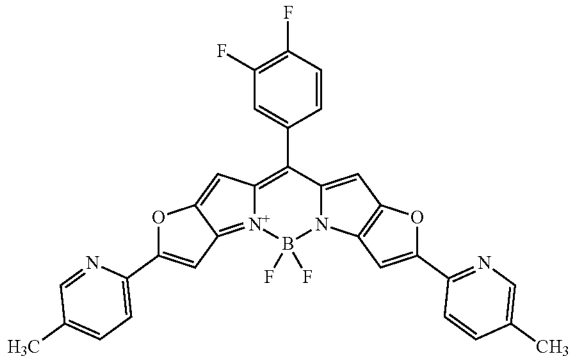
(20)
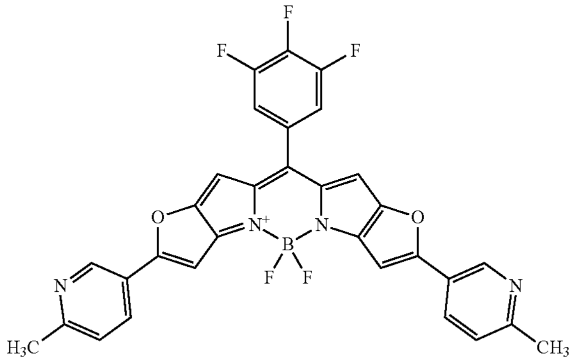
(21)
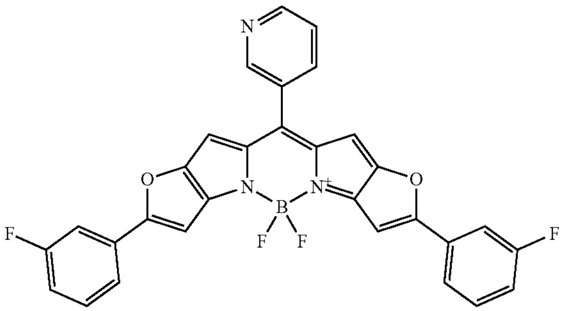
(22)
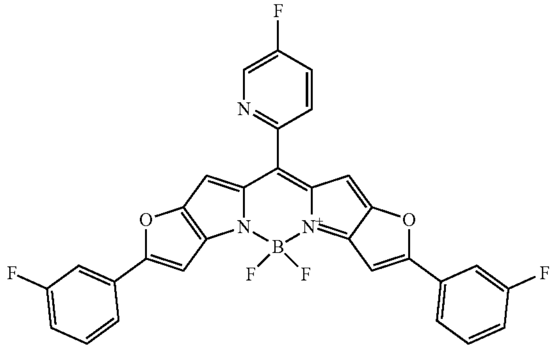
-continued
(23)
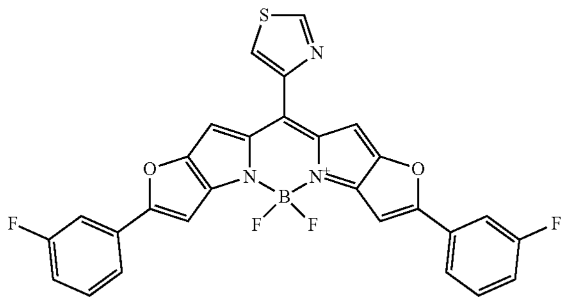
(24)
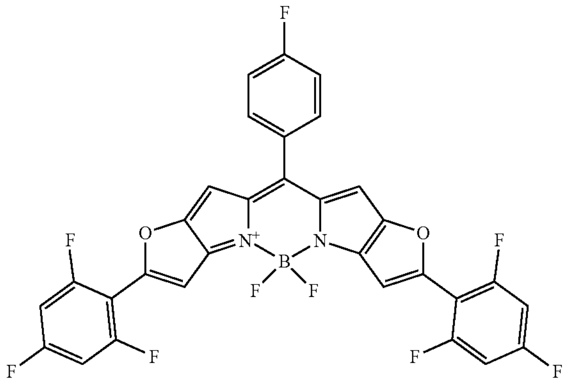
(25)
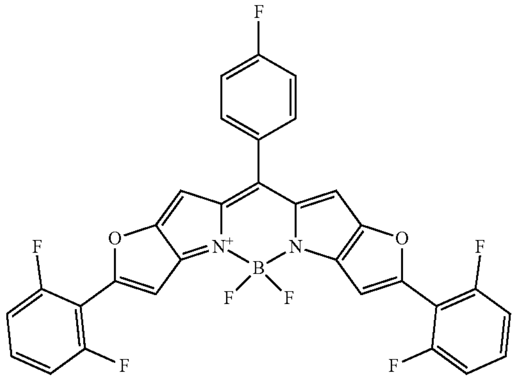
(26)
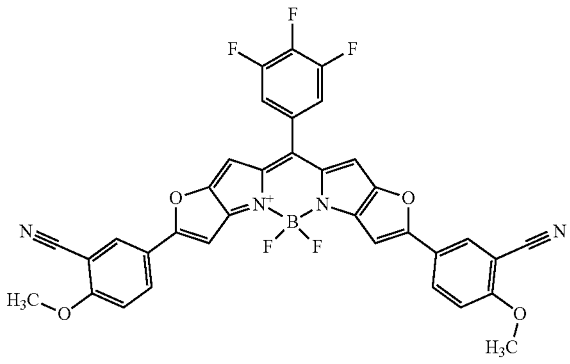

-continued (27)

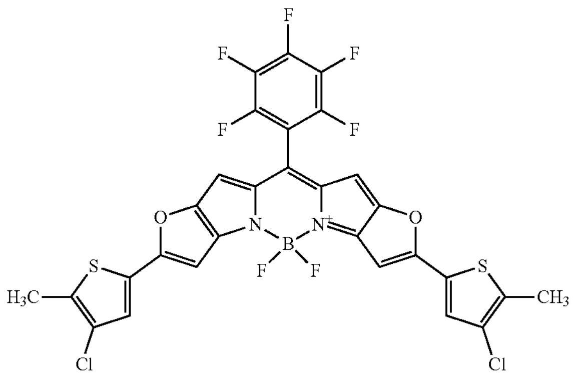

(28)

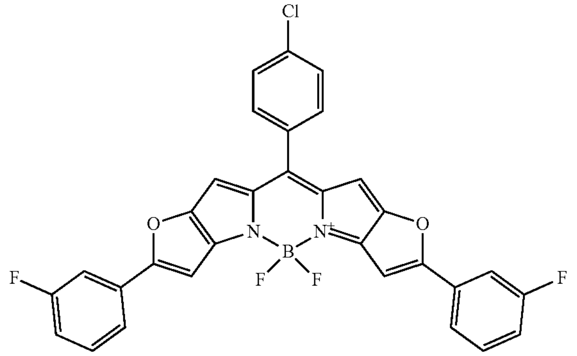

(29)

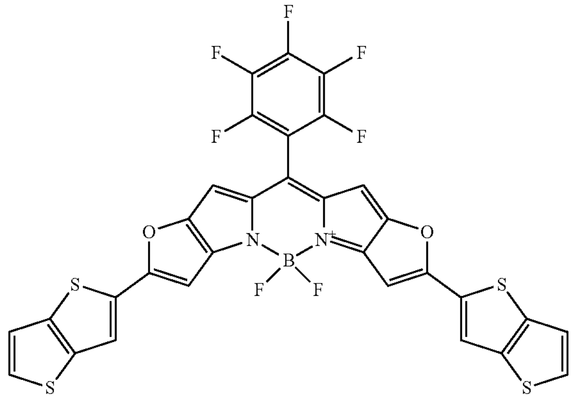

(30)

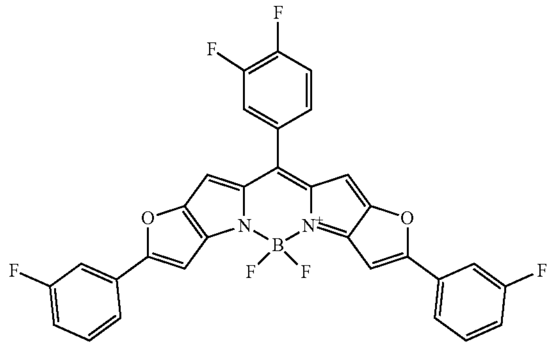

-continued (31)

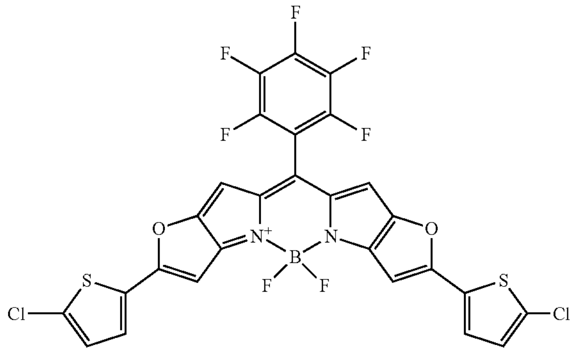

(32)

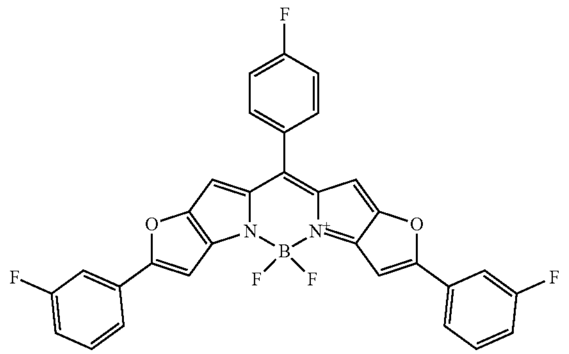

11. The chemical compound of claim 1, wherein all the H atoms in R1 are substituted by a halogen or CN.

12. The chemical compound of claim 1, wherein the compound has a molar weight of 300-1500 g/mol.

13. A method of using a chemical compound, the method comprising manufacturing an optoelectronic component comprising the compound of claim 1.

14. An optoelectronic component having a layer system, wherein at least one layer of the layer system comprises the compound of claim 1.

15. The optoelectronic component of claim 14, wherein the optoelectronic component has a layer system with at least one photoactive layer.

16. The chemical compound of claim 15, wherein the at least one photoactive layer is a light-absorbing photoactive layer.

17. The chemical compound of claim 1, wherein R3 and R6 are identical.

18. The chemical compound of claim 1, wherein R2, R4, R5, and R7 are H.

19. The chemical compound of claim 1, wherein R1 is selected from the group consisting of: imidazole, pyrazole, triazole, tetrazole, pyridine, pyrimidine, pyrazine, pyridazine, triazine, oxazole, isoxazole, thiazole, and isothiazole, wherein the imidazole, pyrazole, triazole, tetrazole, pyridine, pyrimidine, pyrazine, pyridazine, triazine, oxazole, isoxazole, thiazole, or isothiazole is unsubstituted, or is substituted such that at least one H atom is substituted by an electron-withdrawing substituent selected from the group consisting of a halogen, CN, CF3, and COR9, with R9 being C1-C4 alkyl.

20. The chemical compound of claim 1, wherein all the H atoms in R1 are substituted by F.

* * * * *